(12) United States Patent
Hayoz et al.

(10) Patent No.: US 9,434,812 B2
(45) Date of Patent: *Sep. 6, 2016

(54) DYKETOPYRROLOPYRROLE POLYMERS FOR USE IN ORGANIC SEMICONDUCTOR DEVICES

(71) Applicant: BASF SE, Ludwigshafen (DE)

(72) Inventors: Pascal Hayoz, Hofstetten (CH); Mathias Düggeli, Thürnen (CH); Natalia Chebotareva, Hagenthal le Bas (FR); Olivier Frédéric Aebischer, Düdingen (CH)

(73) Assignee: BASF SE, Ludwigshafen (DE)

( * ) Notice: Subject to any disclaimer, the term of this patent is extended or adjusted under 35 U.S.C. 154(b) by 25 days.

This patent is subject to a terminal disclaimer.

(21) Appl. No.: 14/555,367

(22) Filed: Nov. 26, 2014

(65) Prior Publication Data

US 2015/0087109 A1 Mar. 26, 2015

Related U.S. Application Data

(63) Continuation of application No. 13/109,327, filed on May 17, 2011.

(60) Provisional application No. 61/436,620, filed on Jan. 27, 2011, provisional application No. 61/346,041, filed on May 19, 2010.

(51) Int. Cl.
| | |
|---|---|
| *C08G 75/00* | (2006.01) |
| *C08G 61/12* | (2006.01) |
| *B82Y 10/00* | (2011.01) |
| *C08F 232/08* | (2006.01) |
| *C08F 234/04* | (2006.01) |
| *C09K 11/06* | (2006.01) |
| *H01L 51/00* | (2006.01) |

(Continued)

(52) U.S. Cl.
CPC ............. *C08G 61/125* (2013.01); *B82Y 10/00* (2013.01); *C08F 232/08* (2013.01); *C08F 234/04* (2013.01); *C08G 61/124* (2013.01); *C08G 61/126* (2013.01); *C09B 69/109* (2013.01); *C09K 11/06* (2013.01); *H01L 51/0003* (2013.01); *H01L 51/0035* (2013.01); *H01L 51/0036* (2013.01); *H01L 51/0043* (2013.01); *H05B 33/14* (2013.01); *C08G 2261/12* (2013.01); *C08G 2261/141* (2013.01); *C08G 2261/18* (2013.01); *C08G 2261/3221* (2013.01); *C08G 2261/3222* (2013.01); *C08G 2261/3223* (2013.01); *C08G 2261/3241* (2013.01); *C08G 2261/344* (2013.01); *C08G 2261/364* (2013.01); *C08G 2261/411* (2013.01); *C08G 2261/5222* (2013.01); *C08G 2261/91* (2013.01); *C08G 2261/92* (2013.01); *C09K 2211/1475* (2013.01); *C09K 2211/1483* (2013.01); *C09K 2211/1491* (2013.01); *H01L 51/0047* (2013.01); *H01L 51/0055* (2013.01); *H01L 51/0056* (2013.01); *H01L 51/0094* (2013.01); *H01L 51/0512* (2013.01); *H01L 51/0525* (2013.01); *H01L 51/0545* (2013.01); *H01L 51/424* (2013.01); *H01L 51/4253* (2013.01); *Y02E 10/549* (2013.01)

(58) Field of Classification Search
CPC .................... C08G 61/126; C08G 2261/3243; C08G 2261/414; C08G 2261/124; C08G 2261/91; H01L 51/0558; Y02E 10/549
USPC .......... 257/40, E51.012; 427/331; 528/367.8
See application file for complete search history.

(56) References Cited

U.S. PATENT DOCUMENTS

| | | | |
|---|---|---|---|
| 6,451,459 B1 | 9/2002 | Tieke et al. | |
| 2007/0228359 A1* | 10/2007 | Heim et al. | 257/40 |

(Continued)

FOREIGN PATENT DOCUMENTS

| | | |
|---|---|---|
| EP | 2075274 | 6/2010 |
| WO | 2010115767 | 10/2010 |

(Continued)

OTHER PUBLICATIONS

Hou et al., Macromolecules, vol. 42, No. 17, (2009), pp. 6564-6571.
Li et al., J. Mater. Chem. 21 (2011), p. 10829.
Janssen et al., J. Mater. Chem. 21 (2011), p. 1600.
Zou et al., Macromolecules, vol. 42, (2009), pp. 6361-6365.
Woo et al., J. Am. Chem. Soc. 132 (2010) pp. 15547-15549.

*Primary Examiner* — Shane Fang
(74) *Attorney, Agent, or Firm* — Marshall, Gerstein & Borun LLP

(57) ABSTRACT

The present invention relates to polymers comprising one or more (repeating) unit(s) of the formula *$\text{-}\!\!\text{[}\!\!\text{-A-D-}\!\!\text{]}\!\!\text{-}$* (I), or a polymer of formula *$\text{-}\!\!\text{[}\!\!\text{-A-D-}\!\!\text{]}_x\text{-}\!\!\text{[}\!\!\text{-B-D-}\!\!\text{]}_y$* (II), or *$\text{-}\!\!\text{[}\!\!\text{-A-D-}\!\!\text{]}_r\text{-}\!\!\text{[}\!\!\text{-B-D-}\!\!\text{]}_s\text{-}\!\!\text{[}\!\!\text{-A-E-}\!\!\text{]}_t\text{-}\!\!\text{[}\!\!\text{-B-E-}\!\!\text{]}_u$* (III), and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

7 Claims, No Drawings

(51) Int. Cl.
  *H05B 33/14* (2006.01)
  *C09B 69/10* (2006.01)
  *H01L 51/05* (2006.01)
  *H01L 51/42* (2006.01)

(56) References Cited

U.S. PATENT DOCUMENTS

| | | | |
|---|---|---|---|
| 2009/0065766 A1* | 3/2009 | Li | 257/40 |
| 2009/0065770 A1* | 3/2009 | Miura et al. | 257/40 |
| 2009/0065878 A1* | 3/2009 | Li | 257/411 |
| 2009/0302311 A1* | 12/2009 | Turbiez et al. | 257/40 |
| 2011/0004004 A1 | 1/2011 | Hao et al. | |
| 2011/0006287 A1 | 1/2011 | You et al. | |
| 2011/0028644 A1 | 2/2011 | Brown et al. | |
| 2011/0204351 A1* | 8/2011 | Heim et al. | 257/40 |
| 2011/0215313 A1 | 9/2011 | Dueggeli et al. | |
| 2011/0240981 A1 | 10/2011 | Dueggeli et al. | |
| 2012/0153274 A1* | 6/2012 | Sonar et al. | 257/40 |
| 2012/0161117 A1* | 6/2012 | Chen et al. | 257/40 |

FOREIGN PATENT DOCUMENTS

| | | |
|---|---|---|
| WO | 2010136352 | 12/2010 |
| WO | 2010136353 | 12/2010 |
| WO | 2011025454 | 3/2011 |
| WO | 2010108873 | 9/2011 |

\* cited by examiner

DYKETOPYRROLOPYRROLE POLYMERS FOR USE IN ORGANIC SEMICONDUCTOR DEVICES

This application claims the benefit of U.S. Provisional Application No. 61/346,041, filed May 19, 2010 and U.S. Provisional Application No. 61/436,620, filed Jan. 17, 2011, incorporated herein its entirety by reference.

DESCRIPTION

The present invention relates to polymers comprising one or more (repeating) unit(s) of the formula *─[A-D]─* (I), or a polymer of formula *─[A-D]$_x$─[B-D]$_y$* (II), or *─[A-D]$_r$─[B-D]$_s$─[A-E]$_t$─[B-E]$_n$ (III), and their use as organic semiconductor in organic devices, especially in organic photovoltaics (solar cells) and photodiodes, or in a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors, organic photovoltaics (solar cells) and photodiodes.

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose the specific DPP based polymers of formula I.

A preferred polymer comprises a repeating unit of formula

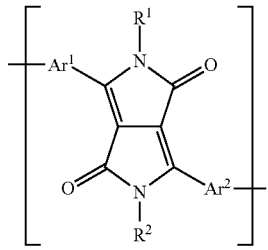

and a repeating unit, ─[Ar$^3$]─, wherein

R$^1$ and R$^2$ are independently of each other a C$_1$-C$_{25}$alkyl group, especially a C$_4$-C$_{12}$alkyl group, which can be interrupted by one or more oxygen atoms, and Ar$^1$ and Ar$^2$ are independently of each other a group of formula

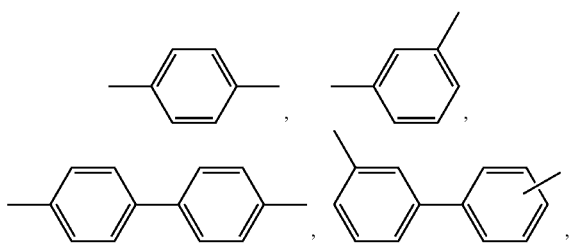

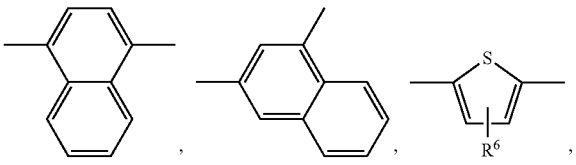

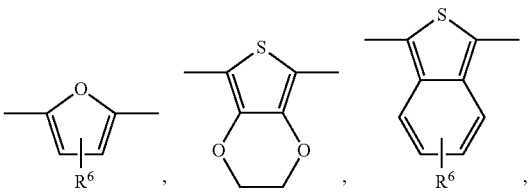

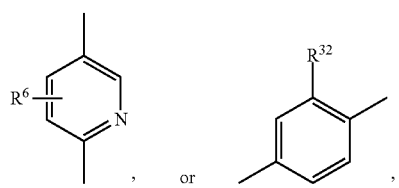

wherein ─Ar$^3$─ is a group of formula

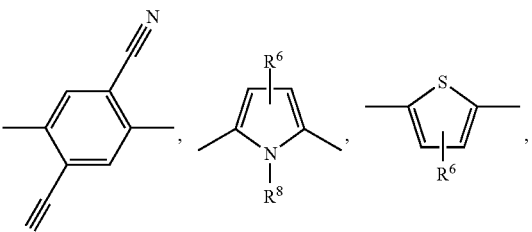

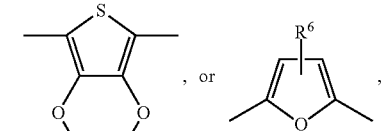

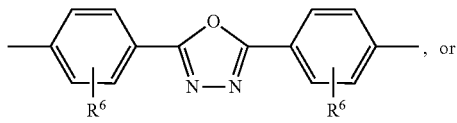

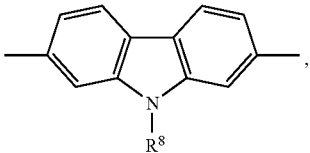

wherein

R$^6$ is hydrogen, C$_1$-C$_{18}$alkyl, or C$_1$-C$_{18}$alkoxy, and R$^{32}$ is methyl, Cl, or OMe, and R$^8$ is H, C$_1$-C$_{18}$alkyl, or C$_1$-C$_{18}$alkyl which is substituted by E and/or interrupted by D, especially C$_1$-C$_{18}$alkyl which is interrupted by ─O─.

EP2034537A2 is directed to a thin film transistor device comprising a semiconductor layer, the semiconductor layer comprising a compound comprising a chemical structure represented by:

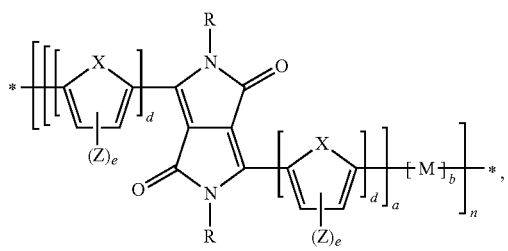

wherein each X is independently selected from S, Se, O, and NR″, each R″ is independently selected from hydrogen, an optionally substituted hydrocarbon, and a hetero-containing group, each Z is independently one of an optionally substituted hydrocarbon, a hetero-containing group, and a halogen, d is a number which is at least 1, e is a number from zero to 2; a represents a number that is at least 1; b represents a number from 0 to 20; and n represents a number that is at least 1.

Among others the following homopolymers are explicitly disclosed:

(22)

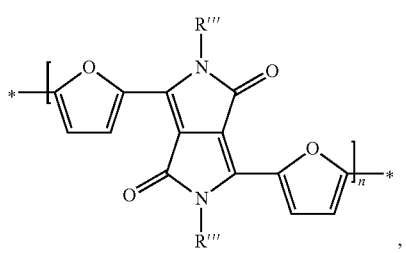

(23)

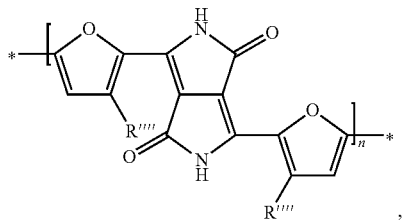

(24)

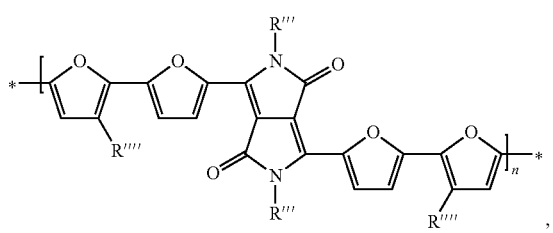

(25)

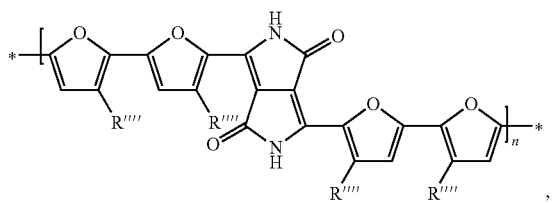

(34)

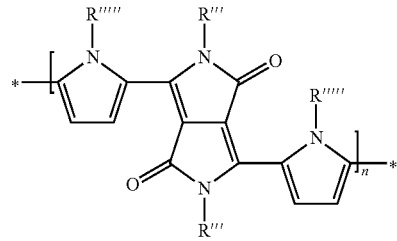

(35)

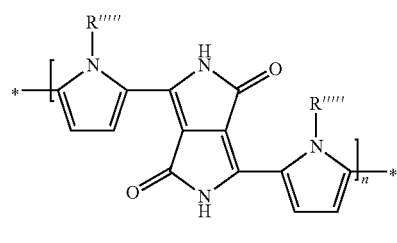

(36)

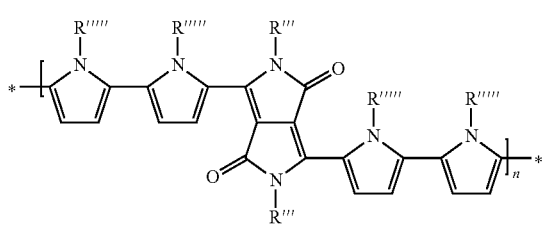

(37)

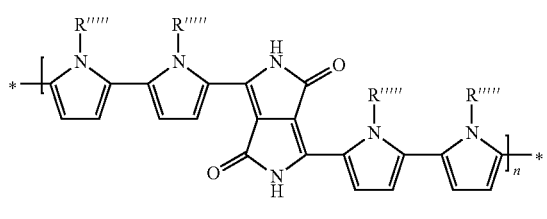

(44)

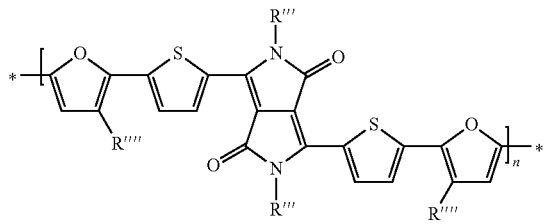

(45)

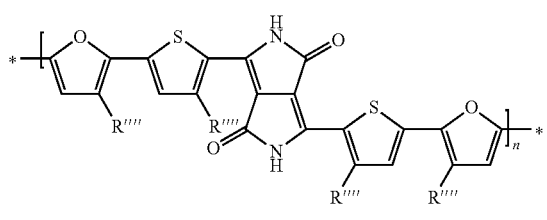

(46)

[Structure of formula (46): polymer containing thiophene-furan-diketopyrrolopyrrole-furan-thiophene repeating unit with R''', R'''' substituents]

(47)

[Structure of formula (47): polymer containing furan-thiophene-diketopyrrolopyrrole-thiophene-furan repeating unit with R''', R'''' substituents and NH groups]

wherein n is the number of repeat units and can be from about 2 to about 5000, R''', R'''' and R''''' can be the same or different substituent, and wherein the substituent is independently selected from the group consisting of an optionally substituted hydrocarbon group and a heteroatom-containing group.

The present invention is not directed to homopolymers, especially not to homopolymers of formula (22), (23), (24), (25), (34), (35), (36), (37), (44), (45), (46), and (47), which are explicitly disclosed in EP2034537A2.

EP2075274A1 discloses a soluble polythiophene derivative containing highly coplanar repeating units. The coplanar characteristic of the TPT (thiophene-phenylene-thiophene) units improves the degree of intramolecular conjugation and intermolecular π-π interaction.

It is the object of the present invention to provide polymers, which show high efficiency of energy conversion, excellent field-effect mobility, good on/off current ratios and/or excellent stability, when used in organic field effect transistors, organic photovoltaics (solar cells) and photodiodes.

Said object has been solved by polymers comprising (repeating) unit(s) of the formula $$*\!\!-\!\!\!\left[\!A\text{-}D\!\right]\!\!-\!\!* \quad (I),$$

or a polymer of formula $$*\!\!-\!\!\!\left[\!A\text{-}D\!\right]_x\!\!\left[\!B\text{-}D\!\right]_y\!\!-\!\!* \quad (II),$$

or $$*\!\!-\!\!\!\left[\!A\text{-}D\!\right]_r\!\!\left[\!B\text{-}D\!\right]_s\!\!\left[\!A\text{-}D\!\right]_t\!\!\left[\!B\text{-}E\!\right]_u \quad (III),$$

wherein x=0.995 to 0.005, y=0.005 to 0.995, especially x=0.2 to 0.8, y=0.8 to 0.2, and wherein x+y=1.

r=0.985 to 0.005, s=0.005 to 0.985, t=0.005 to 0.985, u=0.005 to 0.985, and wherein r+s+t+u=1, A is a group of formula (IV)

[Structure of formula (IV): diketopyrrolopyrrole core with N-R$^1$ and N-R$^2$ substituents, flanked by (Ar$^3$)$_e$(Ar$^2$)$_c$(Ar$^1$)$_a$ on one side and (Ar$^{1'}$)$_b$(Ar$^{2'}$)$_d$(Ar$^{3'}$)$_f$ on the other side]

wherein
a' is an integer of 1, or 2,
b is an integer of 1, or 2,
c is 0, or an integer of 1, or 2,
d is 0, or an integer of 1, or 2,
e is 0, or an integer of 1, or 2,
f is 0, or an integer of 1, or 2,
$R^1$ and $R^2$ may be the same or different and are selected from hydrogen, a $C_1$-$C_{100}$alkyl group, —COOR$^{203}$, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, a $C_5$-$C_{12}$cycloalkyl group, which can be substituted one to three times with $C_1$-$C_8$alkyl and/or $C_1$-$C_8$alkoxy, a $C_6$-$C_{24}$aryl group, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl, $R^{203}$ is $C_1$-$C_{50}$alkyl, especially $C_4$-$C_{25}$alkyl;

Ar$^1$ and Ar$^{1'}$ are independently of each other

[Structures: thiophene with R$^{104}$, R$^{104'}$ substituents; furan with R$^{104}$, R$^{104'}$ substituents; pyrrole with R$^{104}$, R$^{104'}$ and N-R$^{116}$ substituents; or a thiazole-like ring with X$^3$—X$^4$]

Ar$^2$, Ar$^{2'}$, Ar$^3$ and Ar$^{3'}$ are independently of each other

[Structures: phenylene with R$^{105}$, R$^{105'}$ substituents; naphthylene with R$^{105}$, R$^{105'}$ substituents; another arylene with R$^{105}$, R$^{105'}$; carbazole with R$^{106}$, R$^{106'}$ and N-R$^{107}$ substituents]

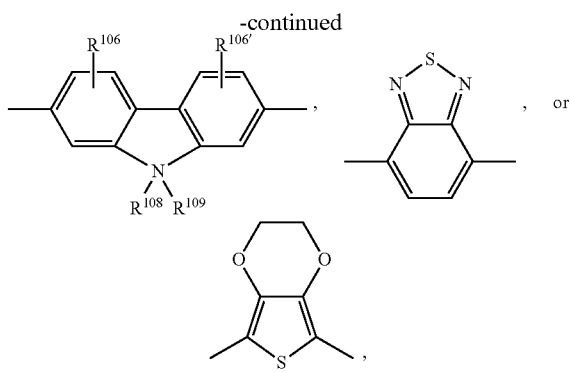

or have the meaning of $Ar^1$, wherein one of $X^3$ and $X^4$ is N and the other is $CR^{99}$, $R^{99}$, $R^{104}$ and $R^{104'}$ are independently of each other hydrogen, halogen, especially F, or a $C_1$-$C_{25}$alkyl group, especially a $C_4$-$C_{25}$alkyl, which may optionally be interrupted by one or more oxygen or sulphur atoms, $C_7$-$C_{25}$arylalkyl, or a $C_1$-$C_{25}$alkoxy group, $R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl which is interrupted by —O—, or —S—; or —COOR$^{119}$;

$R^{116}$ is hydrogen, $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl which is interrupted by —O—, or —S—; or —COOR$^{119}$;

$R^{119}$ is $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, or $C_7$-$C_{25}$aralkyl, $R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, or $R^{108}$ and $R^{109}$ together form a group of formula =$CR^{110}R^{111}$, wherein $R^{110}$ and $R^{111}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally can be substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, D' is —CO—, —COO—, —S—, —O—, or —NR$^{112}$—, E' is $C_1$-$C_8$thioalkoxy, $C_1$-$C_8$alkoxy, CN, —NR$^{112}$R$^{113}$, —CONR$^{112}$R$^{113}$, or halogen, G is E', or $C_1$-$C_{18}$alkyl, and $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, B, D and E are independently of each other a group of formula

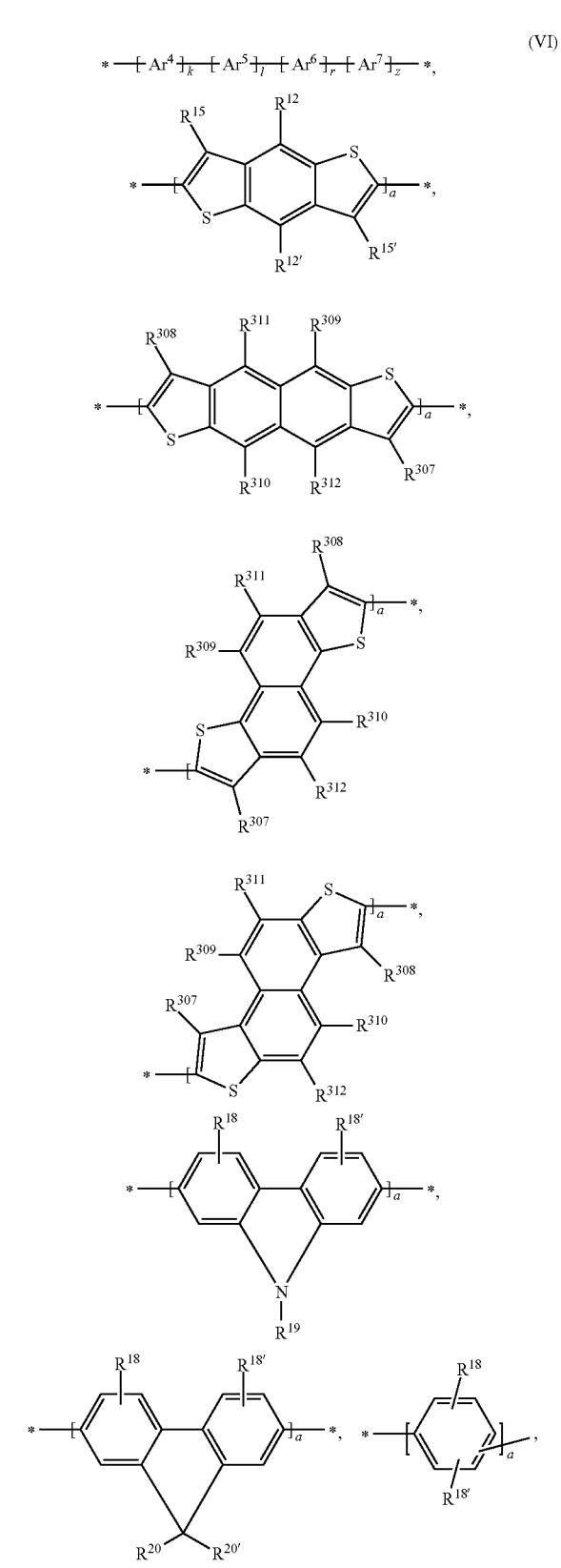

-continued

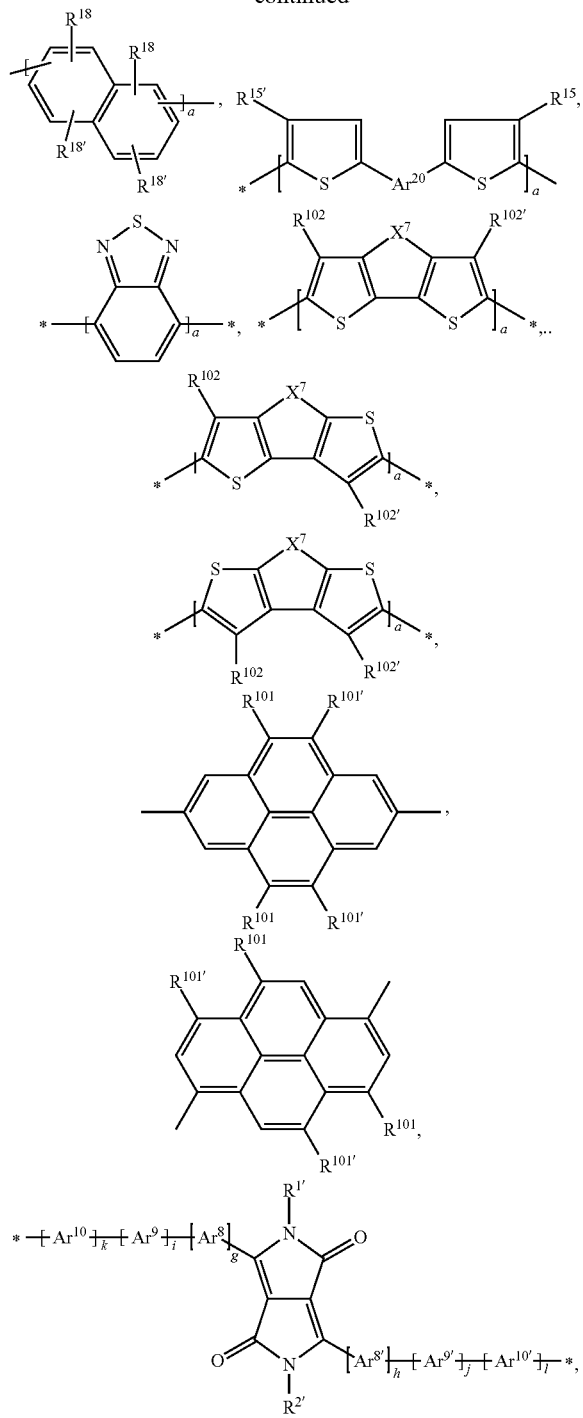

or formula IV, with the proviso that in case B, D and E are a group of formula IV, they are different from A, wherein
k is 1,
l is 0, or 1,
r is 0, or 1,
z is 0, or 1,
a is an integer of 1 to 5, especially 1 to 3,
g is an integer of 1, or 2,
h is an integer of 1, or 2,
i is 0, or an integer of 1, or 2,
j is 0, or an integer of 1, or 2, k is 0, or an integer of 1, or 2,
l is 0, or an integer of 1, or 2,
$R^{1'}$ and $R^{2'}$ have independently of each other the meaning of $R^1$,
$Ar^8$, $Ar^{8'}$, $A^9$, $Ar^{9'}$, $Ar^{10}$ and $Ar^{10'}$ have independently of each other the meaning of $Ar^2$, $Ar^4$, $Ar^5$, $Ar^6$ and $Ar^7$ are independently of each other a group of formula

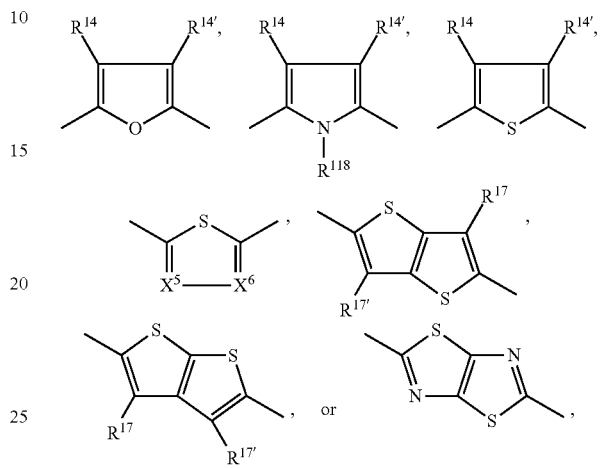

wherein one of $X^5$ and $X^6$ is N and the other is $CR^{14}$,
$Ar^{20}$ is an arylene group, or a heteroarylene group, each of which may optionally be substituted,
$R^{118}$ has the meaning of $R^{116}$,
$R^{12}$ and $R^{12'}$ are independently of each other hydrogen, halogen, $C_1$-$C_{25}$alkyl, especially $C_4$-$C_{25}$alkyl, which may optionally be interrupted by one, or more oxygen, or sulphur atoms, $C_1$-$C_{25}$alkoxy, $C_7$-$C_{25}$arylalkyl, or —=—$R^{13}$
$R^{13}$ is a $C_1$-$C_{10}$alkyl group, or a tri($C_1$-$C_6$alkyl)silyl group,
$R^{14}$, $R^{14'}$, $R^{15}$, $R^{15'}$, $R^{17}$ and $R^{17'}$ are independently of each other H, or a $C_1$-$C_{25}$alkyl group, especially a $C_6$-$C_{25}$alkyl, which may optionally be interrupted by one or more oxygen atoms;
$R^{18}$ and $R^{18'}$ independently of each other hydrogen, halogen, $C_1$-$C_{25}$alkyl, especially $C_4$-$C_{25}$alkyl, which may optionally be interrupted by one or more oxygen or sulphur atoms, $C_7$-$C_{25}$aralkyl, or $C_1$-$C_{25}$alkoxy;
$R^{19}$ is hydrogen, $C_7$-$C_{25}$aralkyl, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, especially $C_4$-$C_{25}$alkyl, which may optionally be interrupted by one or more oxygen or sulphur atoms;
$R^{20}$ and $R^{20'}$ are independently of each other hydrogen, $C_7$-$C_{25}$aralkyl, $C_1$-$C_{25}$alkyl, especially $C_4$-$C_{25}$alkyl, which may optionally be interrupted by one, or more oxygen, or sulphur atoms,
$X^7$ is —O—, —S—, —$NR^{115}$—, —Si($R^{117}$)($R^{117'}$)—, —C($R^{120}$)($R^{120'}$)—, —C(=O)—,

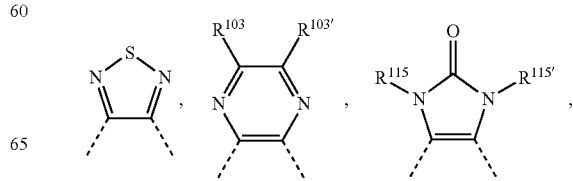

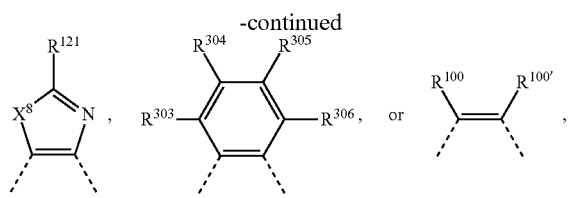

X$^8$ is —O—, or —NR$^{115}$—;

R$^{100}$ and R$^{100'}$ are independently of each other H, F, C$_1$-C$_{18}$alkyl, C$_1$-C$_{18}$alkyl which is interrupted by O, C$_1$-C$_{18}$alkoxy, C$_1$-C$_{18}$alkoxy which is interrupted by O, C$_1$-C$_{18}$perfluoroalkyl, C$_6$-C$_{24}$aryl, which may optionally be substituted one to three times with C$_1$-C$_8$alkyl and/or C$_1$-C$_8$alkoxy, C$_2$-C$_{20}$heteroaryl, which may optionally be substituted one to three times with C$_1$-C$_8$alkyl and/or C$_1$-C$_8$alkoxy;

R$^{303}$, R$^{304}$, R$^{305}$ and R$^{306}$ are independently of each other H, F, C$_1$-C$_{18}$alkyl, C$_1$-C$_{18}$alkyl which is interrupted by O, C$_1$-C$_{18}$alkoxy, C$_1$-C$_{18}$alkoxy which is interrupted by O, C$_1$-C$_{18}$perfluoroalkyl, C$_6$-C$_{24}$aryl, which may optionally be substituted one to three times with C$_1$-C$_8$alkyl and/or C$_1$-C$_8$alkoxy, C$_2$-C$_{20}$heteroaryl, which may optionally be substituted one to three times with C$_1$-C$_8$alkyl and/or C$_1$-C$_8$alkoxy;

R$^{307}$ and R$^{308}$ are independently of each other H, or C$_1$-C$_{25}$alkyl, which may optionally be interrupted by one or more oxygen or sulphur atoms;

R$^{309}$, R$^{310}$, R$^{311}$ and R$^{312}$ are independently of each other H, C$_1$-C$_{25}$alkoxy, or C$_1$-C$_{25}$alkyl, which may optionally be interrupted by one or more oxygen or sulphur atoms;

R$^{101}$ and R$^{101'}$ are independently of each other H, F, C$_1$-C$_{18}$alkyl, C$_1$-C$_{18}$alkyl which is interrupted by O, C$_1$-C$_{18}$alkoxy, C$_1$-C$_{18}$alkoxy which is interrupted by O, C$_1$-C$_{18}$perfluoroalkyl, C$_6$-C$_{24}$aryl, which may optionally be substituted one to three times with C$_1$-C$_8$alkyl and/or C$_1$-C$_8$alkoxy, C$_2$-C$_{20}$heteroaryl, which may optionally be substituted one to three times with C$_1$-C$_8$alkyl and/or C$_1$-C$_8$alkoxy;

R$^{102}$ and R$^{102'}$ are independently of each other H, halogen, C$_1$-C$_{25}$alkyl, which may optionally be interrupted by one or more oxygen or sulphur atoms; C$_7$-C$_{25}$arylalkyl, or C$_1$-C$_{25}$alkoxy;

R$^{103}$ and R$^{103'}$ are independently of each other hydrogen, halogen, C$_1$-C$_{25}$alkyl, which may optionally be interrupted by one or more oxygen or sulphur atoms; C$_6$-C$_{24}$aryl, which may optionally be substituted one to three times with C$_1$-C$_8$alkyl and/or C$_1$-C$_8$alkoxy; C$_7$-C$_{25}$arylalkyl, CN, or C$_1$-C$_{25}$alkoxy; or R$^{103}$ and R$^{103'}$ together form a ring, R$^{115}$ and R$^{115'}$ are independently of each other hydrogen, C$_6$-C$_{18}$aryl; C$_6$-C$_{18}$aryl which is substituted by C$_1$-C$_{18}$alkyl, or C$_1$-C$_{18}$alkoxy; C$_1$-C$_{25}$alkyl, especially C$_4$-C$_{25}$alkyl, which may optionally be interrupted by one or more oxygen or sulphur atoms; or C$_7$-C$_{25}$arylalkyl, R$^{117}$ and R$^{117'}$ are independently of each other C$_1$-C$_{35}$alkyl group, C$_7$-C$_{25}$arylalkyl, or a phenyl group, which optionally can be substituted one to three times with C$_1$-C$_8$alkyl and/or C$_1$-C$_8$alkoxy, R$^{120}$ and R$^{120'}$ are independently of each other hydrogen, C$_1$-C$_{35}$alkyl, which may optionally be interrupted by one, or more oxygen, or sulphur atoms; or C$_7$-C$_{25}$arylalkyl, R$^{121}$ is H, C$_1$-C$_{18}$alkyl, which may optionally be interrupted by one or more oxygen or sulphur atoms, C$_1$-C$_{18}$perfluoroalkyl, C$_6$-C$_{24}$aryl, which may optionally be substituted one to three times with C$_1$-C$_8$alkyl and/or C$_1$-C$_8$alkoxy; C$_2$-C$_{20}$heteroaryl, which may optionally be substituted one to three times with C$_1$-C$_8$alkyl and/or C$_1$-C$_8$alkoxy; or CN, with the proviso that at least one of the groups Ar$^1$, Ar$^{1'}$, Ar$^2$, Ar$^{2'}$, Ar$^3$ and Ar$^{3'}$ is a group

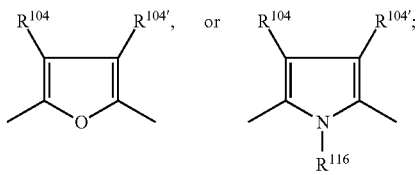

and/or at least one of the groups B, D and E contain a group

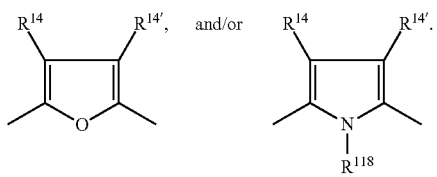

Polymers containing groups

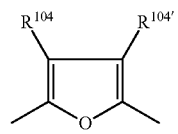

are preferred against polymers containing groups

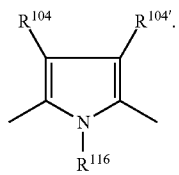

If groups

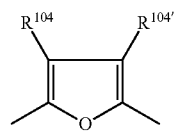

are directly bonded to the DPP skeleton the following preferences apply:

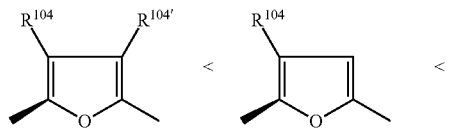

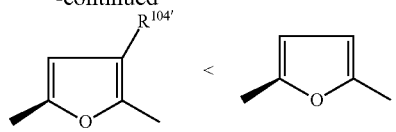

(⟋ represents the bond to the DPP skeleton). That is, the group

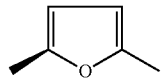

is most preferred.

If the polymer comprises (repeating) unit(s) of the formula *─[A-D]─* (I), wherein A is a group of formula (IVa)

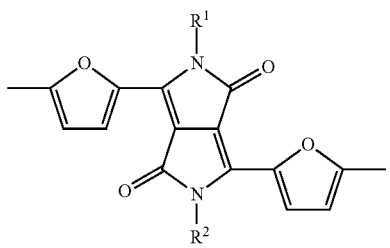

and D is a group of formula (Vx)

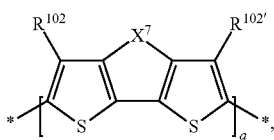

$X^7$ is preferably different from —S—, and —C($R^{120}$)($R^{120'}$)—.

In case of a group of formula (Vx)

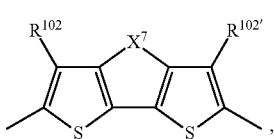

$X^7$ is preferably —O—, —$NR^{115}$—, —Si($R^{117}$)($R^{117'}$)—, —C(=O)—,

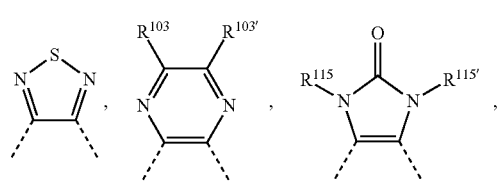

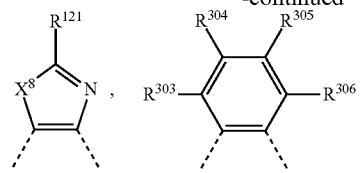

more preferably —C($R^{120}$)($R^{120'}$)—,

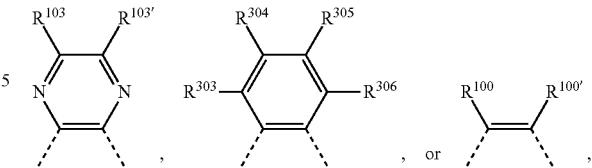

and most preferably a group of formula

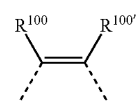

In case of groups of formula (Vy) and (Vz), $X^7$ is preferably —O—, —S—, —$NR^{115}$—, —C($R^{120}$)($R^{120'}$)—, —Si($R^{117}$)($R^{117'}$)—, —C(=O)—,

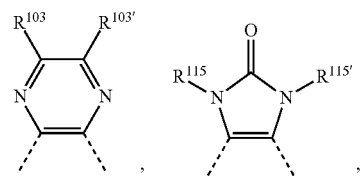

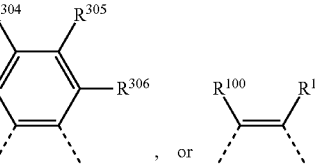

more preferably —C($R^{120}$)($R^{120'}$)—,

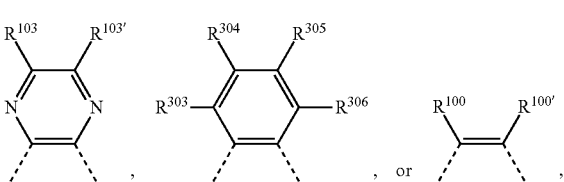

and most preferably a group of formula

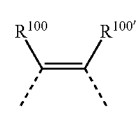

The polymers of the present invention can advantageously be used in organic photovoltaic (PV) devices (solar cells).

Advantageously, the polymer of the present invention, or an organic semiconductor material, layer or component, comprising the polymer of the present invention can be used in organic photovoltaics (solar cells) and photodiodes, or in an organic field effect transistor (OFET).

The polymers of the present invention are copolymers. A copolymer is a polymer derived from more than one species of monomer, e.g. bipolymer, terpolymer, quaterpolymer, etc.

The term polymer comprises oligomers as well as polymers. The oligomers of this invention have a weight average molecular weight of <4,000 Daltons. The polymers of this invention preferably have a weight average molecular weight of 4,000 Daltons or greater, especially 4,000 to 2,000,000 Daltons, more preferably 10,000 to 1,000,000 and most preferably 10,000 to 100,000 Daltons. Molecular weights are determined according to high-temperature gel permeation chromatography (HT-GPC) using polystyrene standards. The polymers of this invention preferably have a polydispersibility of 1.01 to 10, more preferably 1.1 to 3.0, most preferred 1.5 to 2.5. Polymers are more preferred than oligomers.

$R^1$ and $R^2$ can be hydrogen, but are preferably different from hydrogen.

$R^1$ and $R^2$ can be different, but are preferably the same. Preferably, $R^1$ and $R^2$ independently from each other stand for $C_1$-$C_{100}$alkyl, $C_5$-$C_{12}$cycloalkyl, which can be substituted one to three times with $C_1$-$C_8$alkyl and/or $C_1$-$C_8$alkoxy, phenyl or 1- or 2-naphthyl which can be substituted one to three times with $C_1$-$C_8$alkyl and/or $C_1$-$C_8$alkoxy, or —$CR^{301}R^{302}$—$(CH_2)_u$-$A^3$, wherein $R^{301}$ and $R^{302}$ stand for hydrogen, or $C_1$-$C_4$alkyl, $A^3$ stands for phenyl or 1- or 2-naphthyl, which can be substituted one to three times with $C_1$-$C_8$alkyl and/or $C_1$-$C_8$alkoxy, and u stands for 0, 1, 2 or 3. $R^1$ and $R^2$ are more preferably a $C_1$-$C_{36}$alkyl group, such as methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, especially n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. In a particularly preferred embodiment of the present invention $R^1$ and $R^2$ are a 2-hexyldecyl, or 2-decyltetradecyl group.

Advantageously, the groups $R^1$ and $R^2$ can be represented by formula

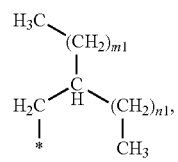

wherein m1=n1+2 and m1+n1≤24. Chiral side chains, such as $R^1$ and $R^2$, can either be homochiral, or racemic, which can influence the morphology of the polymers.

$R^{1'}$ and $R^{2'}$ have the same preferences as $R^1$ and $R^2$, respectively.

As indicated by the formula

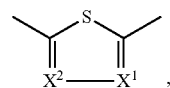

the group

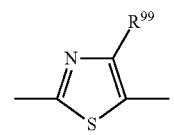

can be arranged in the polymer chain in two ways

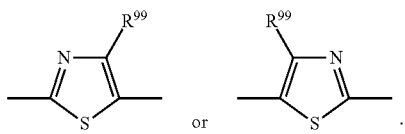

The notation

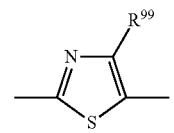

should comprise both possibilities.
The repeating unit

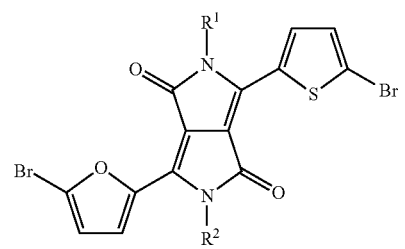

can be arranged in two ways in a copolymer, i.e.

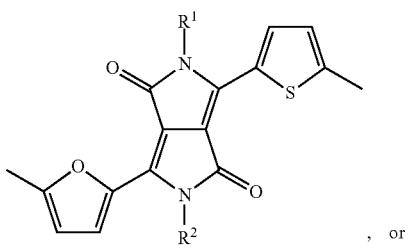

, or

-continued

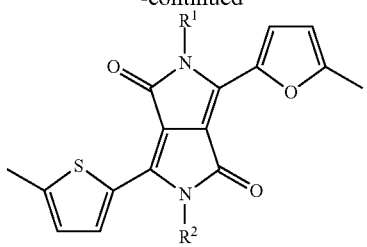

The notation

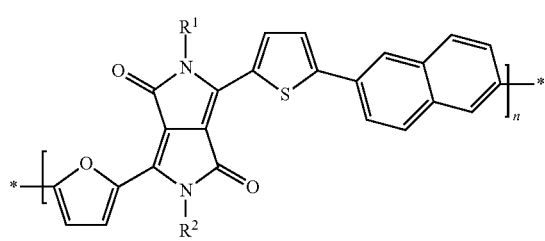

shall comprise both possibilities (regioisomers).

The same applies for other groups, which can be arranged in different ways in the monomer and/or polymers.

Preferably, $Ar^1$ and $Ar^{1'}$ are independently of each other

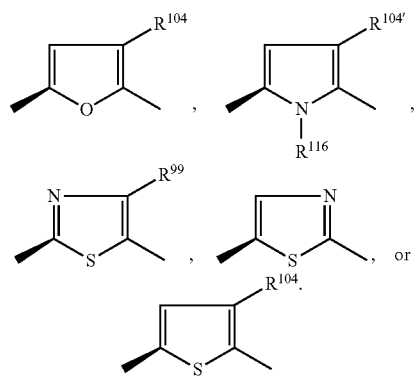

More preferably, $Ar^1$ and $Ar^{1'}$ are independently of each other

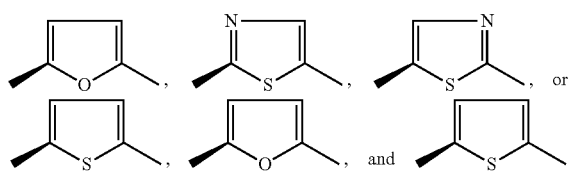

wherein

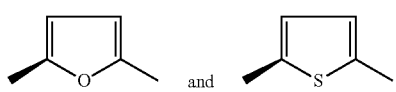

and are most preferred ( ⁄ represents the bond to the DPP skeleton). $Ar^1$ and $Ar^{1'}$ can be different, but are preferably the same.

In a preferred embodiment the present invention is directed to polymers, wherein $Ar^1$ and $Ar^{1'}$ are independently of each other

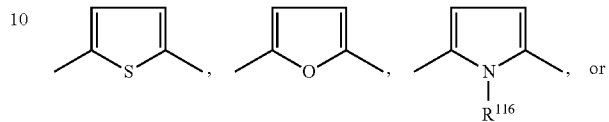

wherein $X^3$ is CH and $X^4$ is N, or $X^3$ is N and $X^4$ is CH, and $R^{116}$ is as defined above. $R^{116}$ is preferably different from H.

Preferably, $Ar^8$ and $Ar^{8'}$ are independently of each other

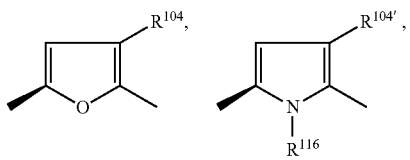

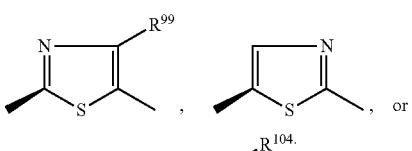

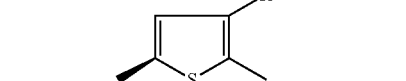

More preferably, $Ar^8$ and $Ar^{8'}$ are independently of each other

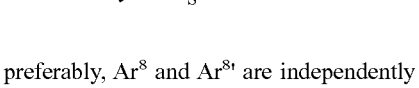

wherein

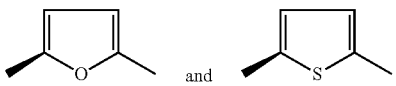

are most preferred ( ⁄ represents the bond to the DPP skeleton). $Ar^8$ and $Ar^{8'}$ can be different, but are preferably the same.

If $Ar^1$ and $Ar^{1'}$ are independently of each other

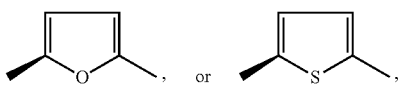

$Ar^2$ and $Ar^{2'}$ are independently of each other

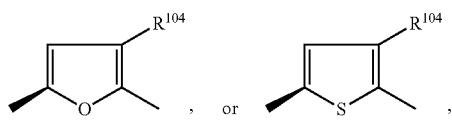

wherein $R^{104}$ is different from hydrogen and is preferably $C_1$-$C_{25}$alkyl (⁀ represents the bond to the DPP skeleton, or the group next to the DPP skeleton).

If a' and c are 1, and e is 0 and Ar¹ and Ar² have the same meaning; or if a', c and e are 1 and $Ar^1$ and $Ar^2$ and $Ar^3$ have the same meaning; D is preferably different from $Ar^1$.

If a' and c are 1, and e is 0 and $Ar^1$ and $Ar^2$ are

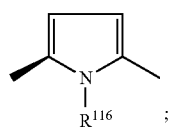

or if a', c and e are 1 and $Ar^1$ and $Ar^2$ and $Ar^3$ are

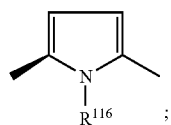

D is preferably different from a group

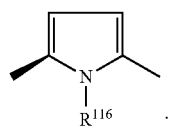

A is preferably a group of formula (IVa), (IVb), (IVc), (IVd), (IVe), (IVf), (IVg), (IVh), (IVi), (IVj), or (IVk) as defined in claim 3 of the present application. Groups of formula IVa, IVc, IVe, IVg, IVh, IVi and IVk are more preferred. Groups of formula IVa, IVc, IVe, IVg, IVh and IVi are most preferred.

Preferably, B, D and E are independently of each other a group of formula (Va), (Vb), (Vc), (Vd), (Ve), (Vf), (Vg), (Vh), (Vi), (Vj), (Vk), (Vl), (Vm), (Vn), (Vo), (Vp), (Vq), (Vr), (Vs), (Vt), (Vu), (Vv), (Vw), (Vx), (Vy), (Vz), or (Va') as defined in claim 4. Groups of formula Va, Vb, Vc, Ve, Vf, Vh, Vi, Vj, Vk, Vl, Vm, Vn, Vo, Vp, Vq, Vr, Vs, Vu, Vv, Vw, Vx, Vy, Vz, and Va' are more preferred. Groups of formula Va, Vc, Vf, Vh, Vi, Vk, Vo, Vp, Vq, Vr, Vs, Vu, Vw, Vx and Va' are most preferred. Among groups of formula Vx a group of formula Vx" is most preferred.

The group of formula (Vb') is preferably a group of formula

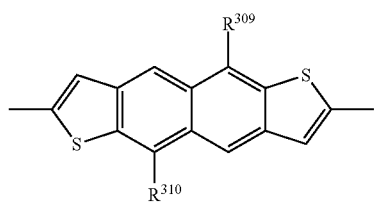

wherein $R^{309}$ and $R^{310}$ are independently of each other $C_1$-$C_{25}$alkoxy.

In a preferred embodiment the present invention is directed to polymers comprising (repeating) unit(s) of the formula I, especially Ia, or polymers of formula II, or III, wherein A is a group of formula IVa, and D is a group of formula

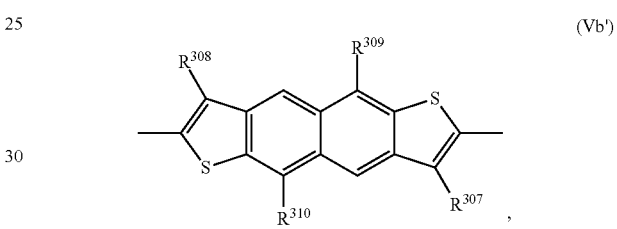

especially

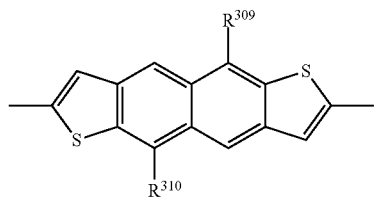

wherein $R^{309}$ and $R^{310}$ are independently of each other $C_1$-$C_{25}$alkoxy.

The group of formula (Vc') is preferably a group of formula

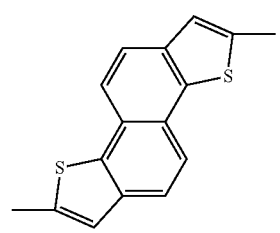

The group of formula (Vd') is preferably a group of formula

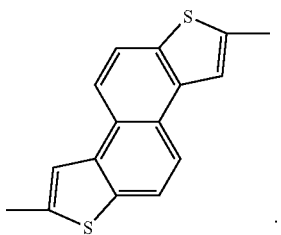

In a preferred embodiment the present invention is directed to polymers, comprising repeating units of the formula *─┤─A-D─├─* (I), wherein A is a group of formula IVa, IVc, IVe, IVg, IVh, IVi, IVj, or IVk, $R^1$ and $R^2$ are a $C_1$-$C_{35}$alkyl group, especially a $C_8$-$C_{35}$alkyl group, $R^{104}$ is a $C_1$-$C_{25}$alkyl group, especially a $C_4$-$C_{25}$alkyl, which may optionally be interrupted by one or more oxygen or sulphur atoms, D is a group of formula Va, Vb, Vc, especially

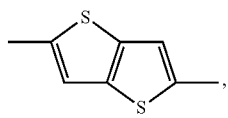

Ve, Vf, Vh, Vi, Vj, Vk, Vl, Vm, Vn, Vo, Vp, Vq, Vr, Vs, Vu, Vv, Vw, Vx, especially

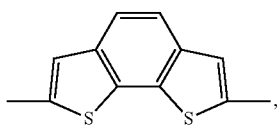

Vy, Vz, or Va'. In said embodiment polymers of the formula *─┤─A-D─├─$_n$* (Ia) are more preferred, wherein n is 4 (especially 10) to 1000, especially 4 to 200, very especially 5 (especially 20) to 100. At present most preferred are polymers, where A is a group of formula IVa and D is a group of formula Vx, especially Vx'', such as, for example,

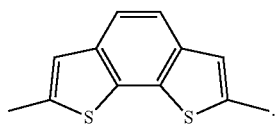

An example of such a polymer is a polymer of formula

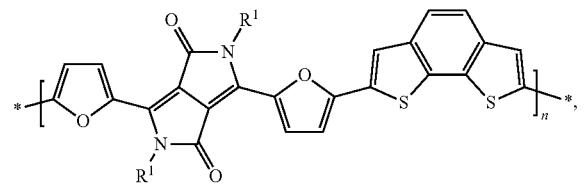

wherein n is 4 (especially 10) to 1000, especially 4 to 200, very especially 5 (especially 20) to 100 and $R^1$ is a $C_1$-$C_{35}$alkyl group, especially a $C_8$-$C_{35}$alkyl group. Said polymers show high efficiency of energy conversion, when used in solar cells.

In another embodiment the present invention is directed to polymers of formula I, especially of formula Ia, where A is a group of formula IVa and D is a group of formula Vo, especially

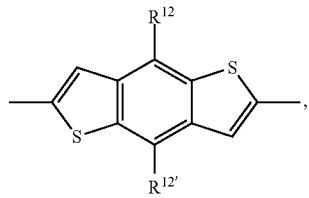

such as, for example,

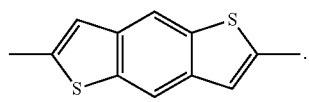

An example of such as a polymer is a polymer of formula

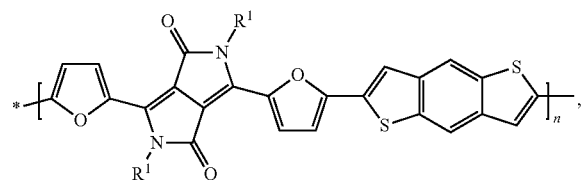

wherein n is 4 (especially 10) to 1000, especially 4 to 200, very especially 5 (especially 20) to 100 and $R^1$ is a $C_1$-$C_{35}$alkyl group, especially a $C_8$-$C_{35}$alkyl group. Said polymers show high efficiency of energy conversion, when used in solar cells.

In a preferred embodiment the present invention is directed to polymers, comprising repeating units of the formula $$*\!-\!\!\lbrack\!-\!A\text{-}D\!-\!\rbrack_x\!-\!\lbrack\!-\!B\text{-}D\!-\!\rbrack_y\!-\!* \qquad (II),$$

wherein x=0.995 to 0.005, y=0.005 to 0.995, especially x=0.2 to 0.8, y=0.8 to 0.2, and wherein x+y=1;

A is a group of formula IVa, IVc, IVe, IVg, IVh, IVi, IVj, or IVk, $R^1$ and $R^2$ are a $C_1$-$C_{35}$alkyl group, especially a $C_8$-$C_{35}$alkyl group, $R^{104}$ is a $C_1$-$C_{25}$alkyl group, especially a $C_4$-$C_{25}$alkyl, which may optionally be interrupted by one or more oxygen or sulphur atoms, B and D are independently of each other a group of formula Va, Vb, Vc, especially

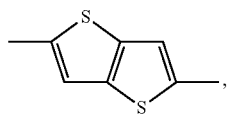

Ve, Vf, Vh, Vi, Vj, Vk, Vl, Vm, Vn, Vo, Vp, Vq, Vr, Vs, Vu, Vv, Vw, Vx, especially

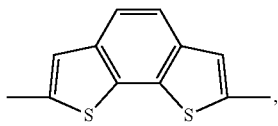

Vy, Vz, or Va'. The polymers of the formula IIa have especially a weight average molecular weight of 10,000 to 1,000,000, very especially 10,000 to 100,000 Daltons.

The polymer structure represented by formula *─[A-D]$_x$─[B-D]$_y$─* (IIa) is an idealized representation of the polymer products obtained, for example, via the Suzuki polymerization procedure. Simultaneous polymerization of monomers A, B and D results in a statistical copolymer consisting of randomly ordered units ─[A-D]─ and ─[B-D]─ (poly(AD-stat-BD)).

In another preferred embodiment the present invention is directed to polymers, comprising repeating units of the formula

wherein
x=0.995 to 0.005, y=0.005 to 0.995, especially x=0.2 to 0.8, y=0.8 to 0.2, and wherein x+y=1;
A is a group of formula IVa, IVc, IVe, IVg, IVh, IVi, IVj, or IVk as defined in claim 3,
$R^{104}$ is a $C_1$-$C_{25}$alkyl group, especially a $C_4$-$C_{25}$alkyl, which may optionally be interrupted by one or more oxygen or sulphur atoms,
B is a group of formula

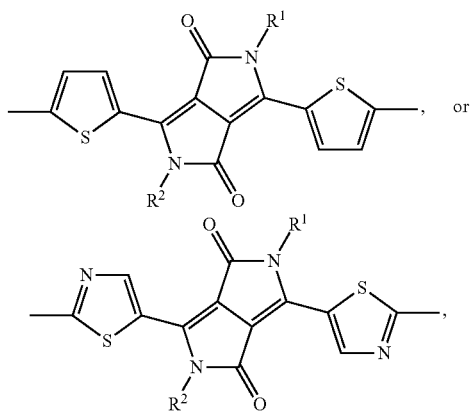

$R^1$ and $R^2$ are a $C_1$-$C_{35}$alkyl group, especially a $C_8$-$C_{35}$alkyl group,
D is a group of formula Va, Vb, Vc, especially

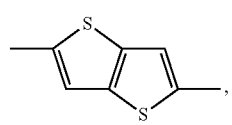

Ve, Vf, Vh, Vi, Vj, Vk, Vl, Vm, Vn, Vo, Vp, Vq, Vr, Vs, Vu, Vv, Vw, Vx, especially

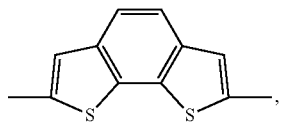

Vy, Vz, or Va' as defined above.

In a preferred embodiment the present invention is directed to polymers, comprising repeating units of the formula

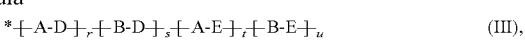 (III), wherein
r=0.985 to 0.005, s=0.005 to 0.985, t=0.005 to 0.985, u=0.005 to 0.985, and wherein r+s+t+u=1,
A is a group of formula IVa, IVc, IVe, IVg, IVh, IVi, IVj, or IVk,
$R^1$ and $R^2$ are a $C_1$-$C_{35}$alkyl group, especially a $C_8$-$C_{35}$alkyl group,
$R^{104}$ is a $C_1$-$C_{25}$alkyl group, especially a $C_4$-$C_{25}$alkyl, which may optionally be interrupted by one or more oxygen or sulphur atoms,
B, D and E are independently of each other a group of formula Va, Vb, Vc, especially

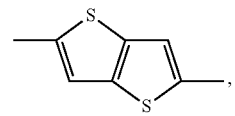

Ve, Vf, Vh, Vi, Vj, Vk, Vl, Vm, Vn, Vo, Vp, Vq, Vr, Vs, Vu, Vv, Vw, Vx, especially

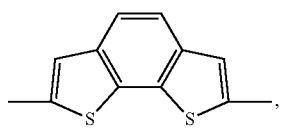

Vy, Vz, or Va'. The polymers of the formula IIIa have especially a weight average molecular weight of 10,000 to 1,000,000, very especially 10,000 to 100,000 Daltons.

In the above-described embodiments groups of formula IVa, IVc, IVe, IVg, IVh and IVi are most preferred as group A.

The polymer structure represented by formula *─[A-D]$_r$─[B-D]$_s$─[A-E]$_t$─[B-E]$_u$─* (IIIa) is an idealized representation of the polymer products obtained, for example, via the Suzuki polymerization procedure. Simultaneous polymerization of monomers A, B, D and E results in a statistical copolymer consisting of randomly ordered units ─[A-D]─, ─[B-D]─, ─[A-E]─ and ─[B-E]─ (poly(AD-stat-BD-stat-AE-stat-BE).

At present polymers of formula (Ia), (Ib), (Ic), (Id), (If), (Ig), (Ih), (Ii), (Ij), (Ik), (Il), (Im), (In), (Io), (Ip), (Iq), (Ir), (Is), (It), (Iu), (Iv), (Ix), (Iy), (Iz), (Ia'), (Ib'), (Ic'), (Id'), (Ie'), (If'), (Ig'), (Ih'), (Ii'), (Ij'), (IIa), (IIb), (IIc), (IId), (IIe), (IIf), (IIg), (IIh), (IIi), and (IIj) are most preferred.

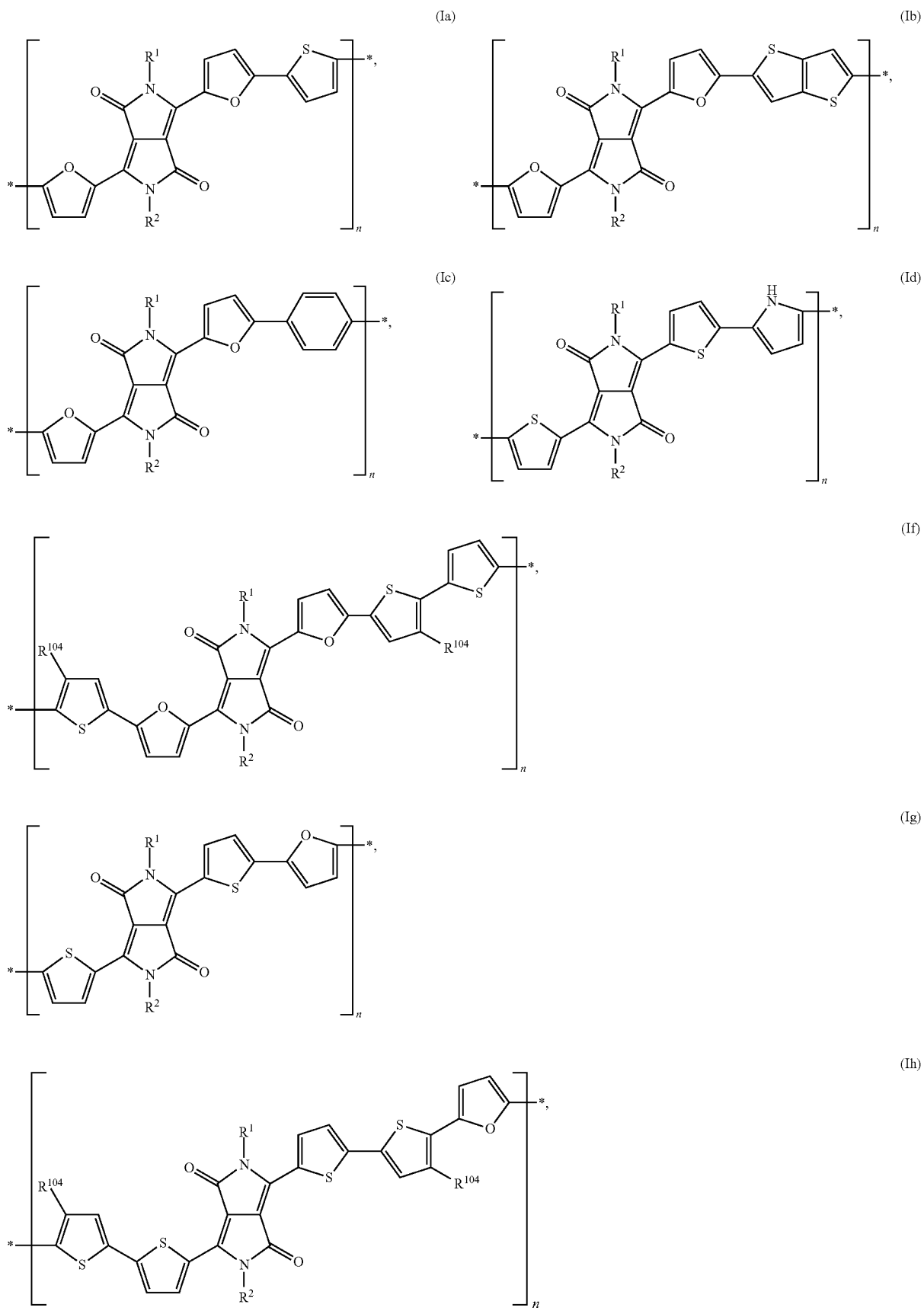

-continued
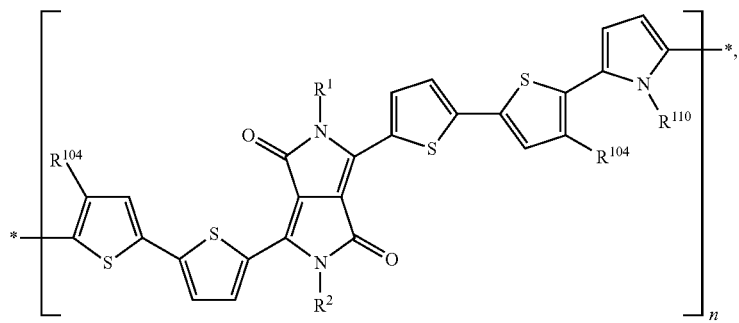 (Ii)
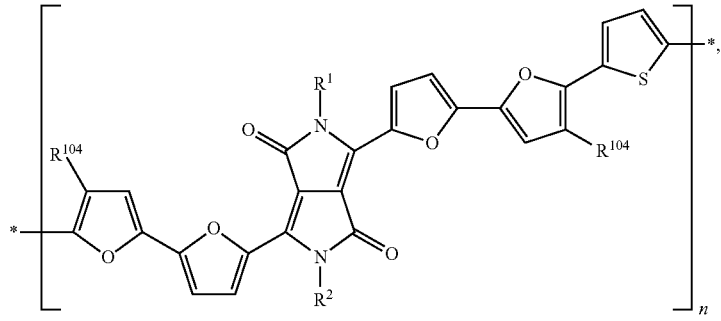 (Ip)
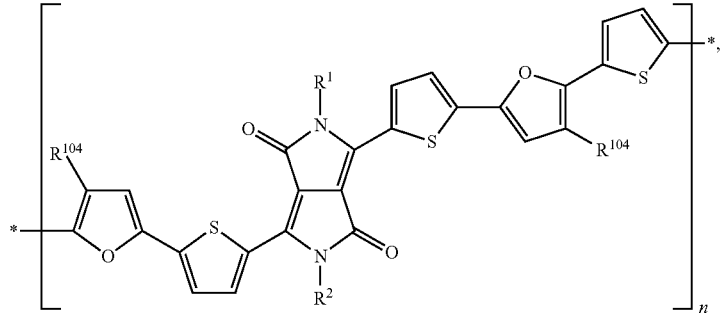 (Iq)
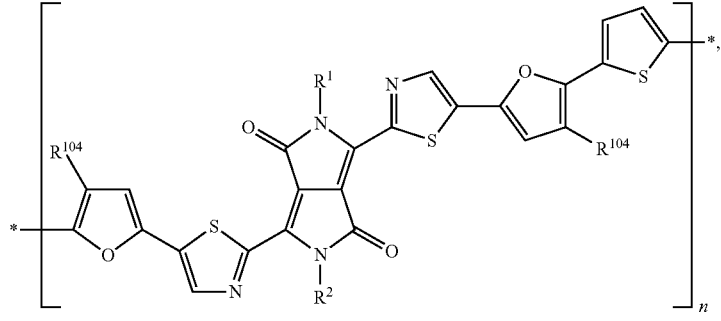 (Ir)
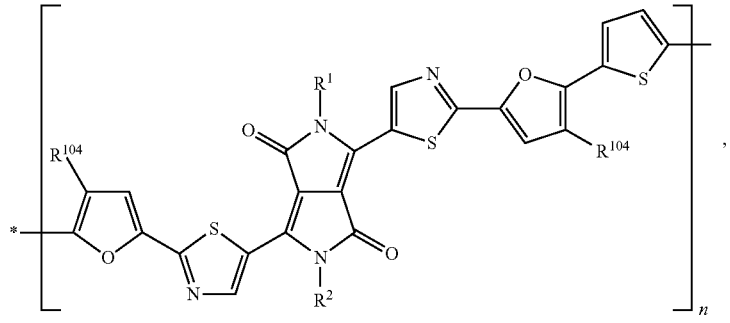 (Is)

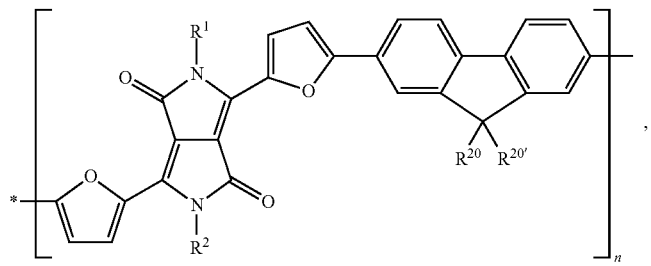
(It)
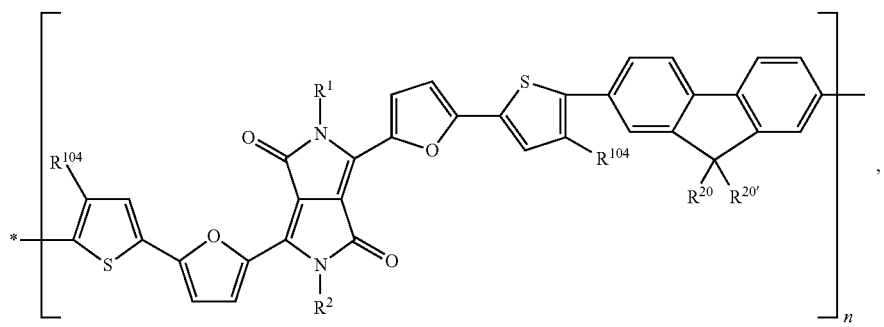
(Iu)
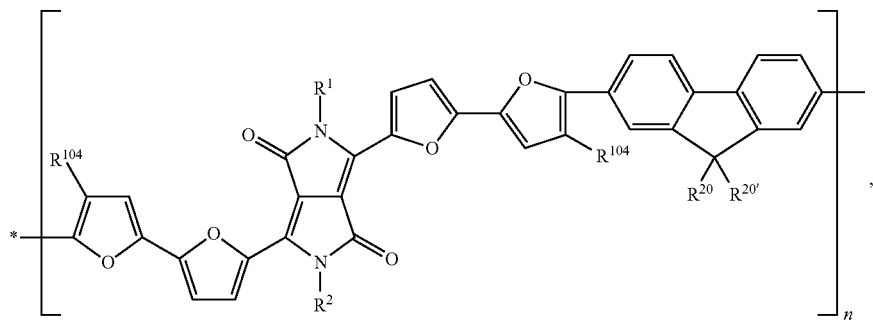
(Iv)
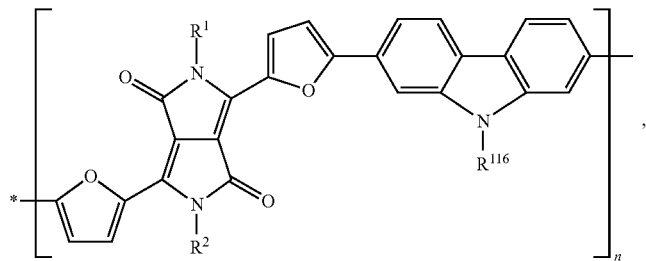
(Ix)
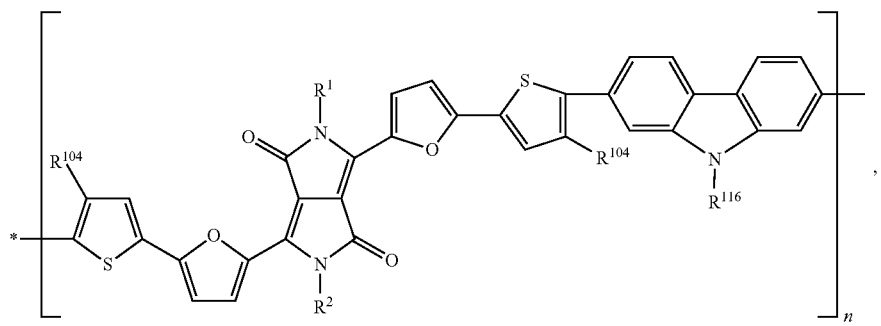
(Iy)

-continued
(Iz)
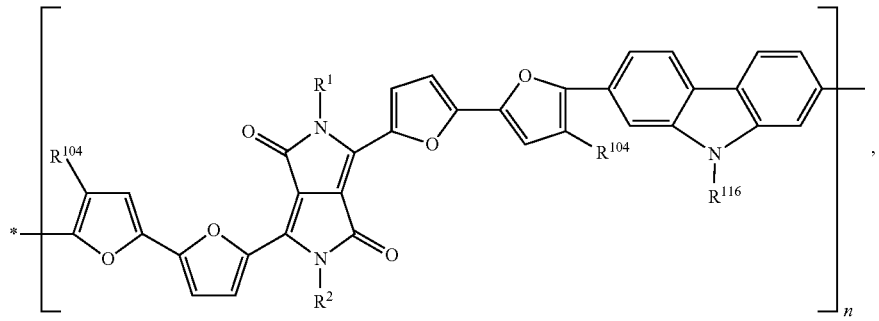
(Ia')
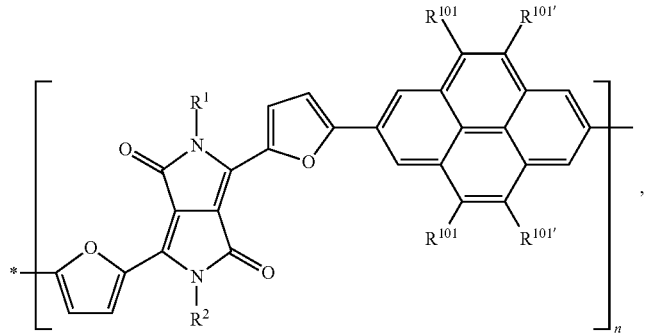
(Ib')
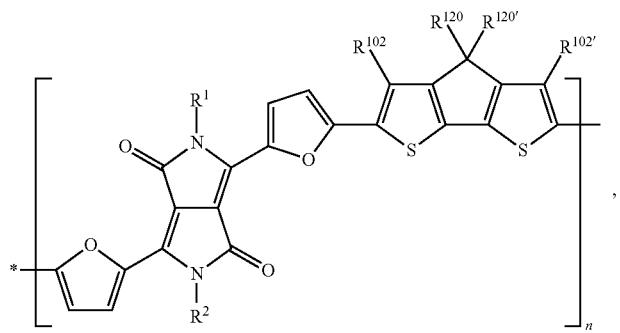
(Ic')
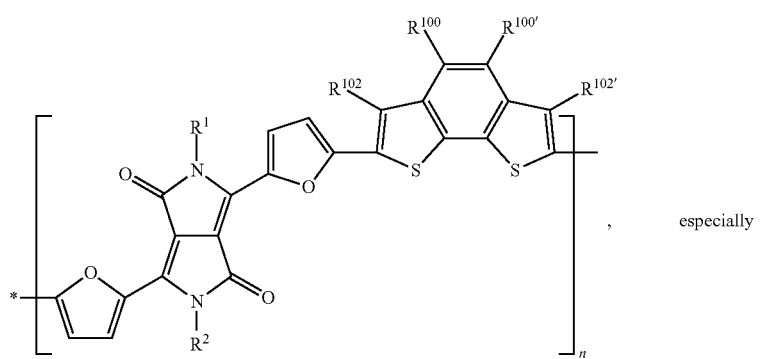, especially
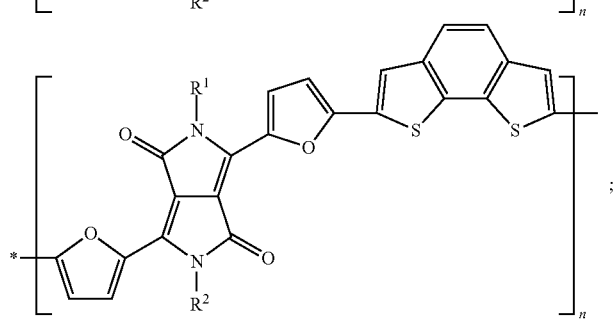;

-continued
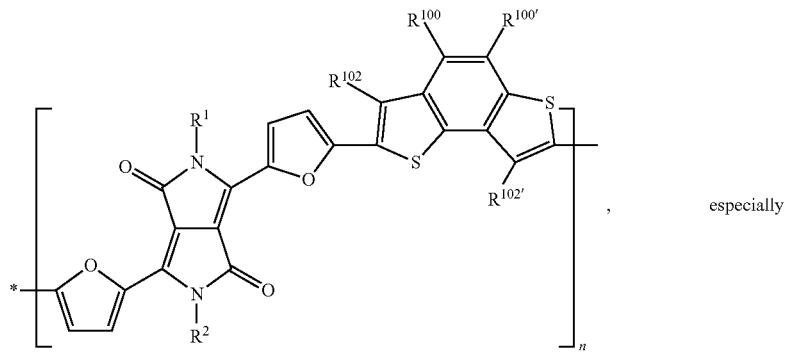
(Id′)
, especially
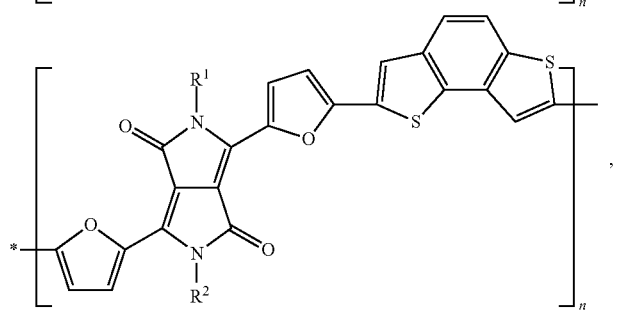
,
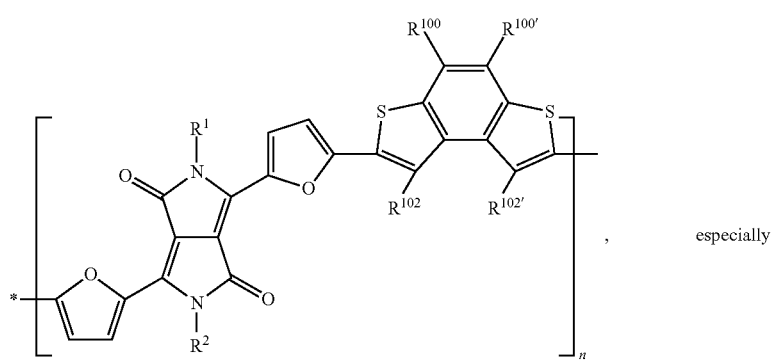
(Ie′)
, especially
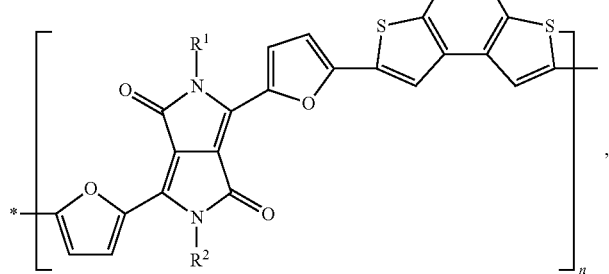
,
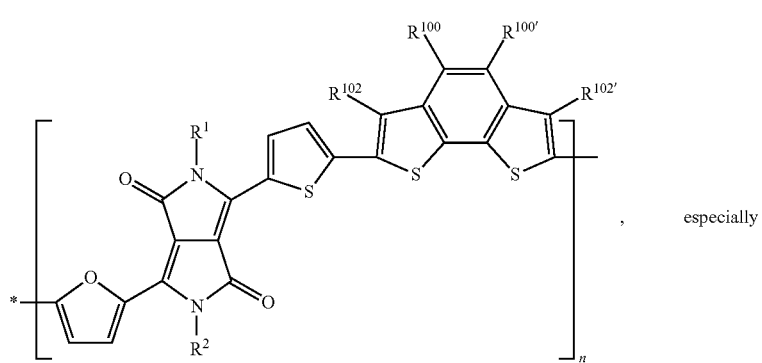
(If′)
, especially

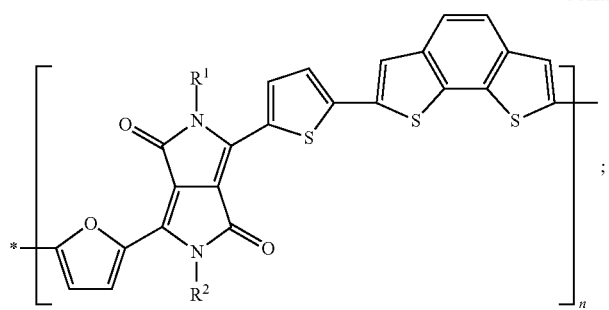
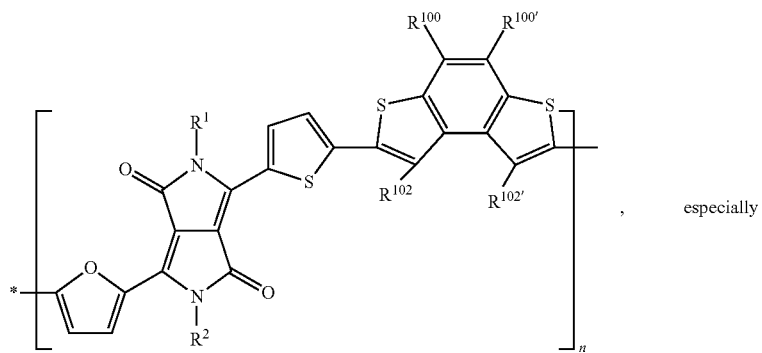, especially
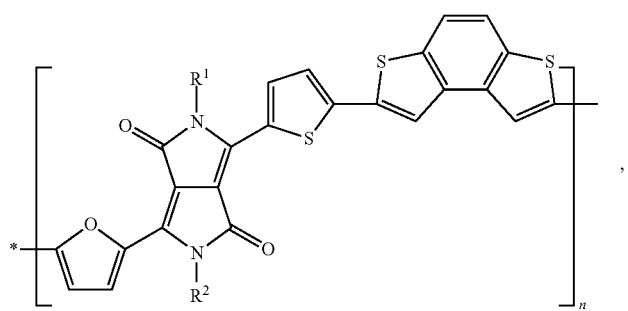,
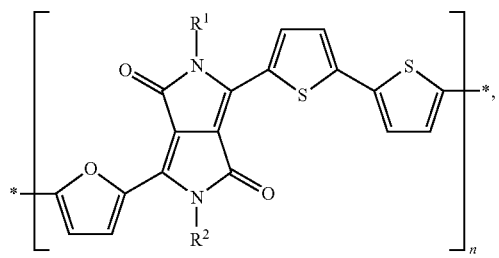,
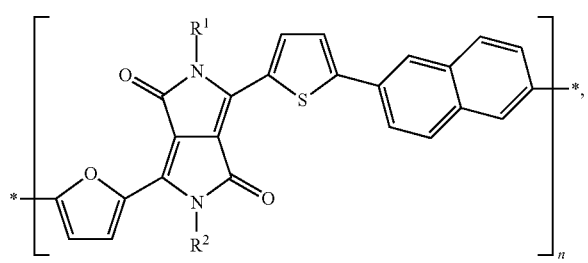

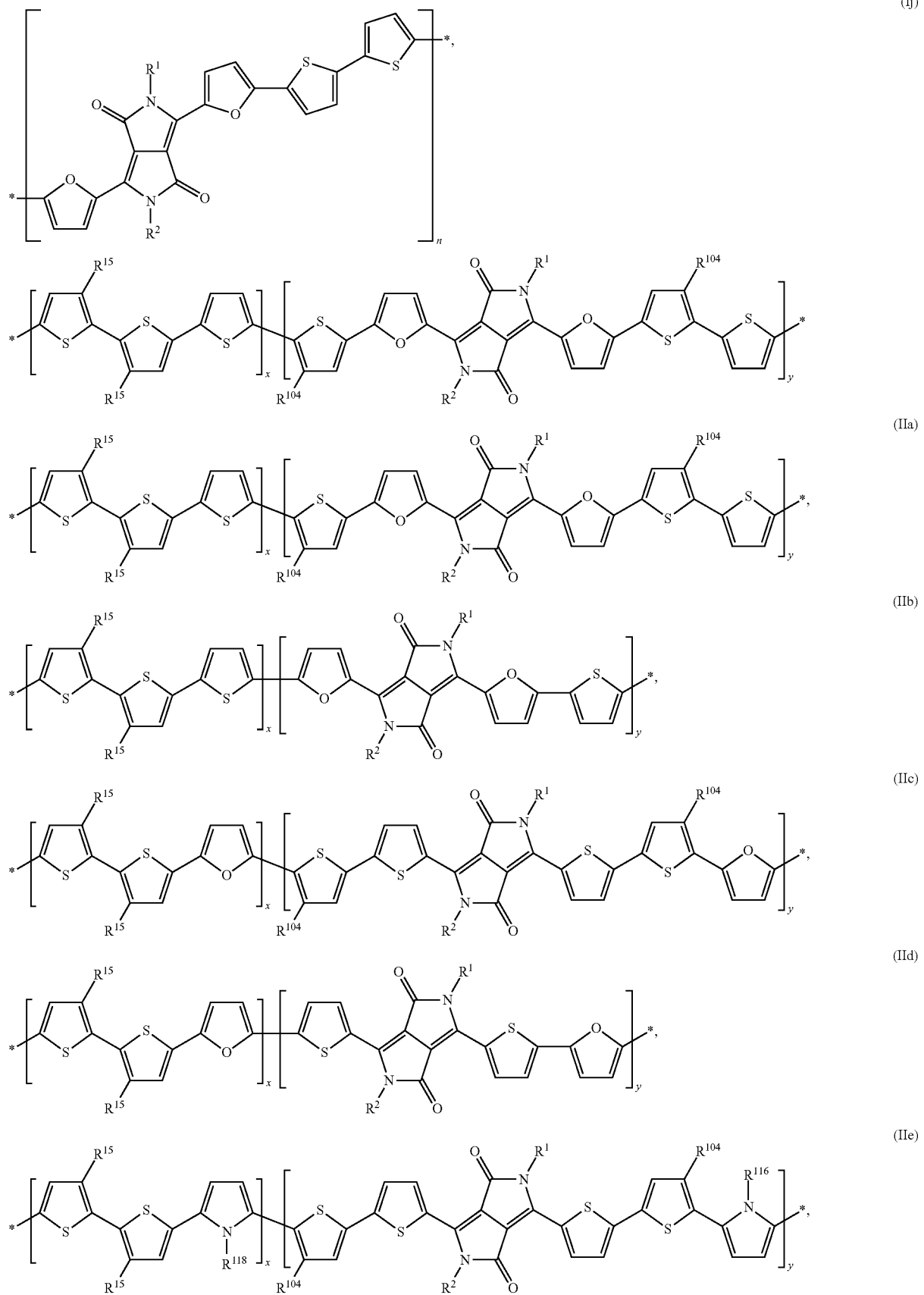

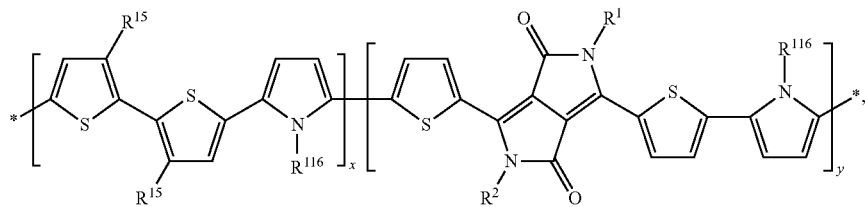
(IIf)

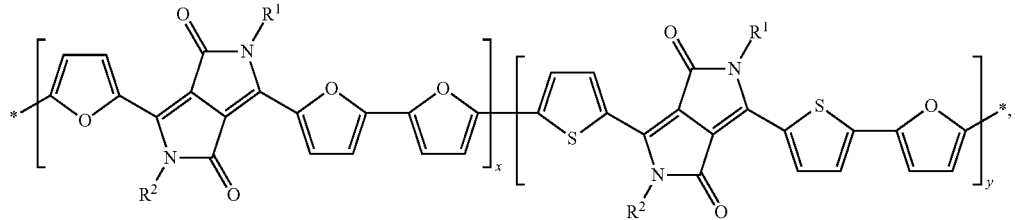
(IIg)

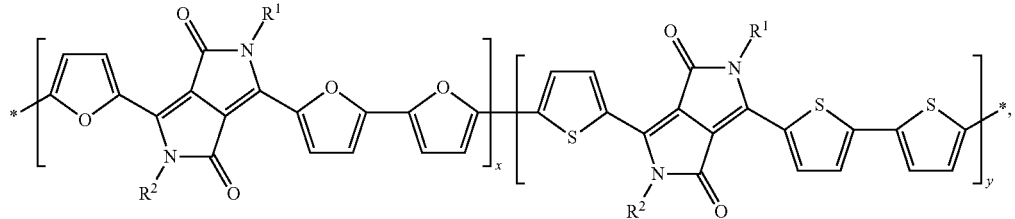
(IIh)

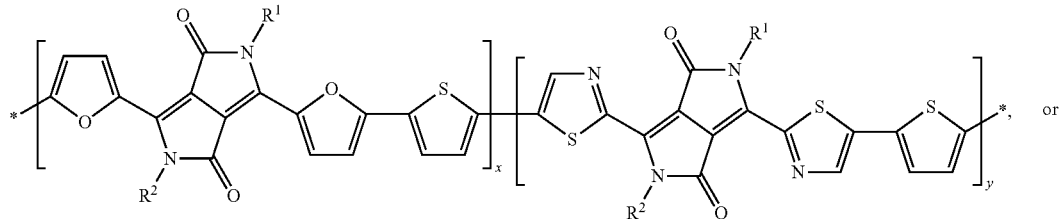
(IIi), or

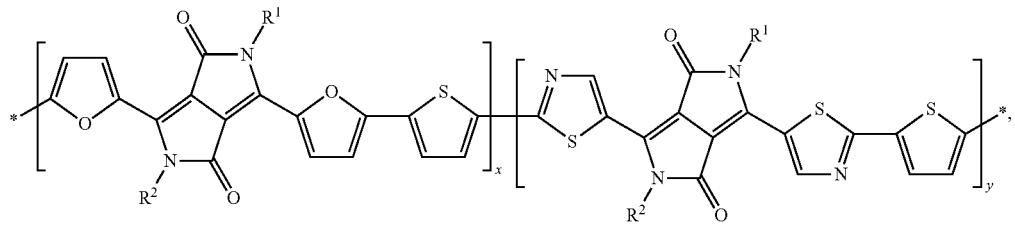
(IIj)

$R^{104}$ is preferably a $C_1$-$C_{25}$alkyl group, especially a $C_4$-$C_{25}$alkyl, which may optionally be interrupted by one or more oxygen or sulphur atoms.

$R^{15}$, $R^{15'}$, $R^{17}$ and $R^{17'}$ are preferably independently of each other H, or a $C_1$-$C_{25}$alkyl group, especially a $C_6$-$C_{25}$alkyl, which may optionally be interrupted by one or more oxygen atoms.

$R^{20}$ and $R^{20'}$ are preferably independently of each other hydrogen, $C_7$-$C_{25}$aralkyl, $C_1$-$C_{25}$alkyl, especially $C_4$-$C_{25}$alkyl, which may optionally be interrupted by one, or more oxygen, or sulphur atoms.

$R^{100}$ and $R^{100'}$ are preferably H.

$R^{101}$ and $R^{101'}$ are preferably H, a $C_1$-$C_{25}$alkyl group, or a $C_1$-$C_{25}$alkoxy group.

$R^{102}$ and $R^{102'}$ are preferably H, or a $C_1$-$C_{25}$alkyl group.

$R^{103}$ is preferably H, or a $C_1$-$C_{25}$alkyl group.

$R^{116}$ is preferably H, or a $C_1$-$C_{25}$alkyl group.

$R^{120}$ and $R^{120'}$ are preferably a $C_1$-$C_{35}$alkyl group.

The preparation of the polymers of the present invention is illustrated in more detail for polymers of formula II. Polymers of formula I and III can be prepared using the methods described for the preparation of the polymers of formula II.

Copolymers of formula II can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-dialkoxybiphenyl/palladium(II) acetates, tri-alkyl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tertbutylphosphonium tetrafluoroborate ((t-Bu)$_3$ P*HBF$_4$)/tris(dibenzylideneacetone) dipalladium (0) (Pd$_2$(dba)$_3$) and tri-tert-butylphosphine (t-Bu)$_3$P/tris(dibenzylideneacetone)dipalladium (0) (Pd$_2$(dba)$_3$). This reaction can be applied to preparing high molecular weight polymers and copolymers.

To prepare polymers corresponding to formula II dihalogenides of formula X$^{10}$-A-X$^{10}$ and X$^{10}$—B—X$^{10}$ are reacted with an (equimolar) amount of a diboronic acid or diboronate corresponding to formula; X$^{11}$—[D]—X$^{11}$; or a dihalogenide of formula X$^{10}$—[D]—X$^{10}$ is reacted with an (equimolar) amount of diboronic acids or diboronates corresponding to formula X$^{11}$-A-X$^{11}$ and X$^{11}$—B—X$^{11}$, wherein X$^{10}$ is halogen, especially Cl, Br, or I, very especially Br, and X$^{11}$ is independently in each occurrence —B(OH)$_2$, —B(OY$^1$)$_2$,

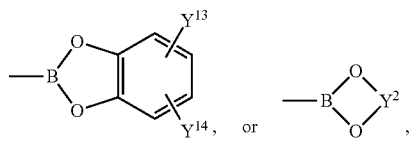

wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$—, or —CY$^7$Y$^8$—CY$^9$Y$^{10}$—CY$^{11}$Y$^{12}$—, wherein Y$^3$, Y$^4$, Y$^5$, Y$^6$, Y$^7$, Y$^8$, Y$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, —CH$_2$C(CH$_3$)$_2$CH$_2$—, or —C(CH$_3$)$_2$CH$_2$C(CH$_3$)$_2$—, and Y$^{13}$ and Y$^{14}$ are independently of each other hydrogen, or a C$_1$-C$_{10}$alkyl group, under the catalytic action of Pd and triphenylphosphine. The reaction is typically conducted at about 0° C. to 180° C. in an aromatic hydrocarbon solvent such as toluene, or xylene. Other solvents such as dimethylformamide, dioxane, dimethoxyethan and tetrahydrofuran can also be used alone, or in mixtures with an aromatic hydrocarbon. An aqueous base, preferably sodium carbonate or bicarbonate, potassium phosphate, potassium carbonate or bicarbonate is used as activation agent for the boronic acid, boronate and as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

According to the process described in WO2010/136352 (European patent application no. 09176497.7) the polymerisation is carried out in presence of a) a catalyst/ligand system comprising a palladium catalyst and an organic phosphine or phosphonium compound, b) a base, c) a solvent or a mixture of solvents, characterized in that the organic phosphine is a trisubstituted phosphine of formula

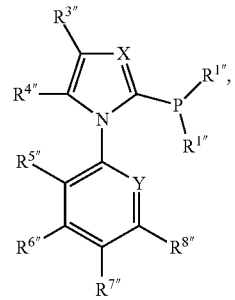

(VI)

or phosphonium salt thereof, wherein X independently of Y represents a nitrogen atom or a C—R$^{2'''}$ group and Y independently of X represents a nitrogen atom or a C—R$^{9'''}$ group, R$^{1'''}$ for each of the two R$^{1'''}$ groups independently of the other represents a radical selected from the group C$_1$-C$_{24}$-alkyl, C$_3$-C$_{20}$-cycloalkyl, which includes especially both monocyclic and also bi- and tri-cyclic cycloalkyl radicals, C$_6$-C$_{14}$-aryl, which includes especially the phenyl, naphthyl, fluorenyl radical, C$_2$-C$_{13}$-heteroaryl, wherein the number of hetero atoms, selected from the group N, O, S, may be from 1 to 2, wherein the two radicals R$^{1'''}$ may also be linked to one another, and wherein the above-mentioned radicals R$^{1'''}$ may themselves each be mono- or poly-substituted independently of one another by substituents selected from the group hydrogen, C$_1$-C$_{20}$-alkyl, C$_2$-C$_{20}$-alkenyl, C$_3$-C$_8$-cycloalkyl, C$_2$-C$_8$-hetero-alkyl, C$_6$-C$_{10}$-aryl, C$_2$-C$_9$-heteroaryl, wherein the number of hetero atoms from the group N, O, S may be from 1 to 4, C$_1$-C$_{20}$-alkoxy, C$_1$-C$_{10}$-haloalkyl, hydroxy, amino of the forms NH—(C$_1$-C$_{20}$-alkyl), NH—(C$_5$-C$_{10}$-aryl), N(C$_1$-C$_{20}$-alkyl)$_2$, N(C$_1$-C$_{20}$-alkyl) (C$_6$-C$_{10}$-aryl), N(C$_5$-C$_{10}$-aryl)$_2$, N(C$_1$-C$_{20}$-alkyl/C$_6$-C$_{10}$-aryl$_3$)$_3^+$, NH—CO—C$_1$-C$_{20}$-alkyl, NH—CO—C$_5$-C$_{10}$-aryl, carboxylato of the forms COOH and COOQ (wherein Q represents either a monovalent cation or C$_1$-C$_8$-alkyl), C$_1$-C$_6$-acyloxy, sulfinato, sulfonato of the forms SO$_3$H and SO$_3$Q' (wherein Q' represents either a monovalent cation, C$_1$-C$_{20}$-alkyl, or C$_5$-C$_{10}$-aryl), tri-C$_1$-C$_6$-alkylsilyl, wherein two of the mentioned substituents may also be bridged with one another, R$^{2'''}$ to R$^{9'''}$ represent a hydrogen, alkyl, alkenyl, cycloalkyl, aromatic or heteroaromatic aryl, O-alkyl, NH-alkyl, N-(alkyl)$_2$, O-(aryl), NH-(aryl), N-(alkyl)(aryl), O—CO-alkyl, O—CO-aryl, F, Si(alkyl)$_3$, CF$_3$, CN, CO$_2$H, COH, SO$_3$H, CONH$_2$, CONH(alkyl), CON(alkyl)$_2$, SO$_2$(alkyl), SO(alkyl), SO(aryl), SO$_2$(aryl), SO$_3$(alkyl), SO$_3$(aryl), S-alkyl, S-aryl, NH—CO(alkyl), CO$_2$(alkyl), CONH$_2$, CO(alkyl), NHCOH, NHCO$_2$(alkyl), CO(aryl), CO$_2$(aryl) radical, wherein two or more adjacent radicals, each independently of the other (s), may also be linked to one another so that a condensed ring system is present and wherein in R$^{2'''}$ to R$^{9'''}$ alkyl represents a hydrocarbon radical having from 1 to 20 carbon atoms which may in each case be linear or branched, alkenyl represents a mono- or poly-unsaturated hydrocarbon radical having from 2 to 20 carbon atoms which may in each case be linear or branched, cycloalkyl represents a hydrocarbon having from 3 to 20 carbon atoms, aryl represents a 5- to 14-membered aromatic radical, wherein from one to four carbon atoms in the aryl radical may also be replaced by hetero atoms from the group nitrogen, oxygen and sulfur so that a 5- to 14-membered heteroaromatic radical is present, wherein the radicals R$^{2'''}$ to R$^{9'''}$ may also carry further substituents as defined for R$^{1'''}$.

The organic phosphines and their synthesis are described in WO2004101581.

Preferred organic phosphines are selected from trisubstituted phosphines of formula ![Structure of trisubstituted phosphine with R groups R1", R3", R4", R5", R6" on pyrrole-phenyl scaffold]

| Cpd. | R1" | R5" | R6" | R3" | R4" |
|---|---|---|---|---|---|
| A-1 | H₃C–C(CH₃)₂–CH₃ (tert-butyl) | H | H | H | H |
| A-2 | cyclohexyl | H | H | H | H |
| A-3 | phenyl | H | H | H | H |
| A-4 | adamantyl | H | H | H | H |
| A-5 | cyclohexyl | —OCH₃ | H | H | H |
| A-6 | cyclohexyl | 1) | 1) | H | H |
| A-7 | H₃C–C(CH₃)₂–CH₃ (tert-butyl) | 1) | 1) | H | H |
| A-8 | phenyl | 1) | 1) | H | H |
| A-9 | adamantyl | 1) | 1) | H | H |
| A-10 | cyclohexyl | H | H | 2) | 2) |
| A-11 | H₃C–C(CH₃)₂–CH₃ (tert-butyl) | H | H | 2) | 2) |
| A-12 | phenyl | H | H | 2) | 2) |
| A-13 | adamantyl | H | H | 2) | 2) |

1) R5" and R6" together form a ring

2) R3" and R4" together form a ring

Examples of preferred catalysts include the following compounds:

palladium(II) acetylacetonate, palladium(0)dibenzylidene-acetone complexes, palladium(II) propionate, Pd₂(dba)₃: [tris(dibenzylideneacetone)dipalladium(0)], Pd(dba)₂: [bis(dibenzylideneacetone) palladium(0)], Pd(PR₃)₂, wherein PR₃ is a trisubstituted phosphine of formula VI, Pd(OAc)₂: [palladium(II) acetate], palladium(II) chloride, palladium(II) bromide, lithium tetrachloropalladate(II)

PdCl₂(PR₃)₂; wherein PR₃ is a trisubstituted phosphine of formula VI; palladium(0)diallyl ether complexes, palladium (II) nitrate, PdCl₂(PhCN)₂: [dichlorobis(benzonitrile) palladium(II)], PdCl₂(CH₃CN): [dichlorobis(acetonitrile) palladium(II)], and PdCl₂(COD): [dichloro(1,5-cyclooctadiene) palladium (II)].

Especially preferred are PdCl₂, Pd₂(dba)₃, Pd(dba)₂, Pd(OAc)₂, or Pd(PR₃)₂. Most preferred are Pd₂(dba)₃ and Pd(OAc)₂.

The palladium catalyst is present in the reaction mixture in catalytic amounts. The term "catalytic amount" refers to an amount that is clearly below one equivalent of the (hetero)aromatic compound(s), preferably 0.001 to 5 mol-%, most preferably 0.001 to 1 mol-%, based on the equivalents of the (hetero)aromatic compound(s) used.

The amount of phosphines or phosphonium salts in the reaction mixture is preferably from 0.001 to 10 mol-%, most preferably 0.01 to 5 mol-%, based on the equivalents of the (hetero)aromatic compound(s) used. The preferred ratio of Pd:phosphine is 1:4.

The base can be selected from all aqueous and nonaqueous bases and can be inorganic, or organic. It is preferable that at least 1.5 equivalents of said base per functional boron group is present in the reaction mixture. Suitable bases are, for example, alkali and alkaline earth metal hydroxides, carboxylates, carbonates, fluorides and phosphates such as sodium and potassium hydroxide, acetate, carbonate, fluoride and phosphate or also metal alcoholates. It is also possible to use a mixture of bases. The base is preferably a lithium salt, such as, for example, lithium alkoxides (such as, for example, lithium methoxide and lithium ethoxide), lithium hydroxide, carboxylate, carbonate, fluoride and/or phosphate.

The at present most preferred base is aqueous LiOHxH₂O (monohydrate of LiOH) and (waterfree) LiOH.

The reaction is typically conducted at about 0° C. to 180° C., preferably from 20 to 160° C., more preferably from 40 to 140° C. and most preferably from 40 to 120° C. A polymerization reaction may take 0.1, especially 0.2 to 100 hours.

In a preferred embodiment of the present invention the solvent is THF, the base is LiOH*H₂O and the reaction is conducted at reflux temperature of THF (about 65° C.).

The solvent is for example selected from toluene, xylenes, anisole, THF, 2-methyltetrahydrofuran, dioxane, chlorobenzene, fluorobenzene or solvent mixtures comprising one or more solvents like e.g. THF/toluene and optionally water. Most preferred is THF, or THF/water.

Advantageously, the polymerisation is carried out in presence of a) palladium(II) acetate, or Pd₂(dba)₃, (tris(dibenzylideneacetone)dipalladium(0)) and an organic phosphine A-1 to A-13, b) LiOH, or LiOHxH₂O; and c) THF, and optionally water. If the monohydrate of LiOH is used, no water needs to be added.

Most preferred the polymerisation is carried out in presence of a) palladium(II) acetate, or Pd₂(dba)₃ (tris(dibenzylideneacetone)dipalladium(0)) and

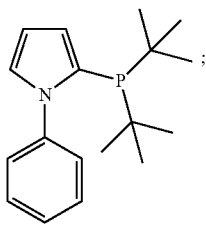 [SMILES: CC(C)(C)P(c1cccn1-c1ccccc1)C(C)(C)C]

b) LiOH×H₂O; and
c) THF. The palladium catalyst is present in an amount of preferably about 0.5 mol-%, based on the equivalents of the (hetero)aromatic compound(s) used. The amount of phosphines or phosphonium salts in the reaction mixture is preferably about 2 mol-%, based on the equivalents of the (hetero)aromatic compound(s) used. The preferred ratio of Pd:phosphine is about 1:4.

Preferably the polymerization reaction is conducted under inert conditions in the absence of oxygen. Nitrogen and more preferably argon are used as inert gases.

The process described in European patent application no. 09176497.7 is suitable for large-scale applications, is readily accessible and convert starting materials to the respective polymers in high yield, with high purity and high selectivity. The process can provide polymers having weight average molecular weights of at least 10,000 Daltons, more preferably at least 20,000 Daltons, most preferably at least 30,000 Daltons. The at present most preferred polymers have a weight average molecular weight of 30,000 to 80,000 Daltons. Molecular weights are determined according to high-temperature gel permeation chromatography (HT-GPC) using polystyrene standards. The polymers preferably have a polydispersibility of 1.01 to 10, more preferably 1.1 to 3.0, most preferred 1.5 to 2.5.

If desired, a monofunctional aryl halide or aryl boronate may be used as a chain-terminator in such reactions, which will result in the formation of a terminal aryl group.

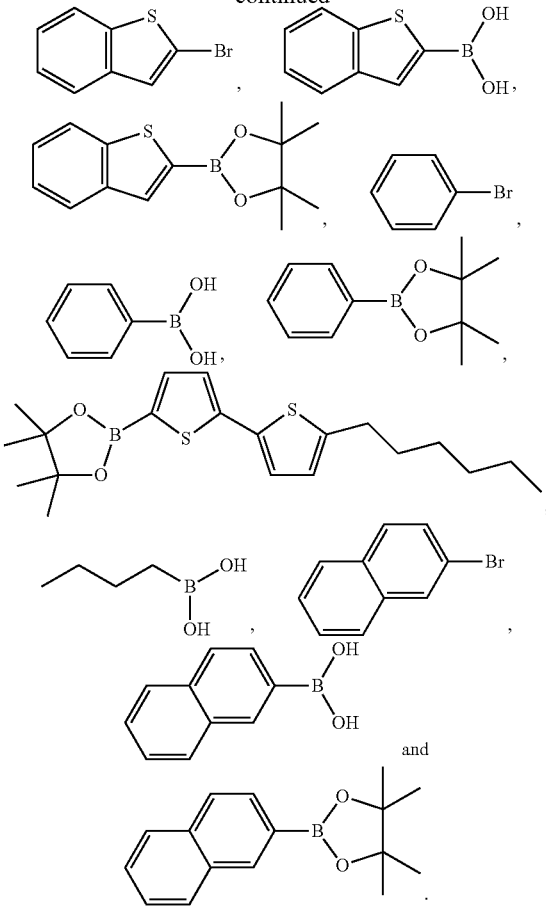

It is possible to control the sequencing of the monomeric units in the resulting copolymer by controlling the order and composition of monomer feeds in the Suzuki reaction.

The polymers of the present invention can also be synthesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula II dihalogenides of formula $X^{10}$-A-$X^{10}$ and $X^{10}$—B—$X^{10}$ are reacted with a compound of formula $X^{21}$-D-$X^{21}$, or a dihalogenide of formula $X^{10}$-D-$X^{10}$ is reacted with compounds of formula $X^{21}$A-$X^{21}$ and $X^{21}$—B—$X^{21}$, wherein X is a group —SnR$^{207}$R$^{208}$R$^{209}$ and $X^{10}$ is as defined above, in an inert solvent at a temperature in range from 0° C. to 200° C. in the presence of a palladium-containing catalyst, wherein R$^{207}$, R$^{208}$ and R$^{209}$ are identical or different and are H or $C_1$-$C_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tertbutanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents A-$(ZnX^{22})_2$ and B—$(ZnX^{22})_2$, wherein $X^{22}$ is halogen and halides, and D-$(X^{23})_2$, wherein $X^{23}$ is halogen or triflate, or using A-$(X^{22})_2$, B—$(X^{22})_2$, and D-$(ZnX^{23})_2$. Reference is, for example, made to E. Negishi et al., Heterocycles 18 (1982) 117-22.

Alternatively, the polymers of the present invention can also be synthesized by the Hiyama reaction using organosilicon reagents A-$(SiR^{210}R^{211}R^{212})_2$ and B—$(SiR^{210}R^{211}R^{212})_2$, wherein $R^{210}$, $R^{211}$ and $R^{212}$ are identical or different and are halogen, or $C_1$-$C_6$alkyl, and D-$(X^{23})_2$, wherein $X^{23}$ is halogen or triflate, or using A-$(X^{23})_2$, B—$(X^{23})_2$, and D-$(SiR^{210}R^{211}R^{212})_2$. Reference is, for example, made to T. Hiyama et al., Pure Appl. Chem. 66 (1994) 1471-1478 and T. Hiyama et al., Synlett (1991) 845-853.

The compounds of formula

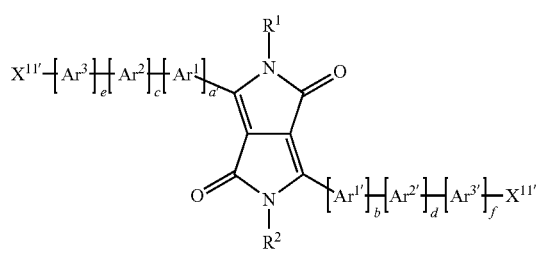

(Xa)

are intermediates in the production of the polymers of the present invention, wherein a, b, c, d, e, f, $R^1$, $R^2$, $Ar^1$, $Ar^{1'}$, $Ar^2$, $Ar^{2'}$, $Ar^3$ and $Ar^{3'}$ are as defined above and $X^{11'}$ is independently in each occurrence a halogen atom, very especially I, or Br; or has the meaning of $X^{11}$.

Compounds of formula

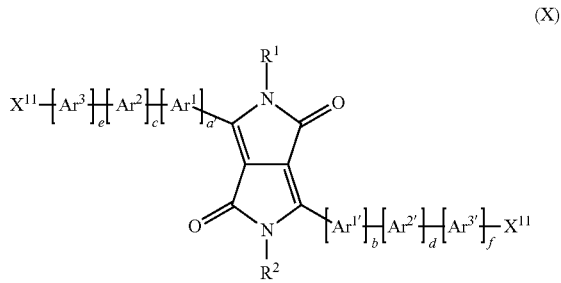

(X)

are new and form a further subject of the present application, wherein a, b, c, d, e, f, $R^1$, $R^2$, $Ar^1$, $Ar^{1'}$, $Ar^2$, $Ar^{2'}$, $Ar^3$ and $Ar^{3'}$ are as defined in claim 1 and $X^{11}$ is independently in each occurrence $ZnX^{12}$, —$SnR^{207}R^{208}R^{209}$, wherein $R^{207}$, $R^{208}$ and $R^{209}$ are identical or different and are H or $C_1$-$C_6$alkyl, wherein two radicals optionally form a common ring and these radicals are optionally branched or unbranched; $X^{12}$ is a halogen atom, very especially I, or Br; —$OS(O)_2CF_3$, —$OS(O)_2$-aryl, especially

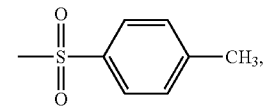

—$OS(O)_2CH_3$, —$B(OH)_2$, —$B(OH)_3$—, —$BF_3$, —$B(OY^1)_2$,

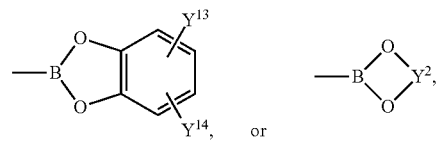

or wherein $Y^1$ is independently in each occurrence a $C_1$-$C_{10}$alkyl group and $Y^2$ is independently in each occurrence a $C_2$-$C_{10}$alkylene group, such as $CY^3Y^4$—$CY^5Y^6$—, or $CY^7Y^8$—$CY^9Y^{10}$—$CY^{11}Y^{12}$—, wherein $Y^3$, $Y^4$, $Y^5$, $Y^6$, $Y^7$, $Y^8$, $Y^9$, $Y^{10}$, $Y^{11}$ and $Y^{12}$ are independently of each other hydrogen, or a $C_1$-$C_{10}$alkyl group, especially —$C(CH_3)_2C(CH_3)_2$—, or —$C(CH_3)_2CH_2C(CH_3)_2$—, —$CH_2C(CH_3)_2CH_2$—, and $Y^{13}$ and $Y^{14}$ are independently of each other hydrogen, or a $C_1$-$C_{10}$alkyl group.

Examples of compounds of formula X are shown below:

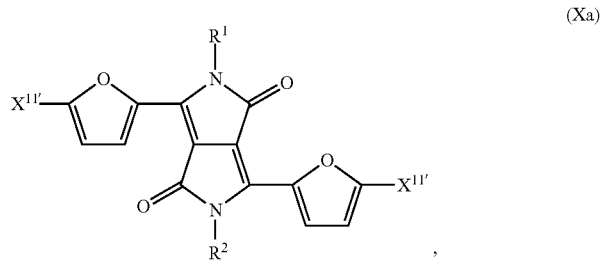

(Xa)

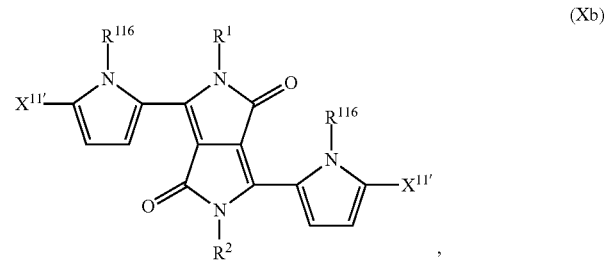

(Xb)

-continued
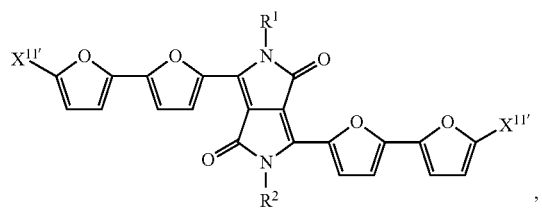 (Xc)
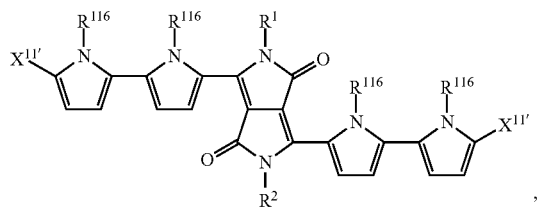 (Xd)
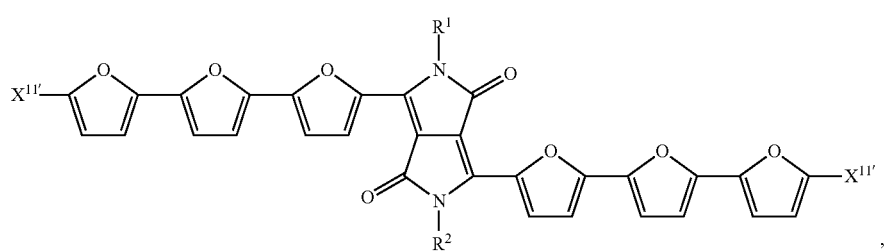 (Xe)
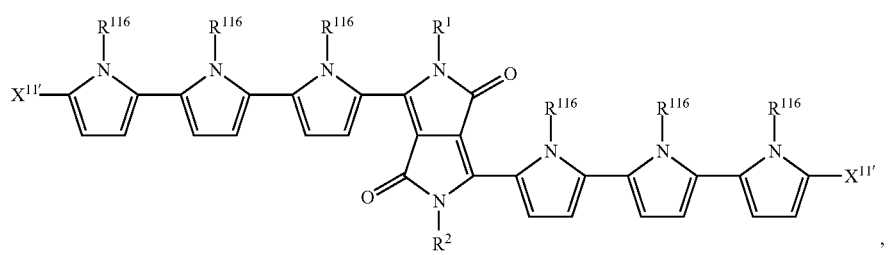 (Xf)
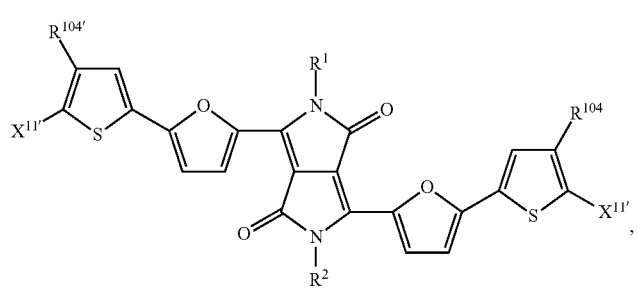 (Xg)
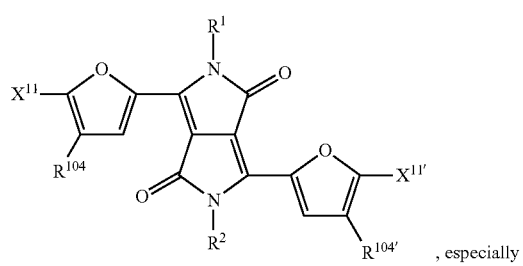 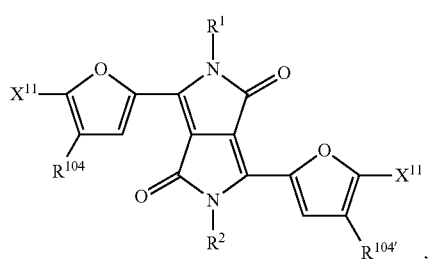 (Xh)
, especially
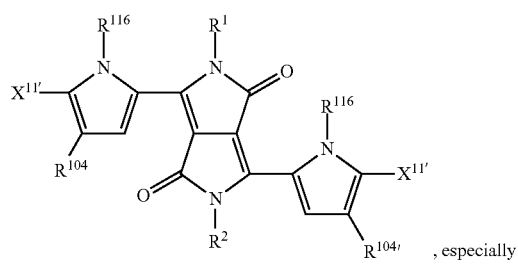 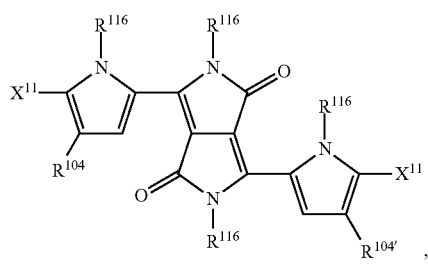 (Xi)
, especially ,

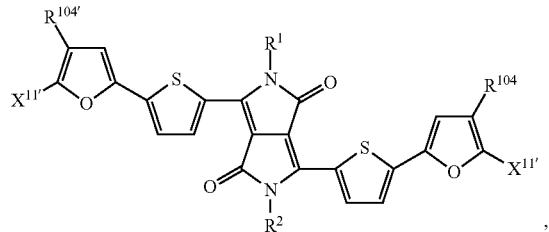 (Xj)

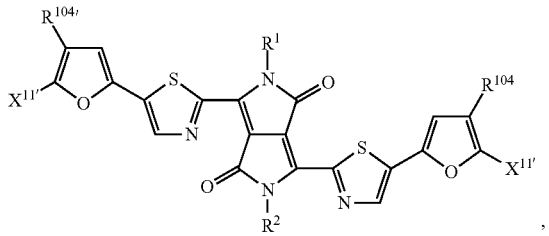 (Xk)

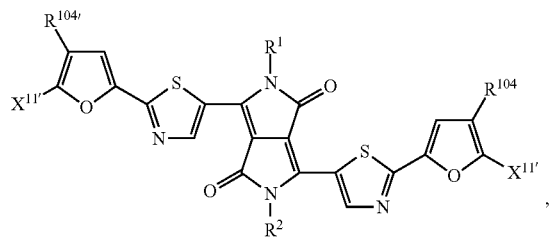 (Xl)

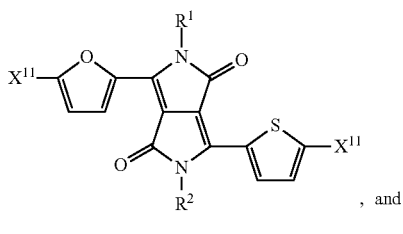 (Xm)

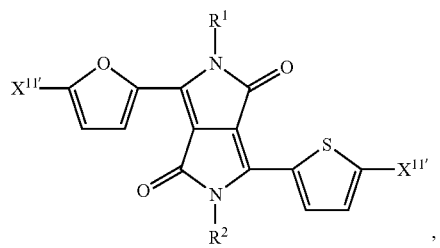 (Xn)

$X^{11'}$, $R^1$, $R^2$, $R^{116}$, $R^{104}$ and $R^{104'}$ are as defined above.

$R^1$ and $R^2$ are preferably a $C_1$-$C_{36}$alkyl group, such as methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetrannethylbutyl, 1-nnethylheptyl, 3-methylheptyl, n-octyl, 1,1,3,3-tetrannethylbutyl and 2-ethylhexyl, n-nonyl, decyl, undecyl, especially n-dodecyl, tridecyl, tetradecyl, pentadecyl, hexadecyl, 2-ethyl-hexyl, 2-butyl-hexyl, 2-butyl-octyl, 2-hexyldecyl, 2-octyl-dodecyl, 2-decyl-tetradecyl, heptadecyl, octadecyl, eicosyl, heneicosyl, docosyl, or tetracosyl.

$R^{104}$ and $R^{104'}$ can be the same, or different and are preferably a $C_1$-$C_{25}$alkyl group, especially a $C_4$-$C_{25}$alkyl, which may optionally be interrupted by one or more oxygen or sulphur atoms, $R^{116}$ is preferably H, or a $C_1$-$C_{25}$alkyl group.

The polymers, wherein $R^1$ and/or $R^2$ are hydrogen can be obtained by using a protecting group which can be removed after polymerization (see, for example, EP-A-0 648 770, EP-A-0 648 817, EP-A-0 742 255, EP-A-0 761 772, WO98/32802, WO98/45757, WO98/58027, WO99/01511, WO00/17275, WO00/39221, WO00/63297 and EP-A1 086 984). Conversion of the pigment precursor into its pigmentary form is carried out by means of fragmentation under known conditions, for example thermally, optionally in the presence of an additional catalyst, for example the catalysts described in WO00/36210.

An example of such a protecting group is group of formula

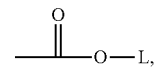

wherein L is any desired group suitable for imparting solubility.

L is preferably a croup of formula

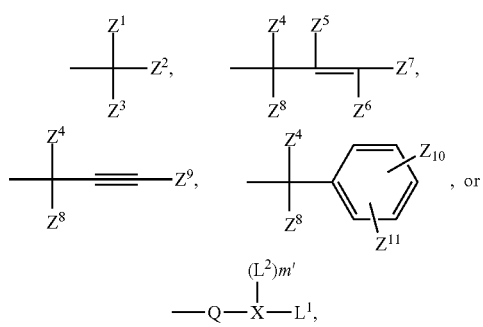

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^5$, $Z^6$ and $Z^7$ are independently of each other hydrogen or $C_1$-$C_6$alkyl, $Z^9$ is hydrogen, $C_1$-$C_6$alkyl or a group of formula

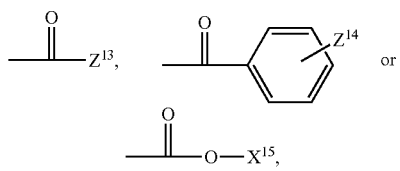

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{15}$ is hydrogen, $C_1$-$C_6$alkyl, or unsubstituted or $C_1$-$C_6$alkyl-substituted phenyl, Q is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X is a hetero atom selected from the group consisting of nitrogen, oxygen and sulfur, m' being the number 0 when X is oxygen or sulfur and m being the number 1 when X is nitrogen, and $L^1$ and $L^2$ are independently of each other unsubstituted or mono- or poly-$C_1$-$C_{12}$alkoxy-, —$C_1$-$C_{12}$alkylthio-, —$C_2$-$C_{24}$dialkylamino-, —$C_6$-$C_{12}$aryloxy-, —$C_6$-$C_{12}$arylthio-, —$C_7$-$C_{24}$alkylarylamino- or —$C_{12}$-$C_{24}$diarylamino-substituted $C_1$-$C_6$alkyl or [-(p',q'-$C_2$-$C_6$alkylene)-Z—]$_{n'}$—$C_1$-$C_6$alkyl, n' being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating [—$C_2$-$C_6$alkylene-Z-] units to be the same or different, and $L_1$ and $L_2$ may be saturated or unsaturated from one to ten times, may be uninterrupted or interrupted at any location by from 1 to 10 groups selected from the group consisting of —(C=O)— and —$C_6H_4$—, and may carry no further substituents or from 1 to 10 further substituents selected from the group consisting of halogen, cyano and nitro. Most preferred L is a group of formula

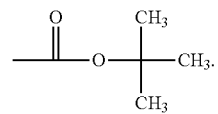

The synthesis of the compounds of formula Br-A-Br is described in WO08/000664, and WO09/047104, or can be done in analogy to the methods described therein. The synthesis of N-aryl substituted compounds of formula Br-A-Br can be done in analogy to the methods described in U.S. Pat. No. 5,354,869 and WO03/022848.

Halogen is fluorine, chlorine, bromine and iodine.

$C_1$-$C_{25}$alkyl ($C_1$-$C_{18}$alkyl) is typically linear or branched, where possible. Examples are methyl, ethyl, n-propyl, isopropyl, n-butyl, sec.-butyl, isobutyl, tert.-butyl, n-pentyl, 2-pentyl, 3-pentyl, 2,2-dimethylpropyl, 1,1,3,3-tetramethylpentyl, n-hexyl, 1-methylhexyl, 1,1,3,3,5,5-hexamethylhexyl, n-heptyl, isoheptyl, 1,1,3,3-tetramethylbutyl, 1-methylheptyl, 3-methylheptyl, n-octyl, 1,1,3,3-tetramethylbutyl and 2-ethylhexyl, n-nonyl, decyl, undecyl, dodecyl, tridecyl, tetradecyl, pentadecyl, hexadecyl, heptadecyl, octadecyl, eicosyl, heneicosyl, docosyl, tetracosyl or pentacosyl. $C_1$-$C_8$alkyl is typically methyl, ethyl, n-propyl, isopropyl, n-butyl, sec.-butyl, isobutyl, tert.-butyl, n-pentyl, 2-pentyl, 3-pentyl, 2,2-dimethyl-propyl, n-hexyl, n-heptyl, n-octyl, 1,1,3,3-tetrannethylbutyl and 2-ethylhexyl. $C_1$-$C_4$alkyl is typically methyl, ethyl, n-propyl, isopropyl, n-butyl, sec.-butyl, isobutyl, tert.-butyl.

$C_2$-$C_{18}$alkenyl groups are straight-chain or branched alkenyl groups, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-18}$alkynyl is straight-chain or branched and preferably $C_{2-8}$ alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_1$-$C_{25}$alkoxy groups ($C_1$-$C_{18}$alkoxy groups) are straight-chain or branched alkoxy groups, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy. Examples of $C_1$-$C_8$alkoxy are methoxy, ethoxy, n-propoxy, isopropoxy, n-butoxy, sec.-butoxy, isobutoxy, tert.-butoxy, n-pentoxy, 2-pentoxy, 3-pentoxy, 2,2-dimethylpropoxy, n-hexoxy, n-heptoxy, n-octoxy, 1,1,3,3-tetramethylbutoxy and 2-ethylhexoxy, preferably $C_1$-$C_4$alkoxy such as typically methoxy, ethoxy, n-propoxy, isopropoxy, n-butoxy, sec.-butoxy, isobutoxy, tert.-butoxy. The term "alkylthio group" means the same groups as the alkoxy groups, except that the oxygen atom of the ether linkage is replaced by a sulfur atom.

$C_1$-$C_{18}$perfluoroalkyl, especially $C_1$-$C_4$perfluoroalkyl, is a branched or unbranched radical such as for example —$CF_3$, —$CF_2CF_3$, —$CF_2CF_2CF_3$, —$CF(CF_3)_2$, —$(CF_2)_3CF_3$, and —$C(CF_3)_3$.

The term "carbamoyl group" is typically a $C_{1-18}$carbamoyl radical, preferably $C_{1-8}$carbamoyl radical, which may be unsubstituted or substituted, such as, for example, carbamoyl, methylcarbamoyl, ethylcarbamoyl, n-butylcarbamoyl, tert-butylcarbamoyl, dimethylcarbamoyloxy, morpholinocarbamoyl or pyrrolidinocarbamoyl.

$C_5$-$C_{12}$cycloalkyl is typically cyclopentyl, cyclohexyl, cycloheptyl, cyclooctyl, cyclononyl, cyclodecyl, cycloundecyl, cyclododecyl, preferably cyclopentyl, cyclohexyl, cycloheptyl, or cyclooctyl, which may be unsubstituted or substituted. The cycloalkyl group, in particular a cyclohexyl group, can be condensed one or two times by phenyl which can be substituted one to three times with $C_1$-$C_4$-alkyl, halogen and cyano. Examples of such condensed cyclohexyl groups are:

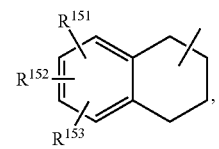

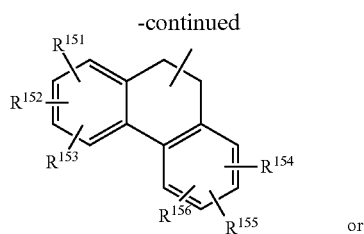

or

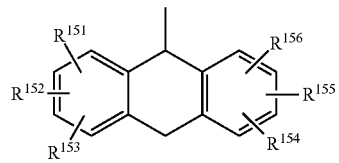

in particular

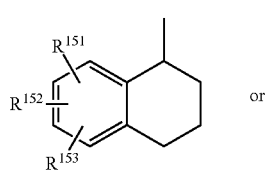

or

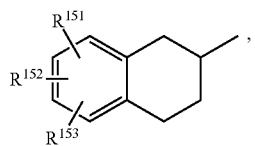

, wherein $R^{151}$, $R^{152}$, $R^{153}$, $R^{154}$, $R^{155}$ and $R^{156}$ are independently of each other $C_1$-$C_8$-alkyl, $C_1$-$C_8$-alkoxy, halogen and cyano, in particular hydrogen.

$C_6$-$C_{24}$aryl ($C_6$-$C_{18}$aryl) is typically phenyl, indenyl, azulenyl, naphthyl, biphenyl, as-indacenyl, s-indacenyl, acenaphthylenyl, fluorenyl, phenanthryl, fluoranthenyl, triphenlenyl, chrysenyl, naphthacen, picenyl, perylenyl, pentaphenyl, hexacenyl, pyrenyl, or anthracenyl, preferably phenyl, 1-naphthyl, 2-naphthyl, 4-biphenyl, 9-phenanthryl, 2- or 9-fluorenyl, 3- or 4-biphenyl, which may be unsubstituted or substituted. Examples of $C_6$-$C_{12}$aryl are phenyl, 1-naphthyl, 2-naphthyl, 3- or 4-biphenyl, 2- or 9-fluorenyl or 9-phenanthryl, which may be unsubstituted or substituted.

$C_7$-$C_{25}$aralkyl is typically benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl, ω-phenyl-octadecyl, ω-phenyl-eicosyl or ω-phenyl-docosyl, preferably $C_7$-$C_{18}$aralkyl such as benzyl, 2-benzyl-2-propyl, β-phenyl-ethyl, α,α-dimethylbenzyl, ω-phenyl-butyl, ω,ω-dimethyl-ω-phenyl-butyl, ω-phenyl-dodecyl or ω-phenyl-octadecyl, and particularly preferred $C_7$-$C_{12}$aralkyl such as benzyl, 2-benzyl-2-propyl, β-phenyl-ethyl, α,α-dimethylbenzyl, ω-phenyl-butyl, or ω,ω-dimethyl-ω-phenyl-butyl, in which both the aliphatic hydrocarbon group and aromatic hydrocarbon group may be unsubstituted or substituted. Preferred examples are benzyl, 2-phenylethyl, 3-phenylpropyl, naphthylethyl, naphthylmethyl, and cumyl.

Heteroaryl is typically $C_2$-$C_{20}$heteroaryl, i.e. a ring with five to seven ring atoms or a condensed ring system, wherein nitrogen, oxygen or sulfur are the possible hetero atoms, and is typically an unsaturated heterocyclic group with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, pyrimidinyl, phenanthrolinyl, phenazinyl, isothiazolyl, phenothiazinyl, isoxazolyl, furazanyl or phenoxazinyl, which can be unsubstituted or substituted.

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, a carbamoyl group, a nitro group or a silyl group, especially $C_1$-$C_8$alkyl, $C_1$-$C_8$alkoxy, $C_1$-$C_8$alkylthio, halogen, halo-$C_1$-$C_8$alkyl, or a cyano group.

$C_1$-$C_{18}$alkyl interrupted by one or more O is, for example, $(CH_2CH_2O)_{1-9}$—$R^x$, where $R^x$ is H or $C_1$-$C_{10}$alkyl, $CH_2$—$CH(OR^{y\prime})$—$CH_2$—O—$R^y$, where $R^y$ is $C_1$-$C_{18}$alkyl, and $R^{y\prime}$ embraces the same definitions as $R^y$ or is H.

If a substituent, such as, for example $R^{18}$, occurs more than one time in a group, it can be different in each occurrence.

The wording "substituted by G" means that one, or more, especially one to three substituents G might be present.

As described above, the aforementioned groups may be substituted by E' and/or, if desired, interrupted by D'. Interruptions are of course possible only in the case of groups containing at least 2 carbon atoms connected to one another by single bonds; $C_6$-$C_{18}$aryl is not interrupted; interrupted arylalkyl contains the unit D' in the alkyl moiety. $C_1$-$C_{18}$alkyl substituted by one or more E' and/or interrupted by one or more units D' is, for example, $(CH_2CH_2O)_{1-9}$—$R^x$, where $R^x$ is H or $C_1$-$C_{10}$alkyl or $C_2$-$C_{10}$alkanoyl (e.g. CO—CH($C_2H_5$)$C_4H_9$), $CH_2$—$CH(OR^{y\prime\prime\prime})$—$CH_2$—O—$R^y$, where $R^y$ is $C_1$-$C_{18}$alkyl, $C_5$-$C_{12}$cycloalkyl, phenyl, $C_7$-$C_{15}$phenylalkyl, and $R^{y\prime}$ embraces the same definitions as $R^y$ or is H; $C_1$-$C_8$alkylene-COO—$R^z$, e.g. $CH_2COOR_z$, $CH(CH_3)COOR^z$, $C(CH_3)_2COOR^z$, where $R^z$ is H, $C_1$-$C_{18}$alkyl, $(CH_2CH_2O)_{1-9}$—$R^x$, and $R^x$ embraces the definitions indicated above; $CH_2CH_2$—O—CO—CH=$CH_2$; $CH_2CH(OH)CH_2$—O—CO—C($CH_3$)=$CH_2$.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.).

The polymers of the present invention can be blended with small molecules described, for example, in European patent application no. 09155919.5, WO09/047104, U.S. Pat. No. 6,690,029, WO2007082584, and WO2008107089.

WO2007082584:
(I1)
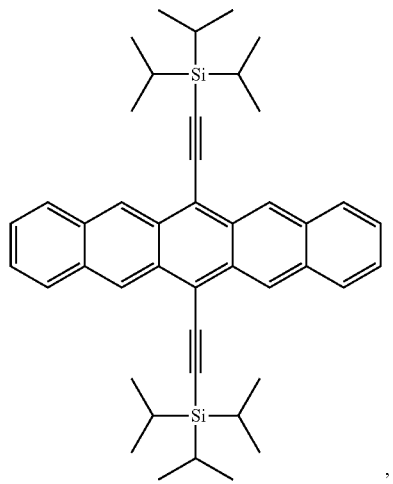
(I2)
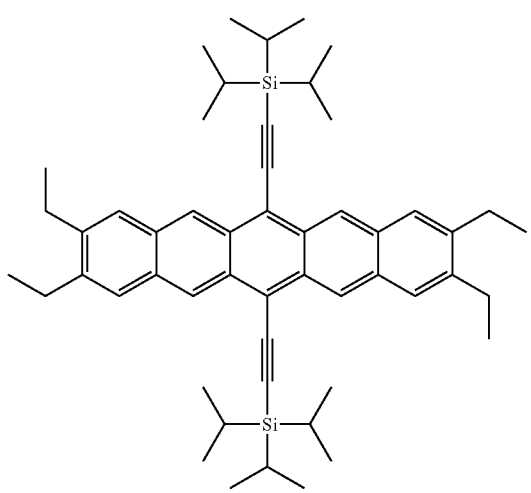
(I3)
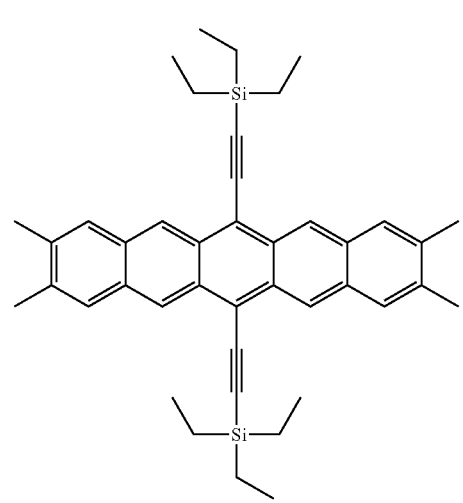
(I4)
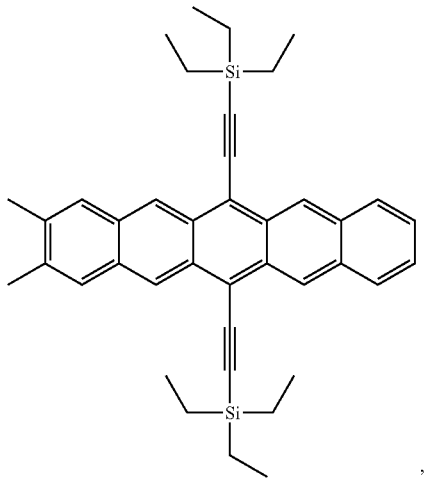
(I5)
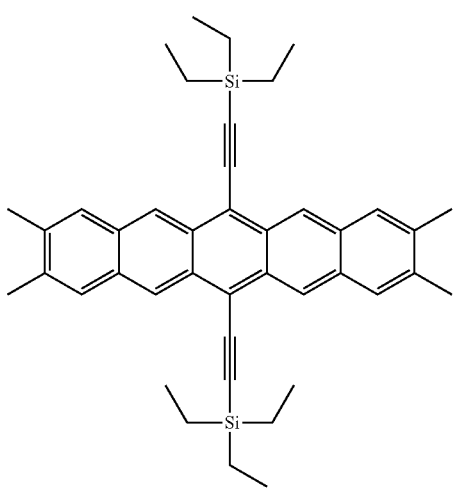
(I6)
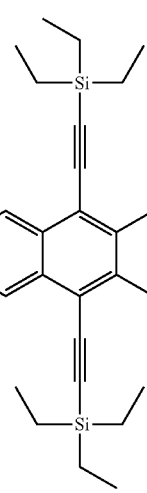

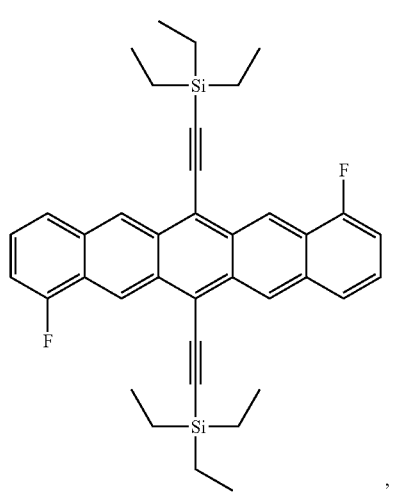
(I7)

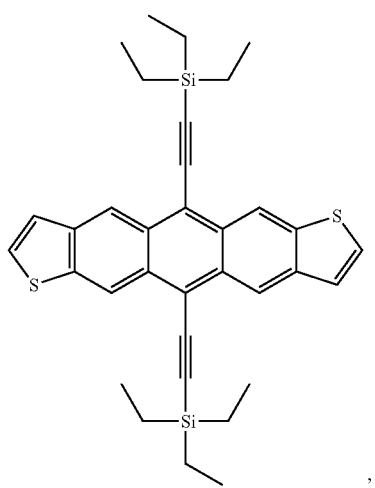
(I8)

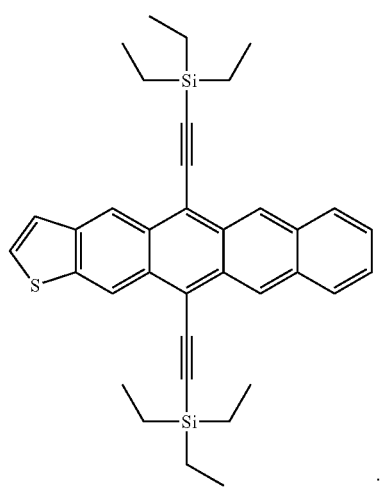
(I9)

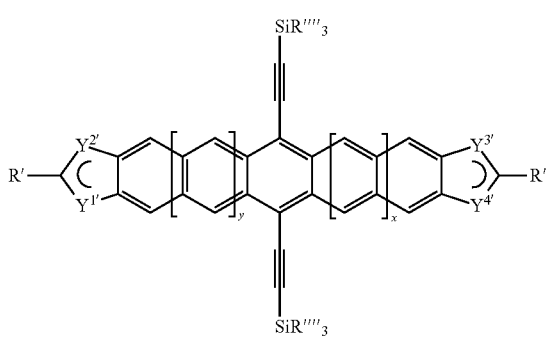

wherein one of $Y^{1'}$ and $Y^{2'}$ denotes —CH= or =CH— and the other denotes —X'—, one of $Y^{3'}$ and $Y^{4'}$ denotes —CH= or =CH— and the other denotes —X'—, X' is —O—, —S—, —Se— or —NR'''—, R'''' is cyclic, straight-chain or branched alkyl or alkoxy having 1 to 20 C-atoms, or aryl having 2-30 C-atoms, all of which are optionally fluorinated or perfluorinated, R' is H, F, Cl, Br, I, CN, straight-chain or branched alkyl or alkoxy having 1 to 20 C-atoms and optionally being fluorinated or perfluorinated, optionally fluorinated or perfluorinated aryl having 6 to 30 C-atoms, or $CO_2R''$, with R'' being H, optionally fluorinated alkyl having 1 to 20 C-atoms, or optionally fluorinated aryl having 2 to 30 C-atoms, R''' is H or cyclic, straight-chain or branched alkyl with 1 to 10 C-atoms, y is 0, or 1, x is 0, or 1.

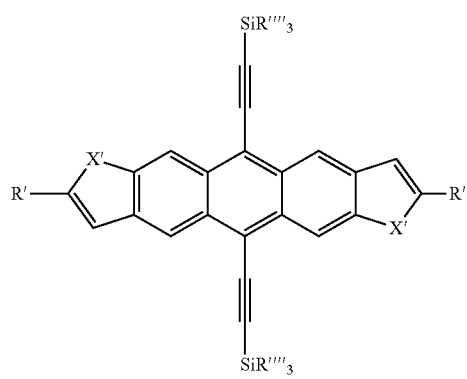
A1

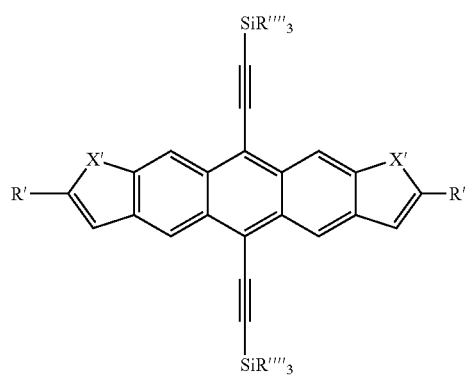
A2

WO2008107089:

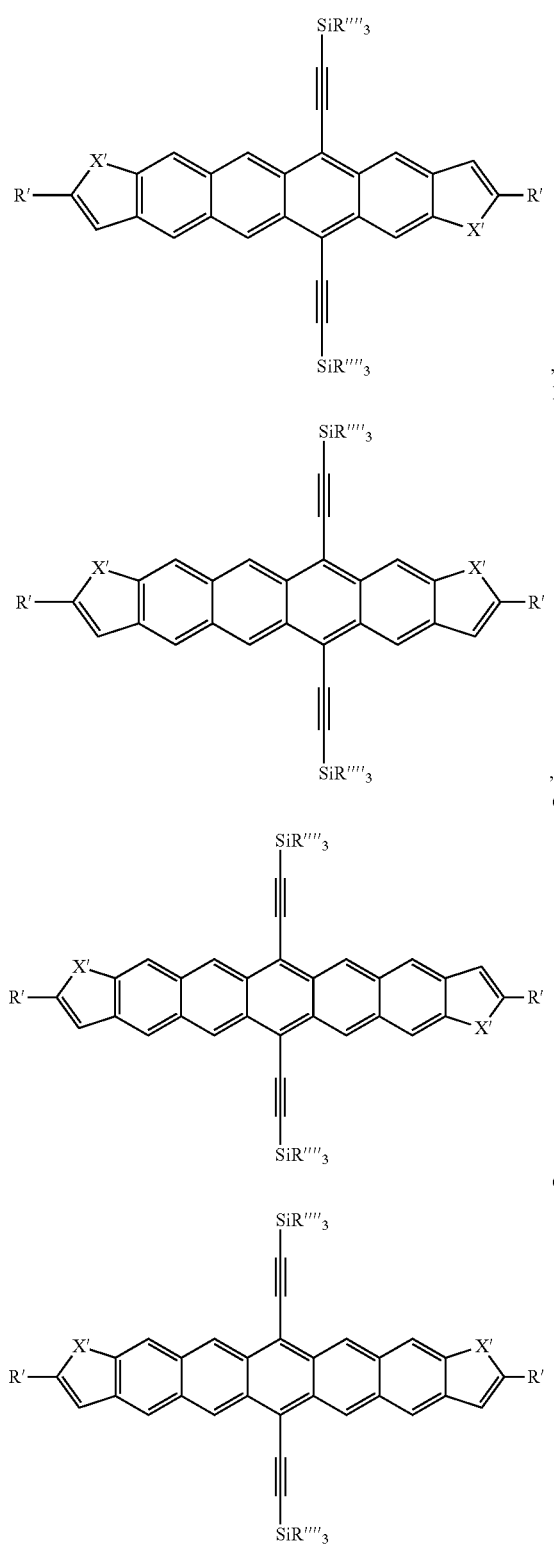

The polymer can contain a small molecule, or a mixture of two, or more small molecule compounds.

Accordingly, the present invention also relates to an organic semiconductor material, layer or component, comprising a polymer according to the present invention.

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic photovoltaic (PV) device (solar cell), a photodiode, or an organic field effect transistor.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radiofrequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like.

A further aspect of the present invention is an organic semiconductor material, layer or component comprising one or more polymers of the present invention. A further aspect is the use of the polymers or materials of the present invention in an organic photovoltaic (PV) device (solar cell), a photodiode, or an organic field effect transistor (OFET). A further aspect is an organic photovoltaic (PV) device (solar cell), a photodiode, or an organic field effect transistor (OFET) comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:
a source electrode,
a drain electrode,
a gate electrode,
a semiconducting layer,
one or more gate insulator layers, and
optionally a substrate, wherein the semiconductor layer comprises one or more polymers of the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the skilled in the art and are described in the literature, for example in WO03/052841.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont), or Fluoropel® (from Cytonix) or the perfluorosolvent FC 43® (Acros, No. 12377).

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

The polymers of the present invention are advantageously used in organic photovoltaic (PV) devices (solar cells). Accordingly, the invention provides PV devices comprising a polymer according to the present invention. A device of this construction will also have rectifying properties so may also be termed a photodiode. Photoresponsive devices have application as solar cells which generate electricity from light and as photodetectors which measure or detect light.

The structure of organic photovoltaic devices (solar cells) is, for example, described in C. Deibel et al. Rep. Prog. Phys. 73 (2010) 096401 and Christoph Brabec, Energy Environ. Sci 2. (2009) 347-303.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor. As stated above, the photoactive layer may also contain a polymeric binder. The amount of the polymers of the present invention to the polymeric binder can vary from 0.1 to 99.9, especially 1 to 99, very especially 5 to 95 percent by weight based on the amount of polymers of the present invention and polymeric binder. Preferably, the polymeric binder is a semicristalline polymer such as polystyrene (PS), high-density polyethylene (HDPE), polypropylene (PP) and polymethylmethacrylate (PMMA).

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3. The fullerenes useful in this invention may have a broad range of sizes (number of carbon atoms per molecule). The term fullerene as used herein includes various cage-like molecules of pure carbon, including Buckminsterfullerene ($C_{60}$) and the related "spherical" fullerenes as well as carbon nanotubes. Fullerenes may be selected from those known in the art ranging from, for example, $C_{20}$-$C_{1000}$. Preferably, the fullerene is selected from the range of $C_{60}$ to $C_{96}$. Most preferably the fullerene is $C_{60}$ or $C_{70}$, such as [60]PCBM, or [70]PCBM. It is also permissible to utilize chemically modified fullerenes, provided that the modified fullerene retains acceptor-type and electron mobility characteristics. The acceptor material can also be a material selected from the group consisting of any semi-conducting polymer, such as, for example, a polymer of the present invention, provided that the polymers retain acceptor-type and electron mobility characteristics, organic small molecules, carbon nanotubes, inorganic particles (quantum dots, quantum rods, quantum tripods, $TiO_2$, ZnO etc.).

The photoactive layer is made of a polymer of the present invention as an electron donor and a fullerene, particularly functionalized fullerene PCBM, as an electron acceptor. These two components are mixed with a solvent and applied as a solution onto the smoothing layer by, for example, the spin-coating method, the drop casting method, the Langmuir-Blodgett ("LB") method, the ink jet printing method and the dripping method. A squeegee or printing method could also be used to coat larger surfaces with such a photoactive layer. Instead of toluene, which is typical, a dispersion agent such as chlorobenzene is preferably used as a solvent. Among these methods, the vacuum deposition method, the spin-coating method, the ink jet printing method and the casting method are particularly preferred in view of ease of operation and cost.

In the case of forming the layer by using the spin-coating method, the casting method and ink jet printing method, the coating can be carried out using a solution and/or dispersion prepared by dissolving, or dispersing the composition in a concentration of from 0.01 to 90% by weight in an appropriate organic solvent such as benzene, toluene, xylene, tetrahydrofurane, nnethyltetrahydrofurane, N,N-dimethylformamide, acetone, acetonitrile, anisole, dichloromethane, dimethylsulfoxide, chlorobenzene, 1,2-dichlorobenzene and mixtures thereof.

The photovoltaic (PV) device can also consist of multiple junction solar cells that are processed on top of each other in order to absorb more of the solar spectrum. Such structures are, for example, described in App. Phys. Let. 90, 143512 (2007), Adv. Funct. Mater. 16, 1897-1903 (2006), WO2004/112161 and Christoph Brabec, Energy Environ. Sci 2. (2009) 347-303.

A so called 'tandem solar cell' comprise in this order:

(a) a cathode (electrode), (b) optionally a transition layer, such as an alkali halogenide, especially lithium fluoride, (c) a photoactive layer, (d) optionally a smoothing layer, (e) a middle electrode (such as Au, Al, ZnO, TiO$_2$ etc.)

(f) optionally an extra electrode to match the energy level, (g) optionally a transition layer, such as an alkali halogenide, especially lithium fluoride, (h) a photoactive layer, (i) optionally a smoothing layer, (j) an anode (electrode), (k) a substrate.

The PV device can also be processed on a fiber as described, for example, in US20070079867 and US 20060013549.

Due to their excellent self-organising properties the materials or films comprising the polymers of the present invention can also be used alone or together with other materials in or as alignment layers in LCD or OLED devices, as described for example in US2003/0021913.

The following examples are included for illustrative purposes only and do not limit the scope of the claims. Unless otherwise stated, all parts and percentages are by weight. Weight-average molecular weight (Mw) and polydispersity (Mw/Mn=PD) are determined by Heat Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 im (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 il; Detection: RI, Procedure of molecular weight calibration: Relative calibration is done by use of a set of 10 polystyrene calibration standards obtained from Polymer Laboratories (Church Stretton, UK) spanning the molecular weight range from 1,930,000 Da-5,050 Da, i. e., PS 1,930,000, PS 1,460,000, PS 1,075,000, PS 560,000, PS 330,000, PS 96,000, PS 52,000, PS 30,300, PS 10,100, PS 5,050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

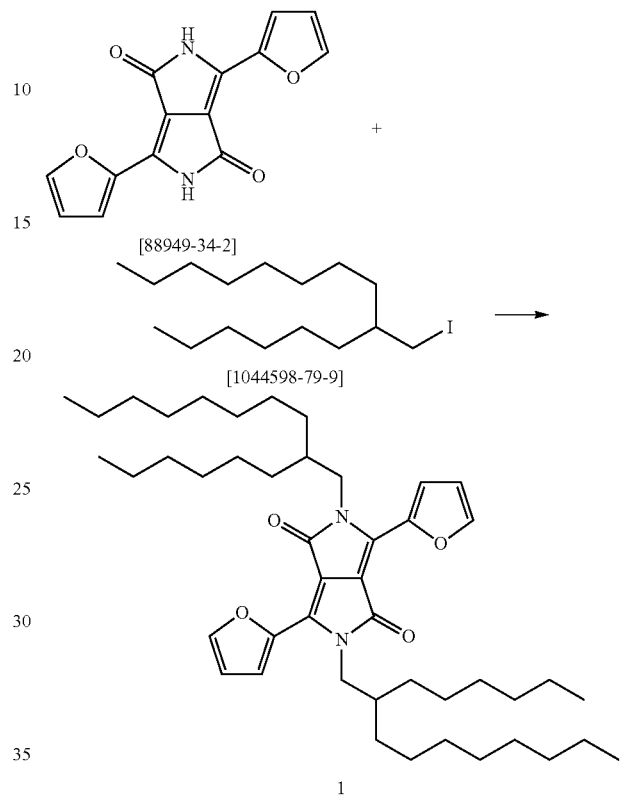

a) 20 g of [88949-34-2] and 25.76 g of potassium carbonate are suspended in 300 ml of dry dimethylformamide and the mixture is heated to 90° C. under nitrogen. Then 79 g of [1044598-79-9] are added drop wise. The reaction mixture is then stirred for 6 h at 90° C. After cooling to room temperature ethylacetate is added and the mixture is washed with water. The organic phase is dried over magnesium sulfate and the solvent is evaporated. The product is purified by column chromatography over silica to obtain a compound of formula 1. $^1$H-NMR data (ppm, CDCl$_3$): 8.33 2H d, 7.60 2H d, 6.68 2H d×d, 4.03 4H d, 1.85-1.75 2H m, 1.45-1.15 48H m, 0.88 6H t, 0.86 6H t;

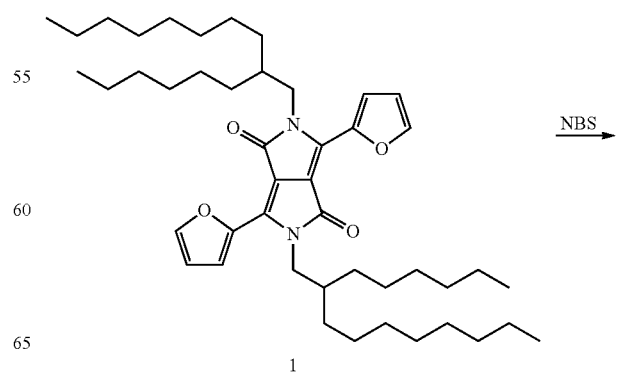

-continued

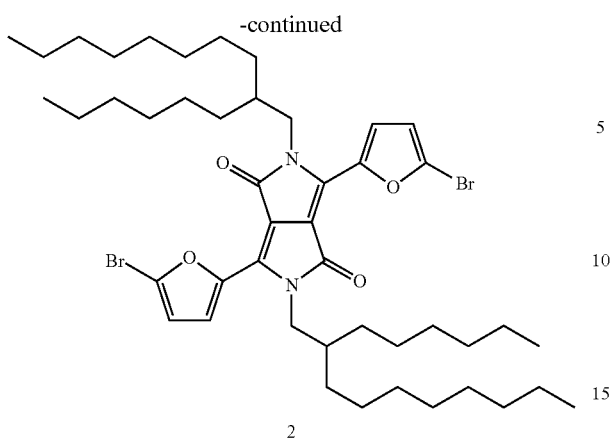

2 b) 6.44 g of compound 1 are dissolved in 100 ml of chloroform. The mixture is cooled to −10° C. and then 1.99 g of N-bromo-succinimid (NBS) are added and the mixture is stirred for 2 hours at −10° C. The reaction mixture is washed with water, dried with magnesium sulfate and the solvent is evaporated. The crude product is purified by column chromatography over silica to obtain a compound of formula 2. $^1$H-NMR data (ppm, benzene-$D_6$): 8.72 2H d, 6.05 2H d, 4.13 4H d, 2.06-2.02 2H m, 1.65-1.30 48H m, 1.01 6H t, 1.00 6H t;

2 + 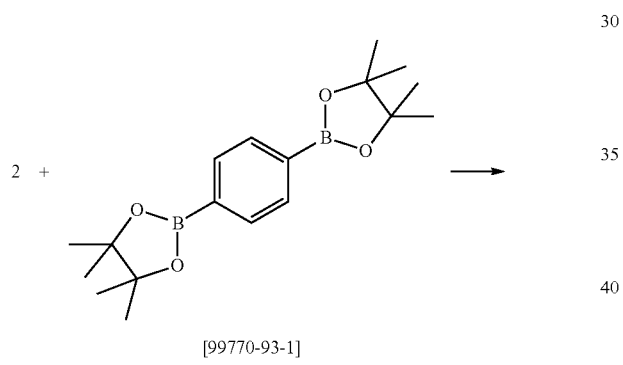

[99770-93-1]

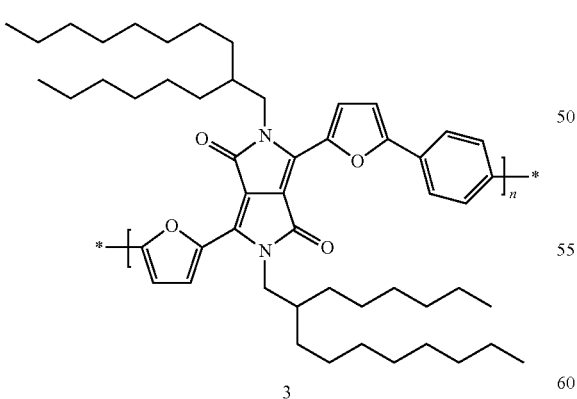

3 c) 0.5 g of compound 2, 0.188 g of 1,4-benzenediboronic acid bis(pinacol) ester [99770-93-1] and 51 mg of palladium acetate are added to a three necked reaction flask under an argon atmosphere. 15 ml of degassed THF is added to the reaction flask and the mixture is heated to dissolve the starting materials. After further degassing with Argon 27 mg of 2-(di-tert-butyl-phosphino)-1-phenyl-1H-pyrrole is added and the reaction mixture is heated to reflux. Then 146 mg of lithium hydroxide hydrate are added and the reaction mixture is stirred for 2 hours at reflux. The reaction mixture is then cooled to room temperature and the product is precipitated with methanol, filtered and washed with methanol. The polymer of formula 3 is obtained by Soxhlet extraction. The chloroform fraction contains a polymer with an Mw of 90'100 and a polydispersity of 2.69 (measured by high temperature GPC).

Example 2

2 + 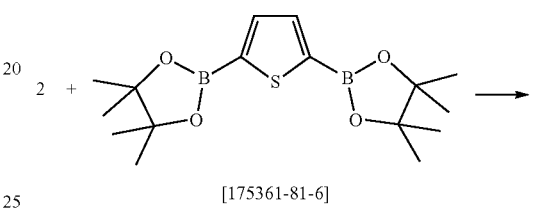

[175361-81-6]

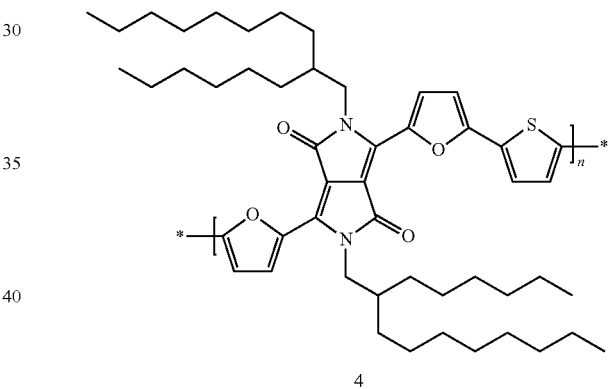

4

The polymer of formula 4 is synthesized in analogy to Example 1c) starting from compound 2 and thiophene-diboronicacid-pinacolester [175361-81-6]. The tetrahydrofurane fraction of the Soxhlet extraction contains a polymer of formula 4 with an Mw of 74'600 and a polydispersity of 2.26 (measured by high temperature GPC).

Example 3

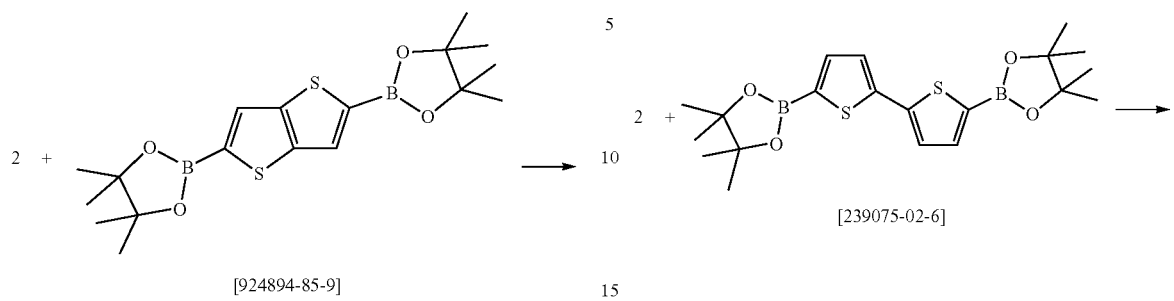

[924894-85-9]

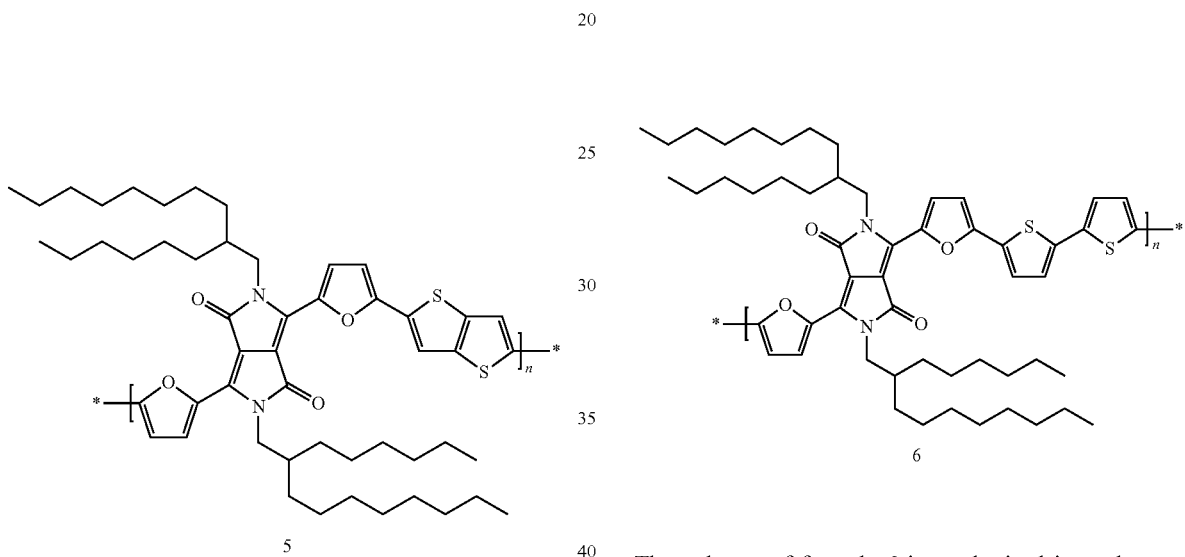

5

The polymer of formula 5 is synthesized in analogy to Example 1c) starting from compound 2 and thienothiophene-diboronicacid-pinacolester [924894-85-9]. The crude polymer of formula 5 has an Mw of 8'300 and a polydispersity of 2.06 (measured by high temperature GPC).

Example 4

6

The polymer of formula 6 is synthesized in analogy to Example 1c) starting from compound 2 and bi-thiophene-diboronicacid-pinacolester [239075-02-6]. The crude polymer of formula 6 has an Mw of 6'300 and a polydispersity of 1.44 (measured by high temperature GPC).

Example 5

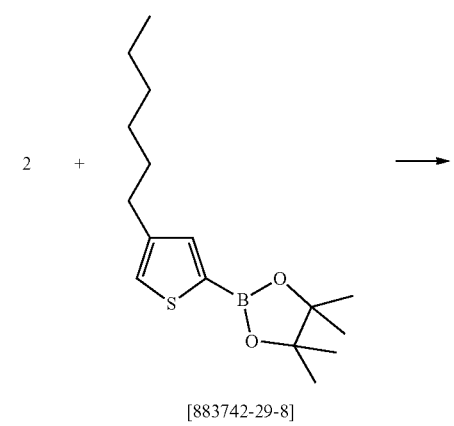

[883742-29-8]

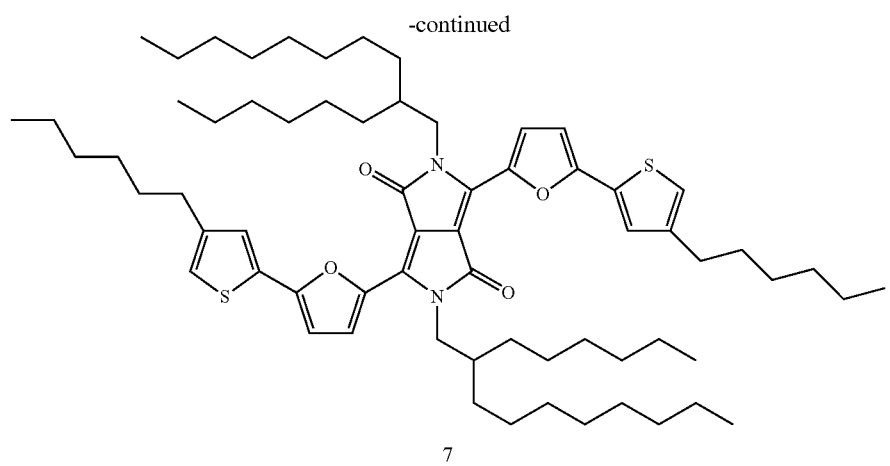

7 a) The dibromide of formula 2 and the boronic acid pinacol ester of formula [883742-29-8] are reacted in a Suzuki-coupling reaction according to compound [1220883-00-0] to give a compound of formula 7. $^1$H-NMR data (ppm, CDCl$_3$): 8.44 2H bs, 7.23 2H bs, 6.94 2H bs, 6.75 2H d, 4.14 4H d, 2.62 4H t, 1.92 2H m, 1.71-1.60 4H m, 1.45-1.15 60H m, 0.92 6H t, 0.85 6H t, 0.82 6H t;

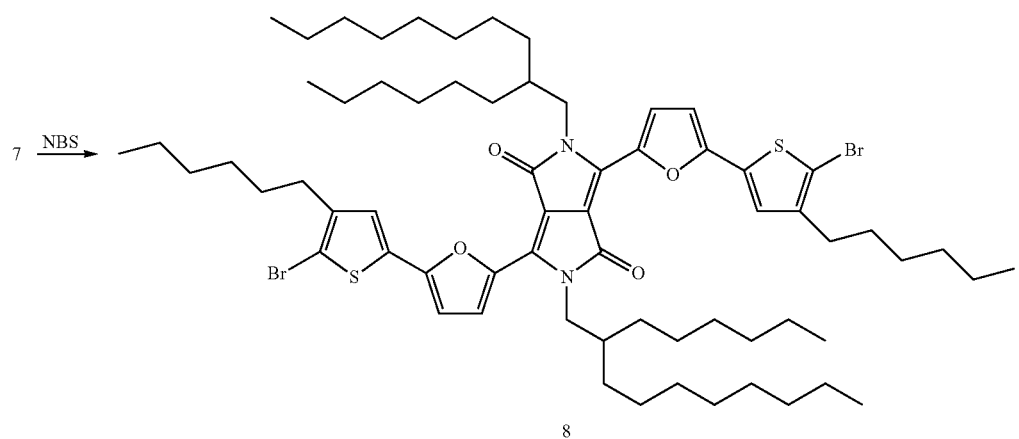 [SMILES: "NBS" ; CCCCCCCCC(CCCCCC)CN1C(=O)C2=C(c3ccc(-c4cc(CCCCCC)c(Br)s4)o3)N(CC(CCCCCC)CCCCCCCC)C(=O)C2=C1c1ccc(-c2cc(CCCCCC)c(Br)s2)o1]

8 b) The compound of formula 7 is brominated according to compound [1220883-03-3] with N-bromosuccinimide (NBS) to give a compound of formula 8. $^1$H-NMR data (ppm, CDCl$_3$): 8.45 2H bs, 7.08 2H bs, 6.73 2H d, 4.09 4H d, 2.57 4H t, 1.93 2H m, 1.70-1.55 4H m, 1.48-1.15 60H m, 0.90 6H t, 0.84 6H t, 0.83 6H t;

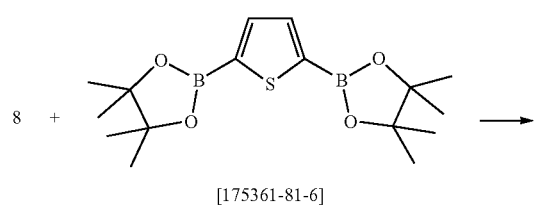

8 + [175361-81-6] →

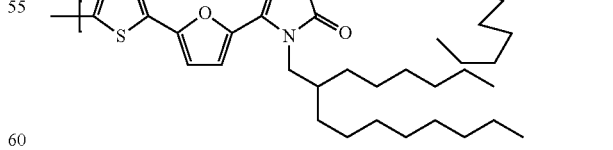

9 c) The polymer of formula 9 is synthesized in analogy to Example 1c) starting from compound 8 and thiophene-diboronicacid-pinacolester [175361-81-6]. The tetrahydro-furane fraction of the Soxhlet extraction contains a polymer of formula 9 with an Mw of 36'200 and a polydispersity of 1.86 (measured by high temperature GPC).

Example 6

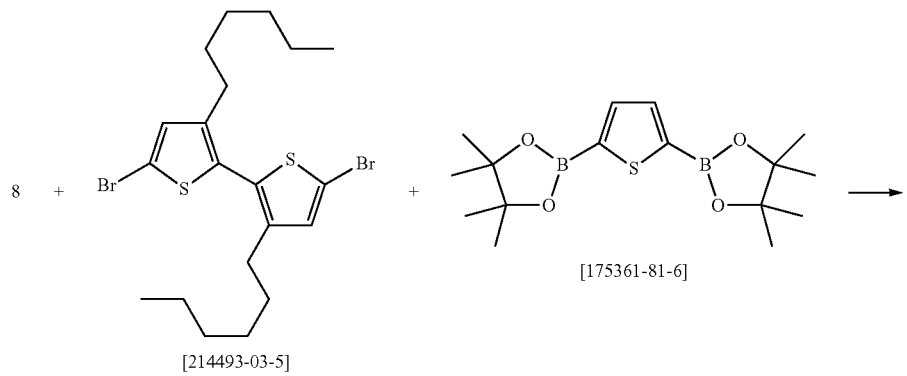

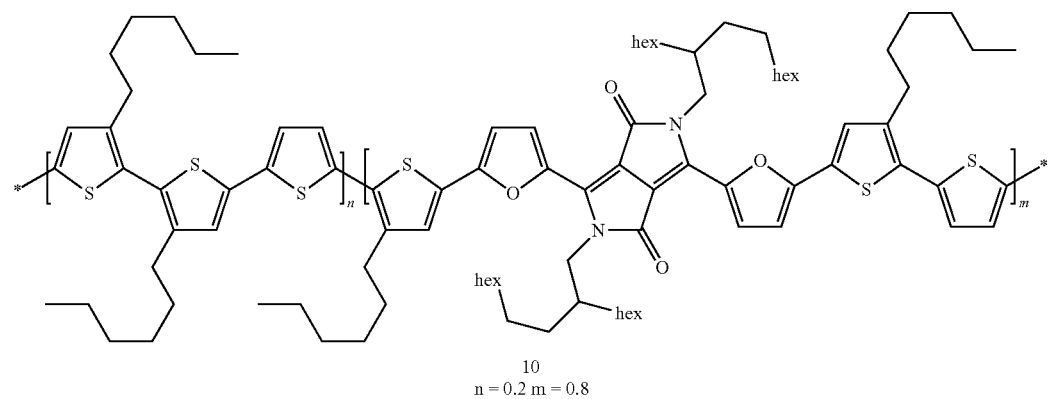

10
n = 0.2 m = 0.8

The polymer of formula 10 is synthesized in analogy to Example 1c) starting from 0.8 equivalents of compound 8, 0.2 equivalents of compound [214493-03-5] and 1 equivalent of thiophene-diboronicacid-pinacolester [175381-81-8]. The crude polymer of formula 10 has an Mw of 11,500 and a polydispersity of 1.90 (measured by high temperature GPC).

Example 7

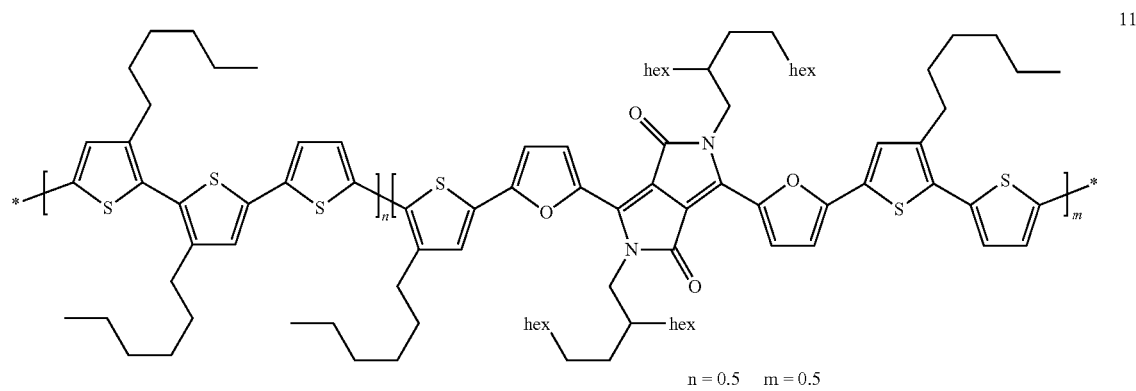

n = 0.5 m = 0.5

The polymer of formula 11 is synthesized in analogy to Example 1c) starting from 0.5 equivalents of compound 8, 0.5 equivalents of compound [214493-03-5] and 1 equivalent of thiophene-diboronicacid-pinacolester [175361-81-6]. The crude polymer of formula 11 has an Mw of 9,900 and a polydispersity of 1.61 (measured by high temperature GPC).

Example 8

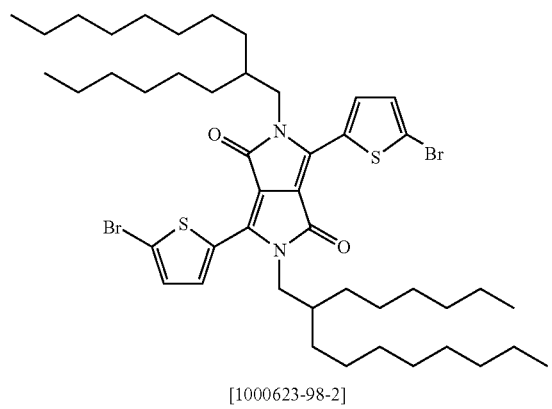

[1000623-98-2]

+

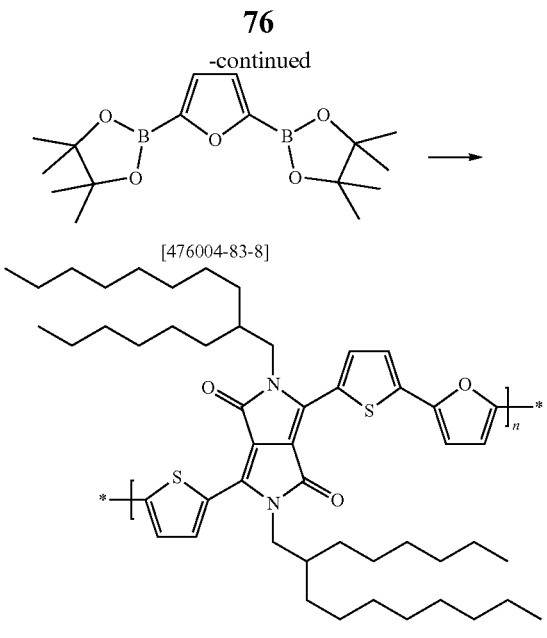

[476004-83-8]

12

The polymer of formula 12 is synthesized in analogy to Example 1c) starting from compound [1000623-98-2] and furane-diboronicacid-pinacolester [476004-83-8]. The tetrahydrofurane fraction of the Soxhlet extraction contains a polymer of formula 12 with an Mw of 60,500 and a polydispersity of 2.28 (measured by high temperature GPC).

Example 9

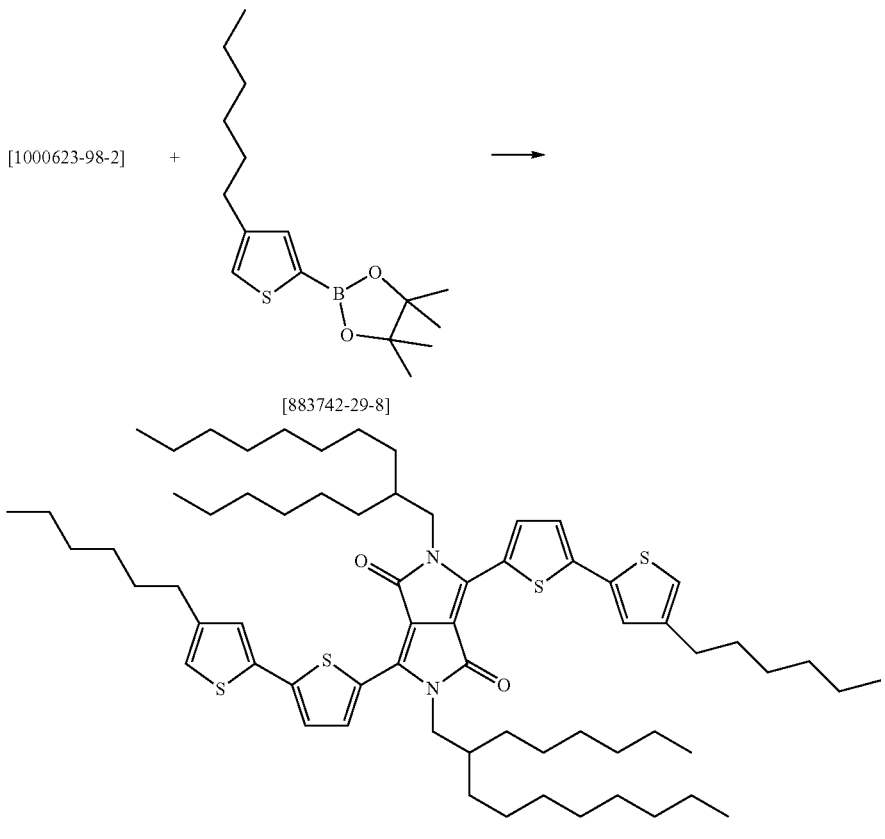

[1000623-98-2]  +  [883742-29-8]

13 a) The dibromide of formula [1000623-98-2] and the boronic acid pinacol ester of formula [883742-29-8] are reacted in a Suzuki-coupling reaction according to compound [1220883-00-0] to give a compound of formula 13.
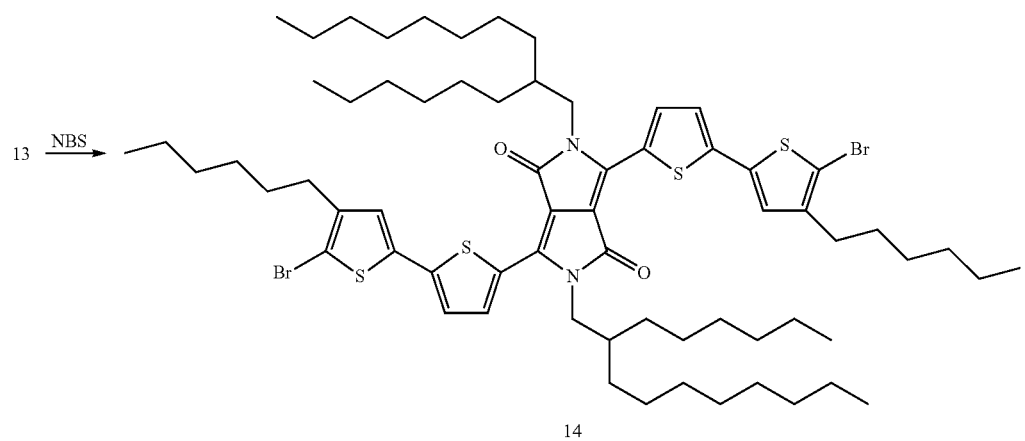 [SMILES: "NBS" ; CCCCCCCCC(CCCCCC)CN1C(=O)C2=C(c3ccc(-c4cc(CCCCCC)c(Br)s4)s3)N(CC(CCCCCC)CCCCCCCC)C(=O)C2=C1c1ccc(-c2cc(CCCCCC)c(Br)s2)s1]
b) The compound of formula 13 is brominated according to compound [1220883-03-3] with N-bromosuccinimide (NBS) to give a compound of formula 14.
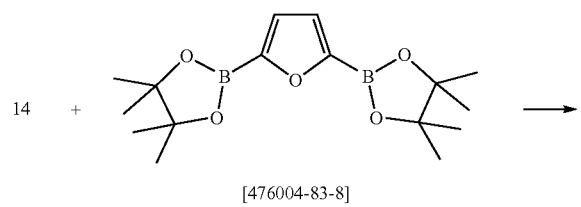
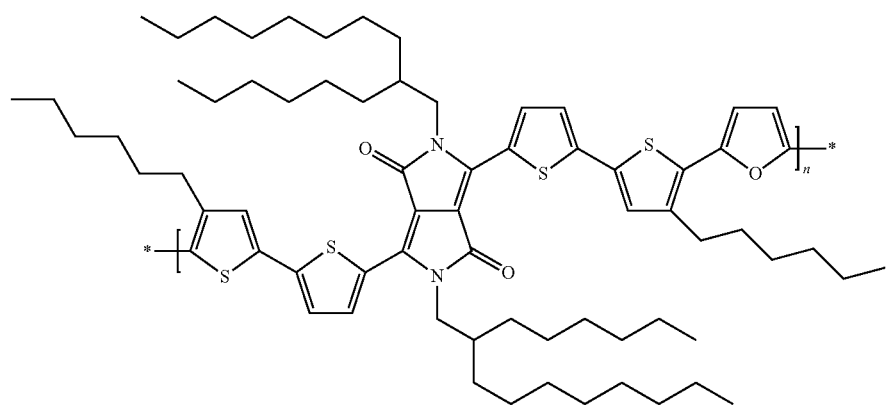

c) The polymer of formula 15 is synthesized in analogy to Example 1c) starting from compound 14 and furane-diboronicacid-pinacolester [476004-83-8]. The tetrahydrofurane fraction of the Soxhlet extraction contains a polymer of formula 15 with an Mw of 40'200 and a polydispersity of 2.10 (measured by high temperature GPC).

Example 10

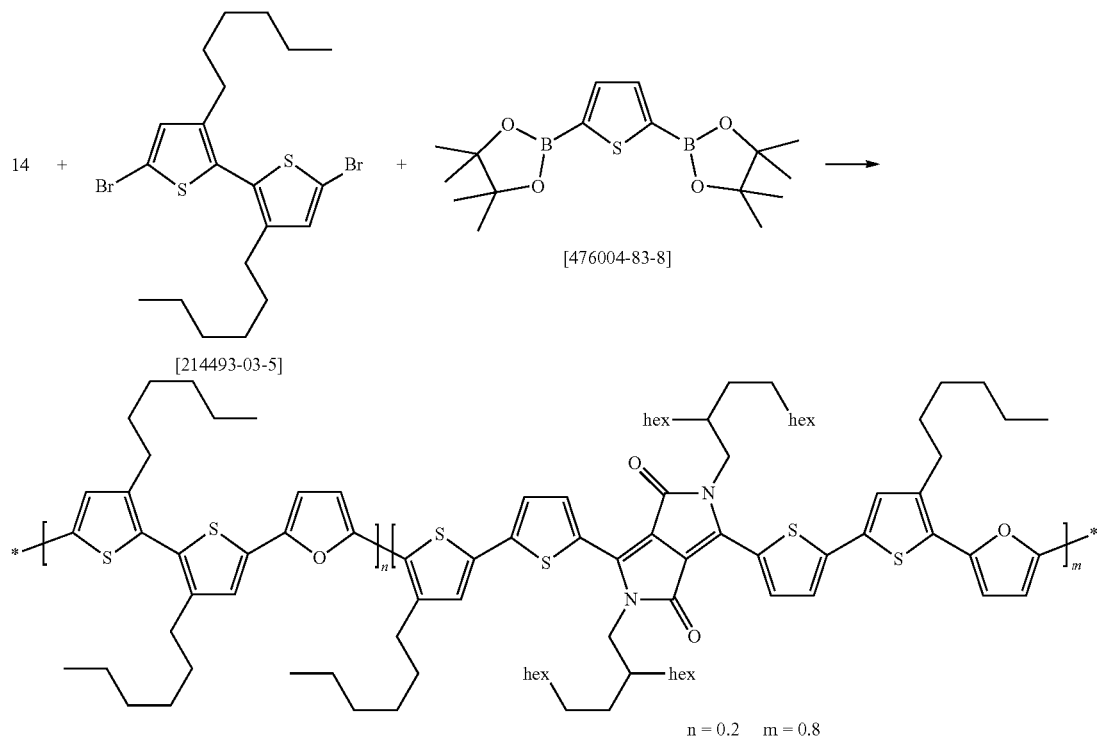

16

The polymer of formula 16 is synthesized in analogy to Example 1c) starting from 0.8 equivalents of compound 14, 0.2 equivalents of compound [214493-03-5] and 1 equivalent of furane-diboronicacid-pinacolester [476004-83-8]. The tetrahydrofurane fraction of the Soxhlet extraction contains a polymer of formula 16 with an Mw of 27,100 and a polydispersity of 1.99 (measured by high temperature GPC).

Example 11

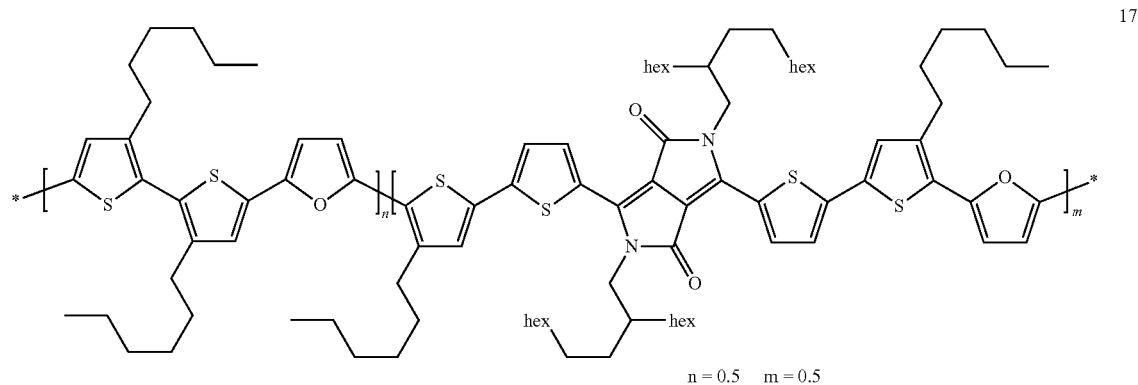

17

The polymer of formula 17 is synthesized in analogy to Example 1c) starting from 0.5 equivalents of compound 14, 0.5 equivalents of compound [214493-03-5] and 1 equivalent of furane-diboronicacid-pinacolester [476004-83-8]. The tetrahydrofurane fraction of the Soxhlet extraction contains a polymer of formula 17 with an Mw of 22,600 and a polydispersity of 2.00 (measured by high temperature GPC).

Example 12

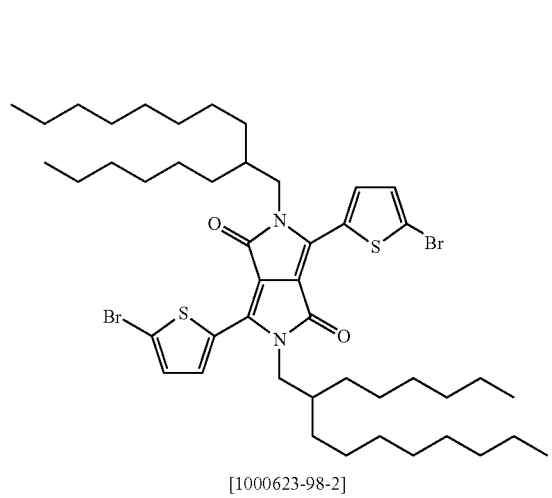

[1000623-98-2]

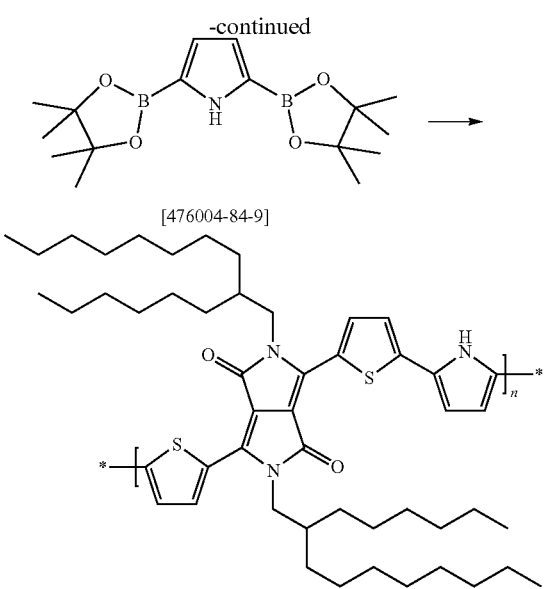

The polymer of formula 18 is synthesized in analogy to Example 1c) starting from compound [1000623-98-2] and pyrrole-diboronicacid-pinacolester [476004-84-9]. The crude polymer of formula 18 has an Mw of 8,500 and a polydispersity of 2.43 (measured by high temperature GPC).

Example 13

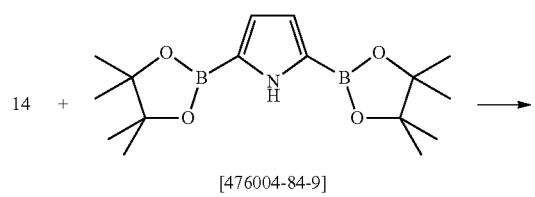

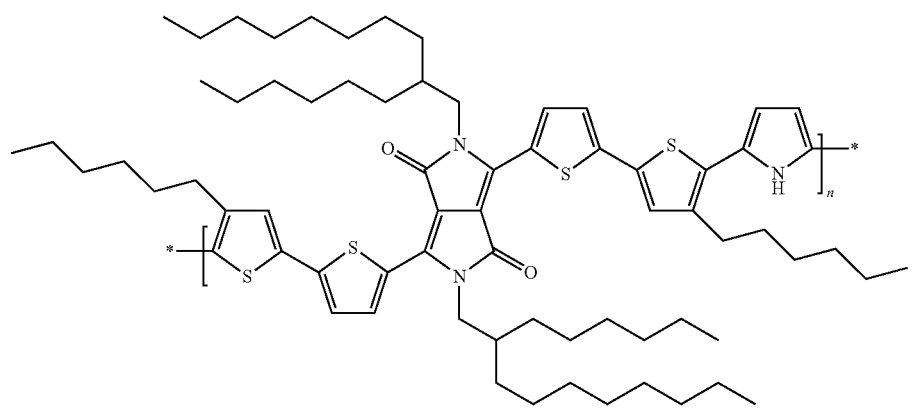

The polymer of formula 19 is synthesized in analogy to Example 1c) starting from compound 14 and pyrrole-diboronicacid-pinacolester [476004-84-9]. The crude polymer of formula 19 has an Mw of 5,000 and a polydispersity of 2.15 (measured by high temperature GPC).

Example 14

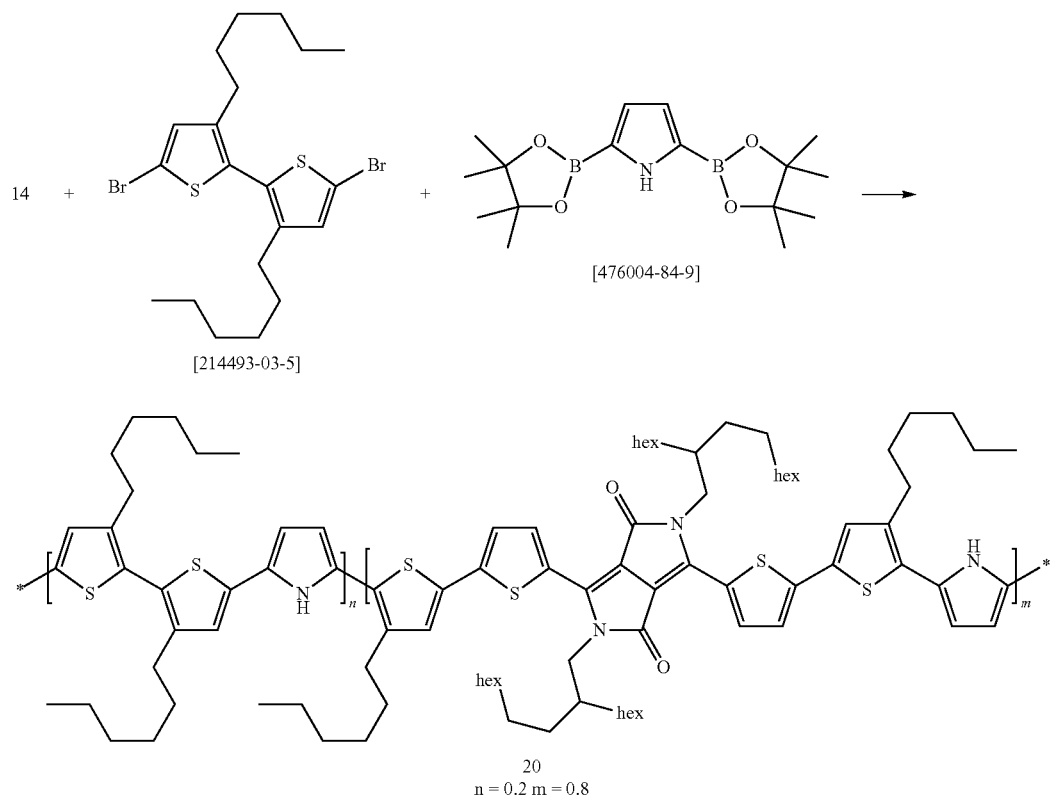

The polymer of formula 20 is synthesized in analogy to Example 1c) starting from 0.8 equivalents of compound 14, 0.2 equivalents of compound [214493-03-5] and 1 equivalent of pyrrole-diboronicacid-pinacolester [476004-84-9]. The crude polymer of formula 20 has an Mw of 5,500 and a polydispersity of 1.87 (measured by high temperature GPC).

Example 15

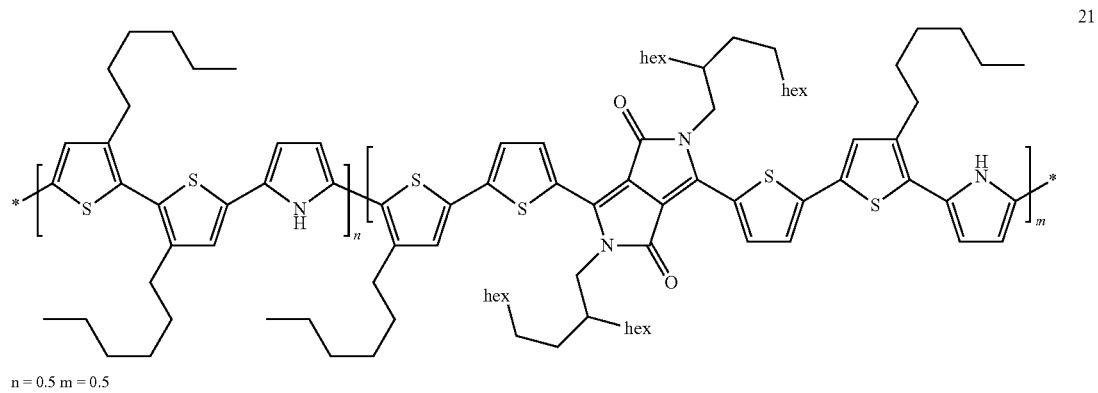

The polymer of formula 21 is synthesized in analogy to Example 1c) starting from 0.5 equivalents of compound 14, 0.5 equivalents of compound [214493-03-5] and 1 equivalent of pyrrole-diboronicacid-pinacolester [476004-84-9]. The crude polymer of formula 21 has an Mw of 3,200 and a polydispersity of 1.77 (measured by high temperature GPC).

Application Example 1

Photovoltaic Application of the Semiconducting Polymer 3

Polymer Based Bulk Heterojunction Solar Cell

The solar cell has the following structure: Al electrode/LiF layer/organic layer, comprising a polymer 3 and [70]PCBM/[poly(3,4-ethylenedioxy-thiophene) (PEDOT) in admixture with poly(styrenesulfonic acid) (PSS)]/ITO electrode/glass substrate. The solar cells are made by spin coating a layer of the PEDOT-PSS on a pre-patterned ITO on glass substrate. Then a 1:1.5 mixture of the polymer 3 (1% by weight):[70]PCBM (a substituted $C_{70}$ fullerene) is spin coated from oDCB(organic layer). LiF and Al are sublimed under high vacuum through a shadow-mask.

Solar Cell Performance

The solar cell is measured under a solar light simulator. Then with the External Quantum Efficiency (EQE) graph the current is estimated under AM1.5 conditions. This leads to a value of $J_{sc}$=8.5 mA/cm$^2$, FF=0.58 and $V_{oc}$=0.82 V for an estimated overall efficiency of 4.04%.

Example 16

2 +

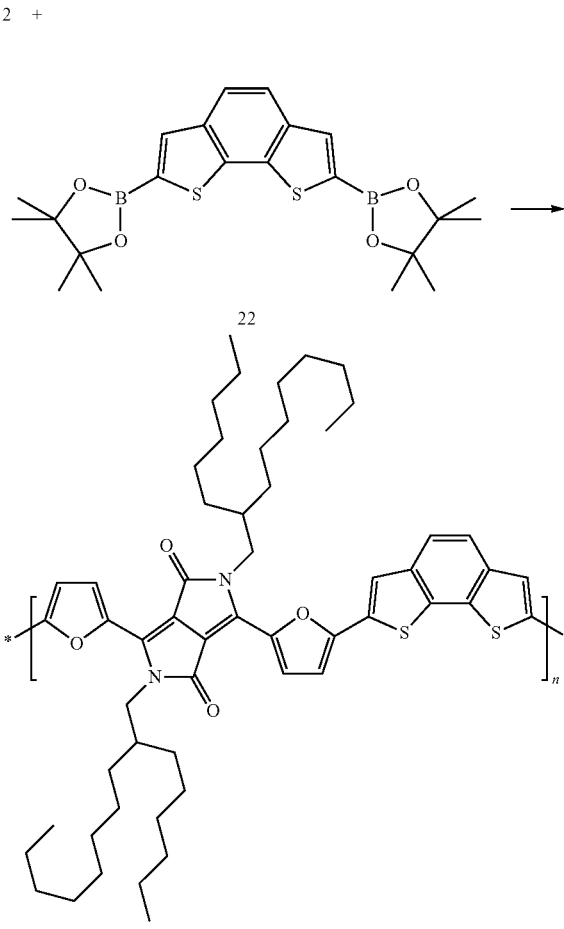

The polymer of formula 23 is synthesized in analogy to Example 1c) starting from 0.96 g of compound 2, 508.6 g of compound 22. The polymer is purified by Soxhlet extraction using different solvents: tetrahydrofurane, chloroform and ortho-dichlorobenzene. 720 mg of the ortho-dichlorobenzene fraction contains a polymer of formula 16 with an Mw of 100,000 and a polydispersity of 2.59 (measured by high temperature GPC).

Application Example 2

Polymer 23 Based Organic Field Effect Transistor

Bottom-gate thin film transistor (TFT) structures with p-Si gate (10 cm) are used for all experiments. A high-quality thermal $SiO_2$ layer of 300 nm thickness served as gate-insulator of $C_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 m are used. Prior to deposition of the organic semiconductor the $SiO_2$ surface is derivatized either with hexadimethylsilazane (HMDS) by exposing to a saturated silane vapour at 160° C. for 2 hours, by spin coating the HMDS at a spinning speed of 800 rpm (rounds per minute) for about a minute or by treating the substrate at 60° C. with a 0.1 m solution of octadecyltrichlorosilane (OTS) in toluene for 20 minutes. After rinsing with iso-propanol the substrates are dried.

The semiconductor thin film is prepared either by spin-coating or drop casting the DPP derivative of the formula 23 obtained in example 16 in a 0.5% (w/w) solution in ortho-dichlorobenzene. The spin coating is accomplished at a spinning speed of 1000 rpm (rounds per minute) for about 60 seconds in ambient conditions. The devices are evaluated as-deposited and after drying at 100° C. for 15 minutes.

Transistor Performance in Ortho-Dichlorobenzene

The transistor behaviour is measured on an automated transistor prober (TP-10).

From a linear fit to the square root of the saturated transfer characteristics a field effect mobility of $1.1 \times 10^{-2}$ cm$^2$/Vs with an on/off current ratio of $2.7 \times 10^5$ can be determined after drying. The threshold voltage is at 2.3 V.

Application Example 3

Polymer 23 Based Organic Bulk Heterojunction Solar Cell

The solar cell has the following structure: Al electrode/LiF layer/organic layer, including compound of the invention/[poly(3,4-ethylenedioxy-thiophene) (PEDOT): poly (styrenesulfonic acid) (PSS)]/ITO electrode/glass substrate. The solar cells are made by spin coating a layer of the PEDOT:PSS on a pre-patterned ITO on glass substrate. Then a 1:2 mixture of the compound of formula 23 (0.8% by weight):[60]PCBM or [70]PCBM (a substituted $C_{60}$ or $C_{70}$ fullerene) is spin coated (organic layer). LiF and Al are sublimed under high vacuum through a shadow-mask.

Solar Cell Performance

The solar cell is measured under a solar light simulator. Then with the External Quantum Efficiency (EQE) graph the current is estimated under AM1.5 conditions. This leads to a value of $J_{sc}$=14.35 mA/cm$^2$, FF=0.61 and $V_{oc}$=0.72 V for an estimated overall efficiency of 6.3%.

Example 17

Synthesis of Polymer 26

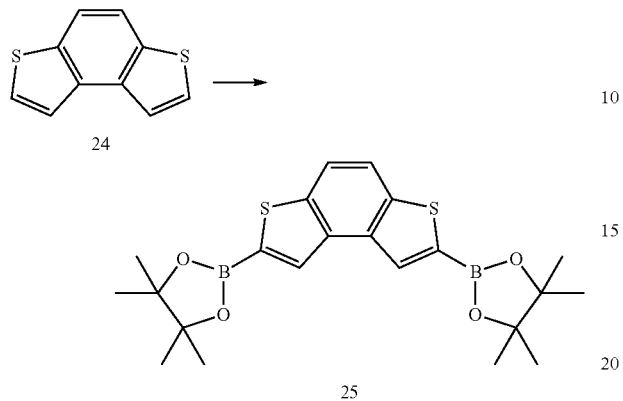

a) To a cooled (−78° C.) solution of 1.05 g 24 in 20 ml of dry THF is added 4.5 ml butyl lithium (2.5 M in hexane). The resulting solution is stirred for 15 minutes at 0° C. and cooled to 78° C. 5.2 g 2-isopropoxy-4,4,5,5-tetramethyl-1,3,2-dioxoborolane are added dropwise, kept 5 minutes at −78° C., then the solution is slowly warmed to room temperature and stirring is continued for 30 minutes. The reaction is quenched by adding 50 ml HCl (10%) and the product is extracted twice with 40 ml ethyl acetate. The combined organic extracts are dried and evaporated to give crude 25, which is purified by crystallisations from diisopropylether: toluene 9:1, affords 1.77 g of the title compound as white powder.

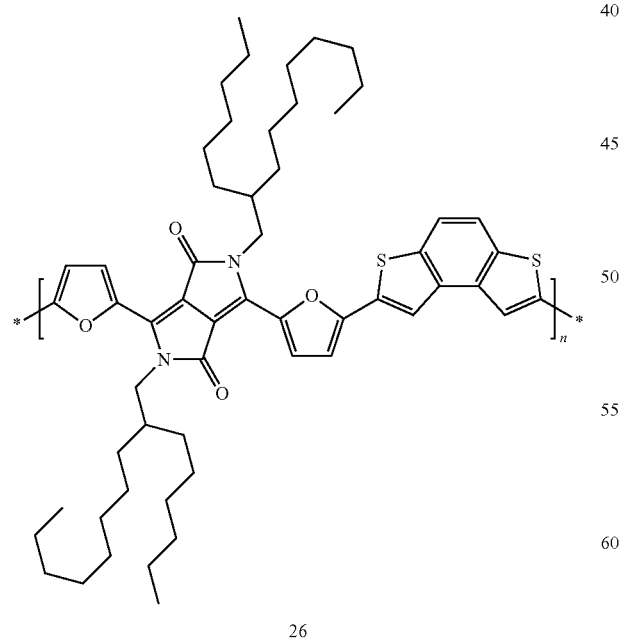

b) Under Argon 0.96 g of 2, 0.5 g of compound 25, 15 mg of Pd(acetate)$_2$, 76 mg of 2-(di-tert-butyl-phosphino)-1-phenyl-pyrrole are mixed with 60 ml of tetrahydrofuran and warmed to 40° C. Then a solution of 0.29 g lithium hydroxide is added to the reaction mixture. The reaction mixture is then brought to reflux for 4 hours and cooled to room temperature. The green-blue mixture is precipitated with methanol and filtered. The filtrate is dissolved in chloroform and refluxed with a 1% NaCN water solution for 3 hours. The organic phase is washed with water and then dried and evaporated. The polymer is precipitated with methanol and the precipitate is fractionated in a Soxhlet with THF, chloroform and dichlorobenzene. The dichlorobenzene fraction contained 610 mg of the desired polymer 26. Mw=31,500, Polydispersity=1.65 (measured by HT-GPC).

Application Example 4

Polymer 26 Based Organic Bulk Heterojunction Solar Cell

The solar cell has the following structure: Al electrode/LiF layer/organic layer, including compound of the invention/[poly(3,4-ethylenedioxy-thiophene) (PEDOT): poly(styrenesulfonic acid) (PSS)]/ITO electrode/glass substrate. The solar cells are made by spin coating a layer of the PEDOT:PSS on a pre-patterned ITO on glass substrate. Then a 1:1.5 mixture of the compound of formula 26 (1% by weight):[60]PCBM or [70]PCBM (a substituted $C_{60}$ or $C_{70}$ fullerene) is spin coated (organic layer). LiF and Al are sublimed under high vacuum through a shadow-mask.

Solar Cell Performance

The solar cell characteristics are measured under AM1.5G conditions, Irradiation (100 mW/cm$^2$) using a Xenon lamp based solar simulator and a device area of 0.09 cm$^2$. Under these conditions, efficiency of 5.07% were measured (with Jsc=10.90 mA/cm$^2$, FF=0.57 and Voc=0.82V).

Example 18

Synthesis of Polymer 29

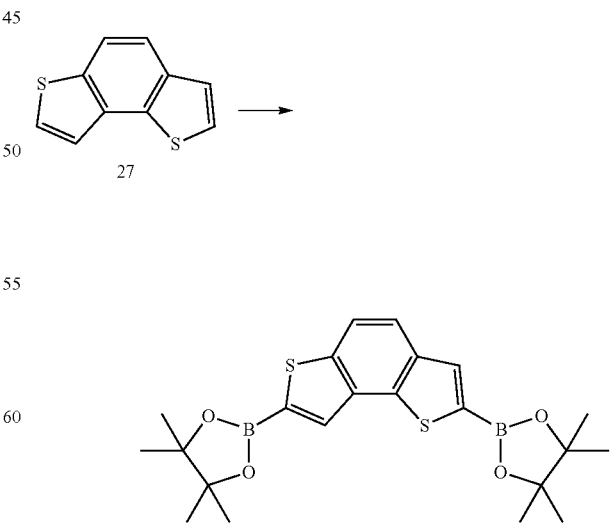

a) Compound 28 is synthesised in analogy to example 17a).

2 + 28 ⟶

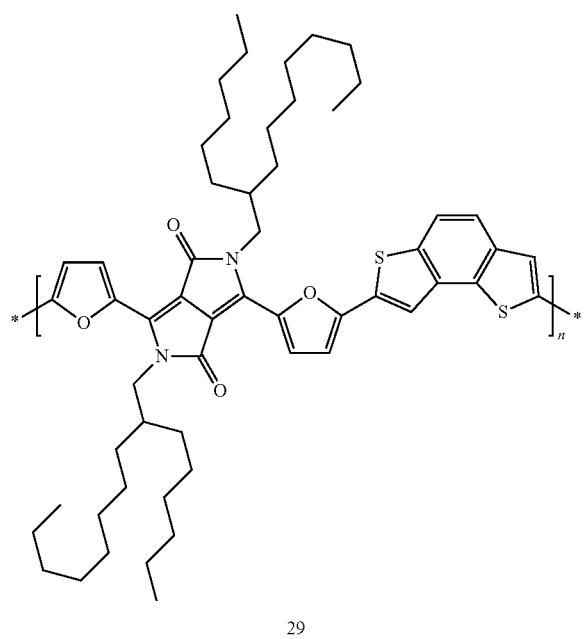

29 b) Polymer 29 is synthesised in analogy to example 17b).

Example 19

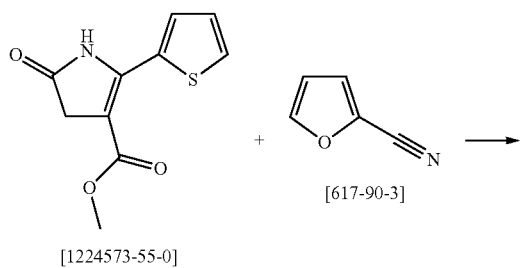

[1224573-55-0] + [617-90-3] ⟶

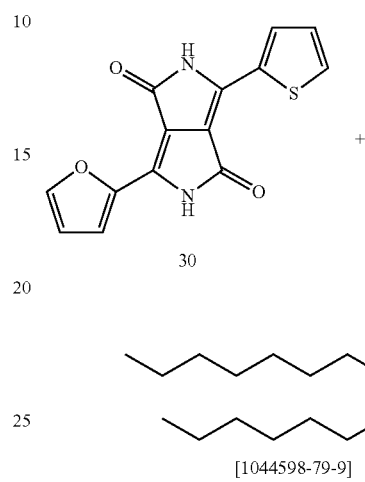

30 a) 5.77 g of sodium and 12 mg of FeCl₃ are added to 200 ml of t-amyl alcohol. The mixture is then heated to 90° C. until all sodium metal has reacted. Then 8.34 g of 2-furonitrile [617-90-3] are added portion wise and then 20 g of [1224573-55-0] are added portion wise. The color of the reaction mixture turns red. The reaction mixture is stirred at 90° C. over night. The reaction mixture is poured on ice water and the precipitate is filtered. The filter cake is washed with water, acetone and methanol and water and is then dried to give a compound of formula 30. ¹H-NMR data (ppm, DMSO-d₆): 8.21 1H d, 8.06 1H d, 7.96 1H d×d, 7.67 1H d, 7.30 1H d×d, 6.84 1H d.

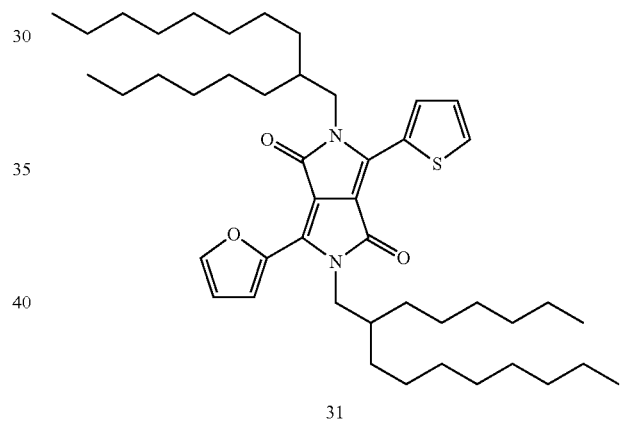

b) The compound of formula 30 is alkylated in analogy to Example 1a) with 2-hexyl-decyl-iodide [1044598-79-9] to give a compound of formula 31. Compound 31 is used directly for the next step without further purification.

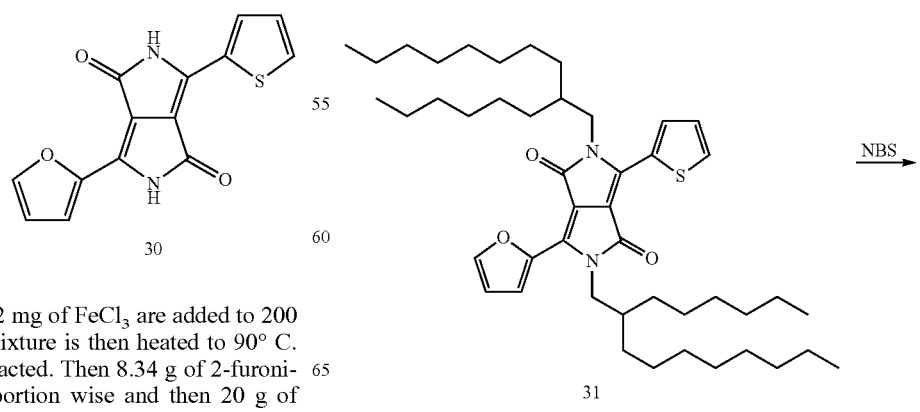

31

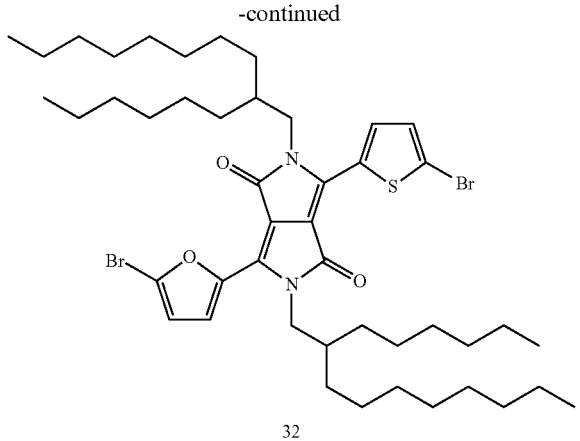

32 c) The compound of formula 31 is brominated in analogy to Example 1 b) with N-bromosuccinimide (NBS) to give a compound of formula 32. $^1$H-NMR data (ppm, CDCl$_3$): 8.54 1H d, 8.26 1H d, 7.14 1H d, 6.55 1H d, 3.92 2H d, 3.85 2H d, 1.80 1H m, 1.72 1H m, 1.35-1.05 48H m, 0.77 6H t, 0.76 6H t.

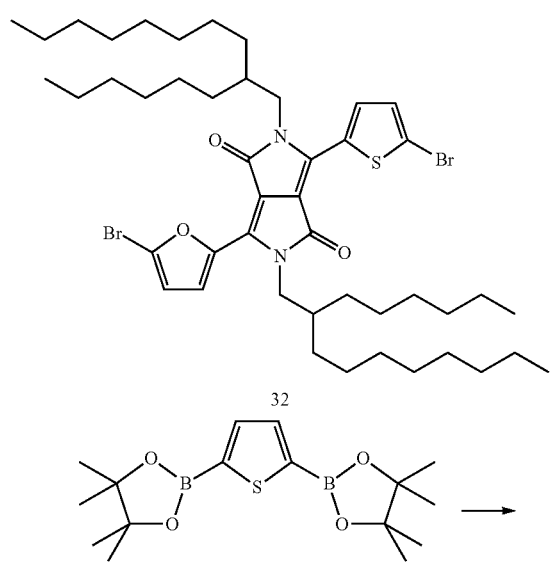

32

+

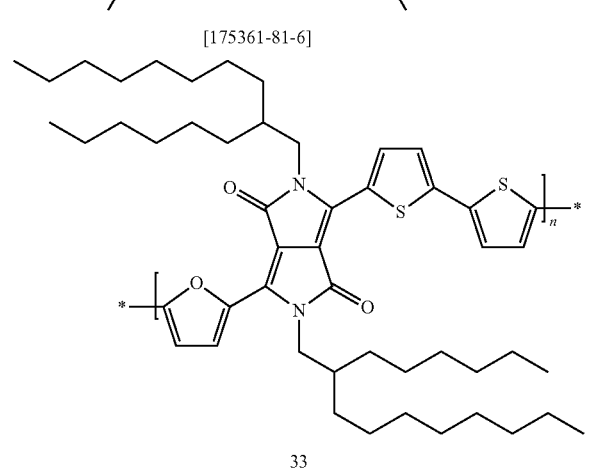

[175361-81-6]

33 d) The dibromide of formula 32 and the thiophene-di-boronic-acid-pinacol-ester [175361-81-6] are reacted in a Suzuki-coupling reaction in analogy to Example 1c) to give a compound of formula 33.

Example 20

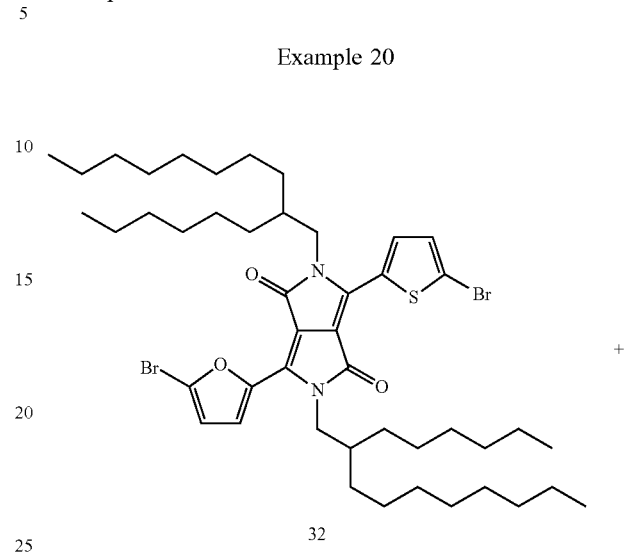

32

+

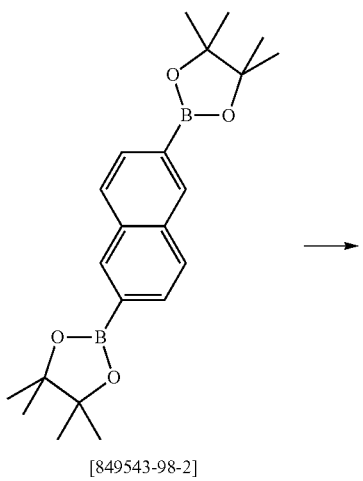

[849543-98-2]

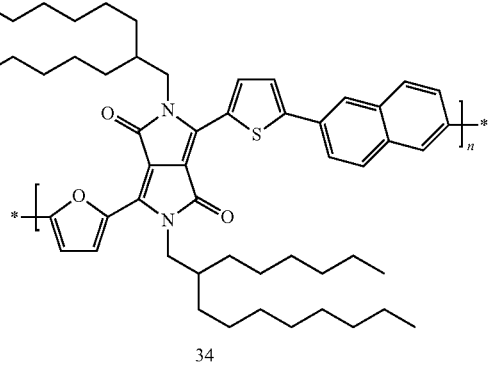

34

The dibromide of formula 32 and the naphthalene-di-boronic-acid-pinacol-ester [849543-98-2] are reacted in a Suzuki-coupling reaction in analogy to Example 1c) to give a compound of formula 34.

Example 21

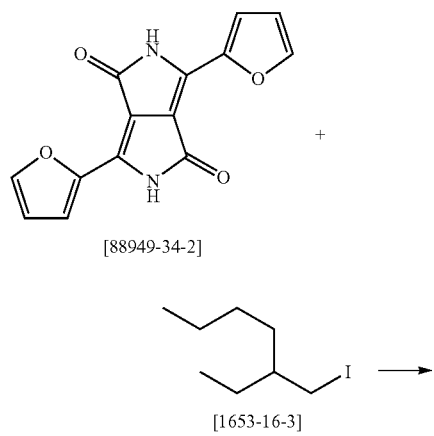

[88949-34-2]

[1653-16-3]

35

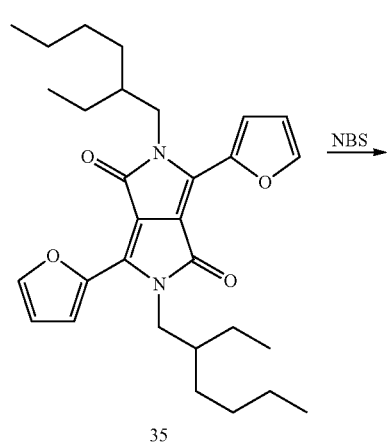

a) The di-furyl-di-keto-pyrrolo-pyrrole [88949-34-2] is alkylated in analogy to Example 1a) with 2-ethyl-hexyl-iodide[1653-16-3] to give a compound of formula 35. $^1$H-NMR data (ppm, CDCl$_3$): 8.33 2H d×d, 7.61 2H d, 6.69 2H d×d, 4.05 4H d, 1.75 2H m, 1.45-1.25 16H m, 0.90 6H t, 0.87 6H t.

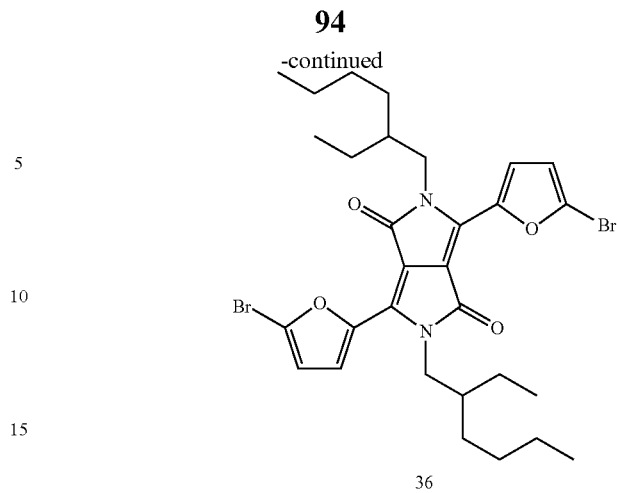

36 b) The compound of formula 35 is brominated in analogy to Example 1b) with N-bromosuccinimide (NBS) to give a compound of formula 36. $^1$H-NMR data (ppm, CDCl$_3$): 8.30 2H d, 6.62 2H d, 3.99 4H d, 1.74 2H m, 1.45-1.25 16H m, 0.92 6H t, 0.88 6H t.

Example 22

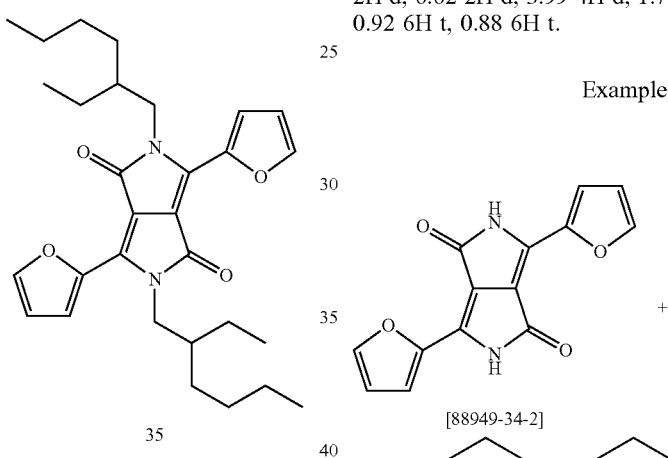

37 a) The di-furyl-di-keto-pyrrolo-pyrrole [88949-34-2] is alkylated in analogy to Example 1a) with 1-dodecyl-iodide [4292-19-7] to give a compound of formula 37. $^1$H-NMR data (ppm, CDCl$_3$): 8.30 2H d×d, 7.63 2H d, 6.69 2H d×d, 4.11 4H t, 1.69 4H m, 1.45-1.20 36H m, 0.88 6H t.

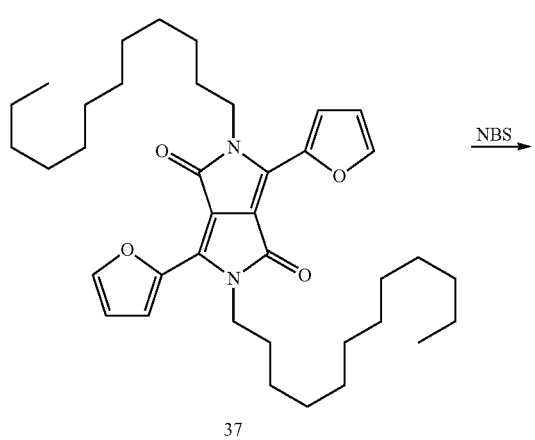

37

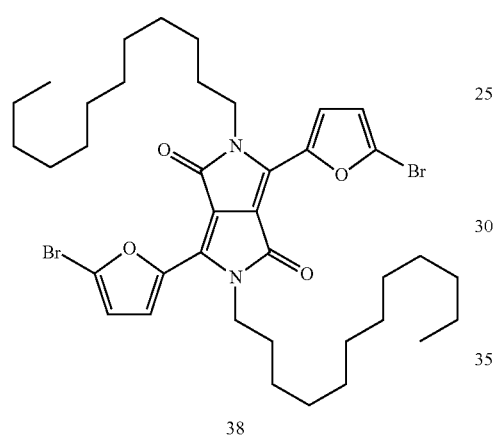

38 b) The compound of formula 37 is brominated in analogy to Example 1b) with N-bromosuccinimide (NBS) to give a compound of formula 38. ¹H-NMR data (ppm, CDCl₃): 8.25 2H d, 6.63 2H d, 4.05 4H t, 1.67 4H m, 1.45-1.25 36H m, 0.88 6H t.

Example 23

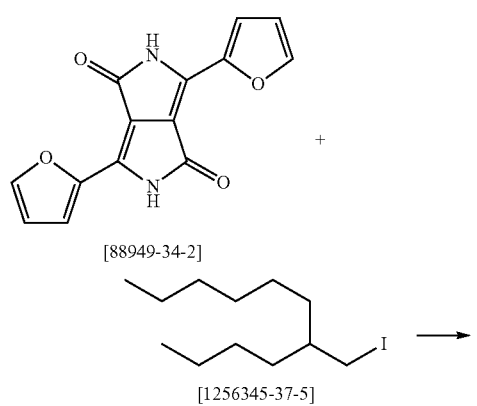

[88949-34-2]

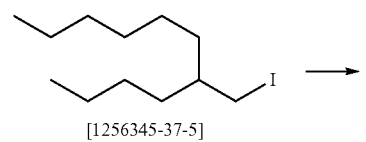

[1256345-37-5]

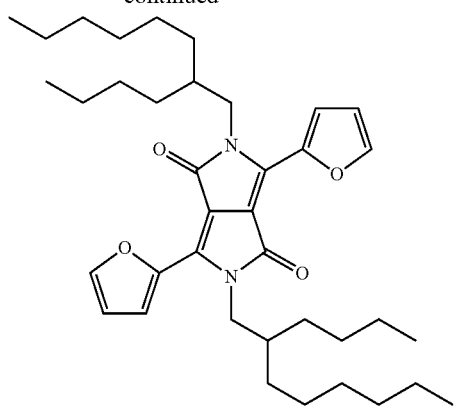

39 a) The di-furyl-di-keto-pyrrolo-pyrrole [88949-34-2] is alkylated in analogy to Example 1a) with 2-butyl-octyl-iodide[1256345-37-5] to give a compound of formula 39. ¹H-NMR data (ppm, CDCl₃): 8.33 2H d×d, 7.60 2H d, 6.69 2H d×d, 4.03 4H d, 1.80 2H m, 1.45-1.20 32H m, 0.86 6H t, 0.84 6H t.

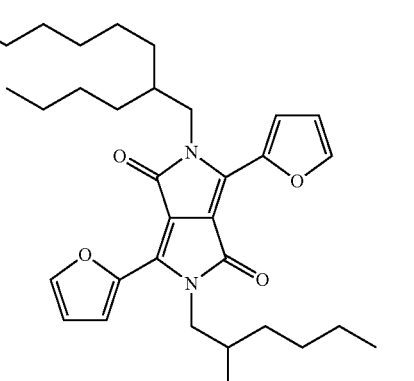

39

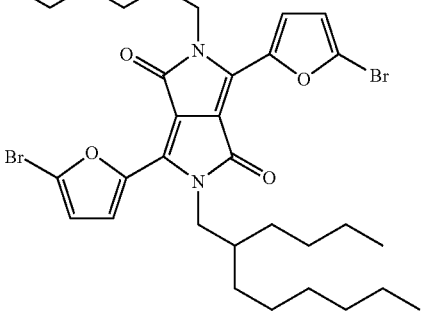

40 b) The compound of formula 39 is brominated in analogy to Example 1b) with N-bromosuccinimide (NBS) to give a compound of formula 40. ¹H-NMR data (ppm, CDCl₃): 8.29 2H d, 6.62 2H d, 3.98 4H d, 1.78 2H m, 1.45-1.20 32H m, 0.87 6H t, 0.84 6H t.

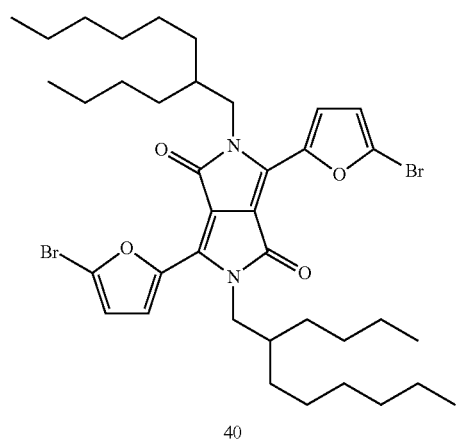

40

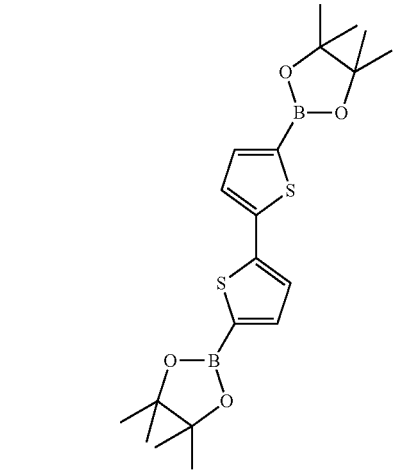

[239075-02-6]

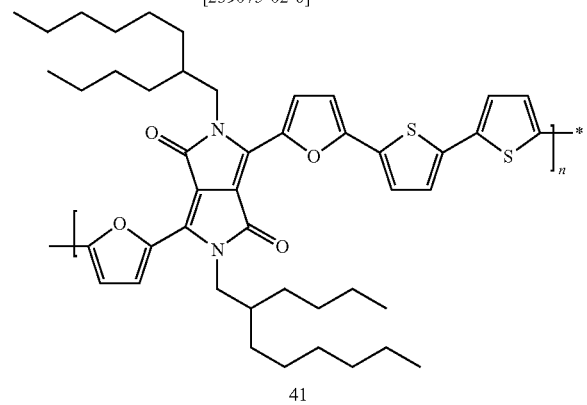

41 c) The dibromide of formula 40 and the bi-thiophene-di-boronic-acid-pinacol-ester [239075-02-6] are reacted in a Suzuki-coupling reaction in analogy to Example 1c) to give a compound of formula 41. The chloroform fraction contains a polymer with a Mw of 18,200 and a polydispersity of 1.61 (measured by high temperature GPC).

The invention claimed is:

1. A polymer comprising repeating units of formula (I) shown below:

*─[─A-D─]─*  (I), wherein
A is a group of formula IVa, IVc, IVe, IVg, IVh, IVi, IVj, or IVk shown below

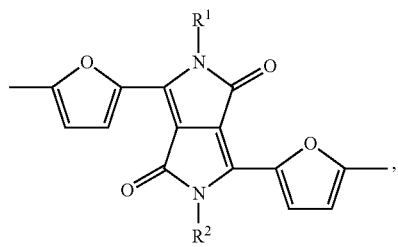
(IVa)

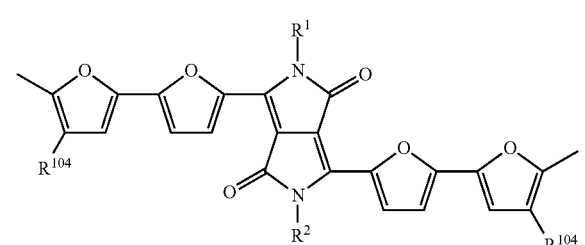
(IVc)

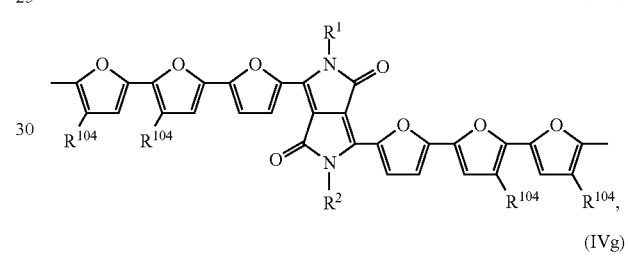
(IVe)

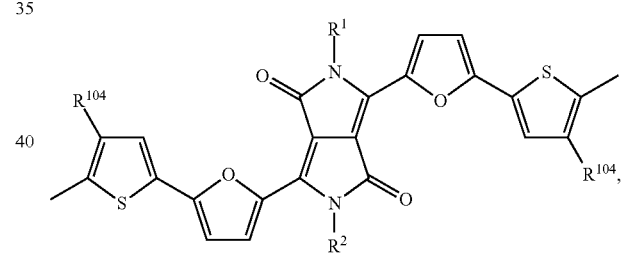
(IVg)

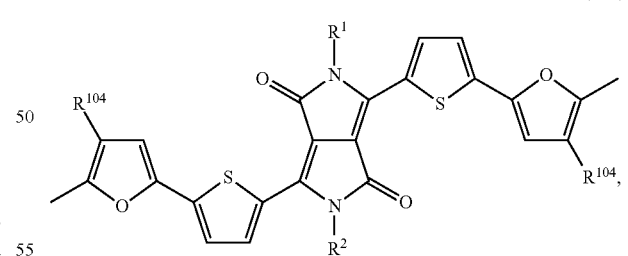
(IVh)

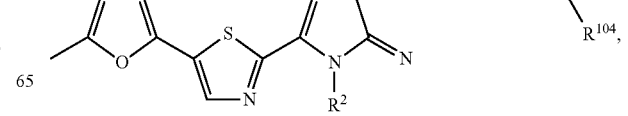
(IVi)

-continued (IVj)

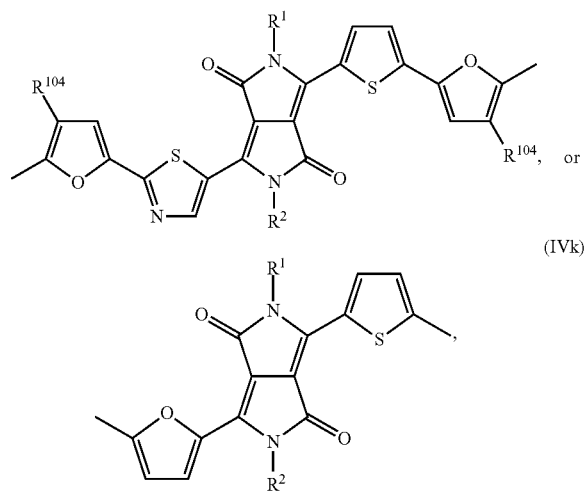

(IVk)

wherein $R^1$ and $R^2$ are independently of each other a $C_1$-$C_{36}$alkyl group, $R^{104}$ is a $C_1$-$C_{25}$alkyl group, which is optionally interrupted by one or more oxygen or sulphur atoms; and D is

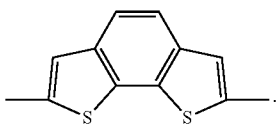.

2. A polymer comprising repeating units of formula (II) shown below:

*$\mathrm{\{A\text{-}D\}}_x\mathrm{\{B\text{-}D\}}_y$* (II), wherein x=0.995 to 0.005, y=0.005 to 0.995, and wherein x+y=1; A is a group of formula IVa, IVc, IVe, IVg, IVh, IVi, IVj, or IVk shown below (IVa)

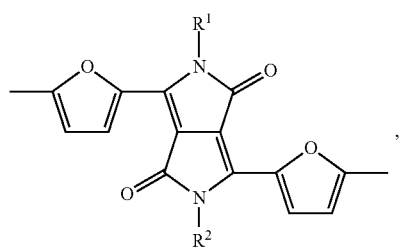

(IVc)

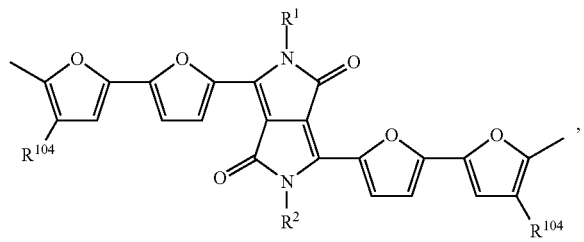

(IVe)

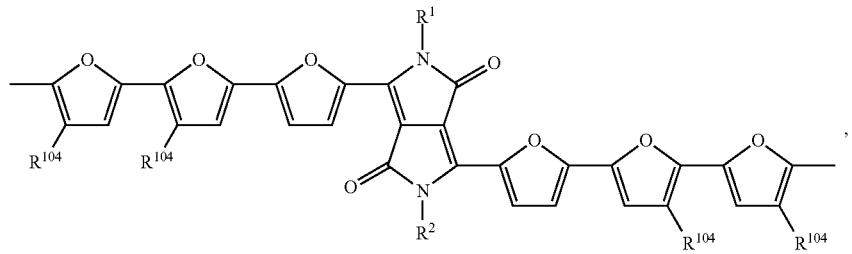

(IVg)

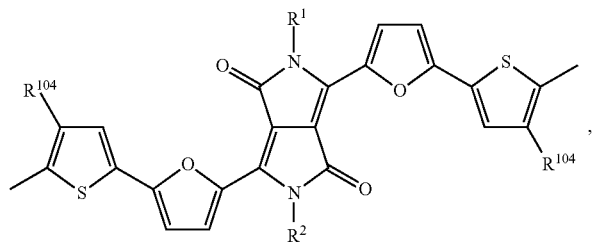

-continued (IVh)
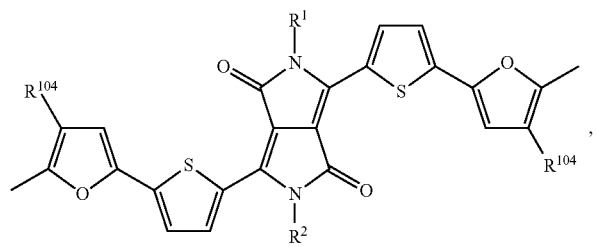

(IVi)
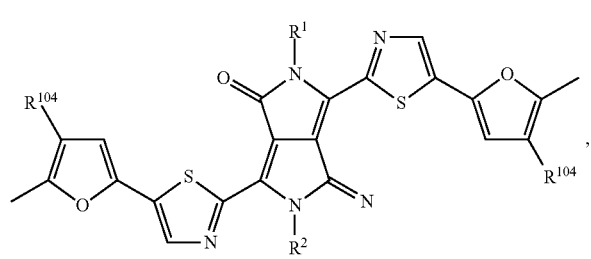

(IVj)
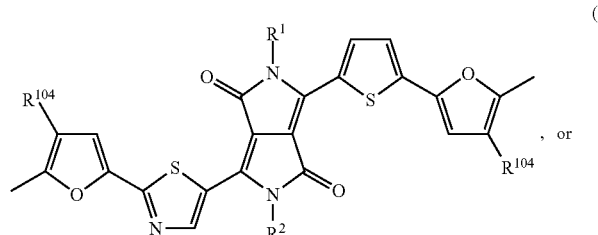

(IVk)
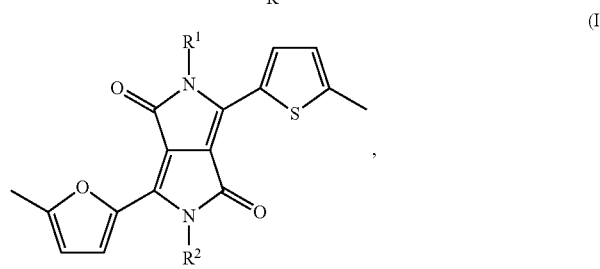

$R^1$ and $R^2$ are a $C_1$-$C_{35}$alkyl group, $R^{104}$ is a $C_1$-$C_{25}$alkyl group, which is optionally interrupted by one or more oxygen or sulphur atoms, B and D are independently of each other a group of formula Va, Vb, Vc, Ve, Vf, Vh, Vi, Vj, Vk, Vl, Vm, Vn, Vo, Vp, Vq, Vr, Vs, Vu, Vv, Vw, Vx, Vy, Vz, or Va' shown below, with the proviso that at least one of (i) D in [A-D], (ii) D in [B-D], and (iii) B in [B-D] has the structure

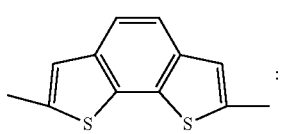

(Va)
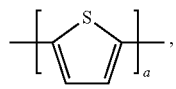

-continued (Vb)
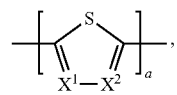

(Vc)
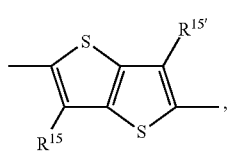

(Ve)
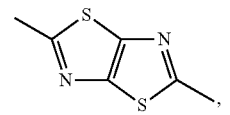

(Vf)
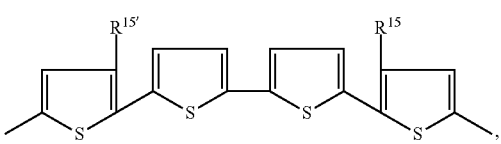

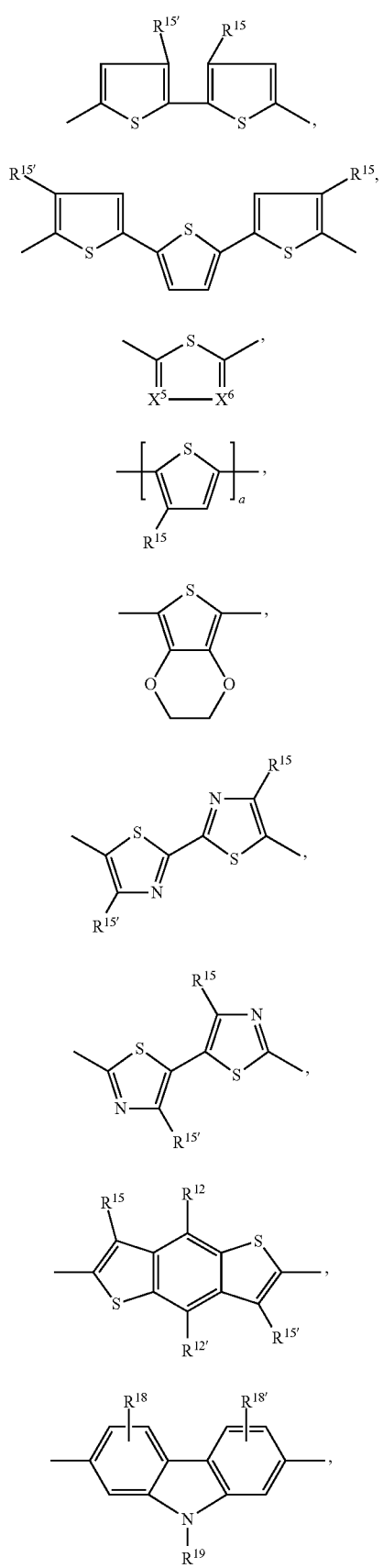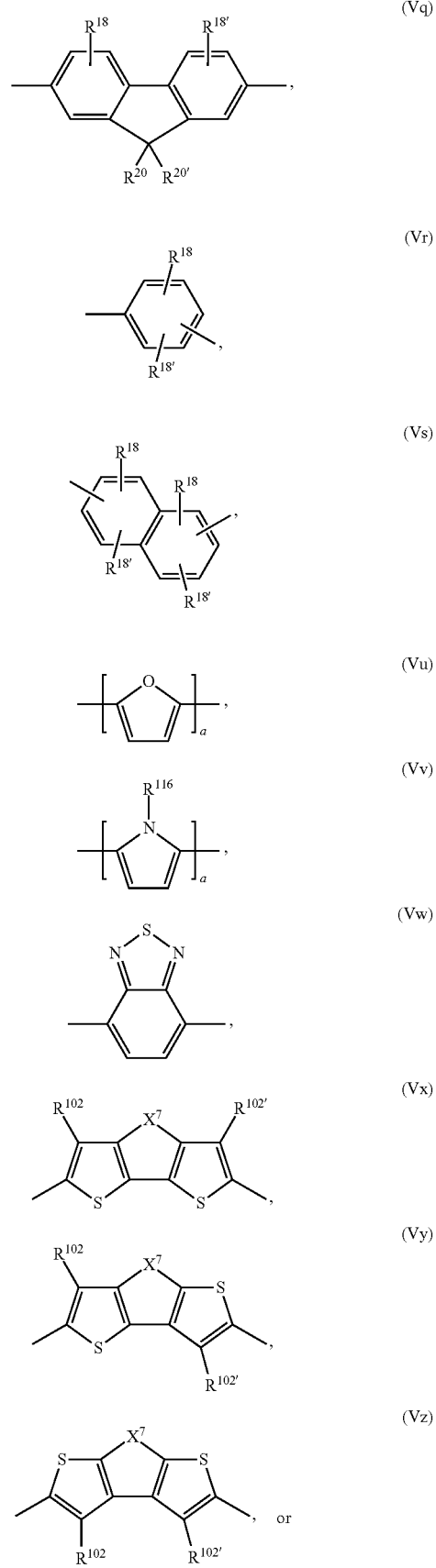

-continued

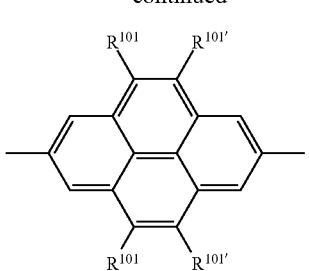

(Va')

wherein
a is an integer of 1 to 5,
one of $X^1$ and $X^2$ is N and the other is CH,
one of $X^5$ and $X^6$ is N and the other is $CR^{14}$,
$R^{12}$ and $R^{12'}$ are independently of each other hydrogen, halogen, $C_1$-$C_{25}$alkyl, which is optionally interrupted by one, or more oxygen, or sulphur atoms, $C_1$-$C_{25}$alkoxy, $C_7$-$C_{25}$arylalkyl, or

$R^{13}$ is a $C_1$-$C_{10}$alkyl group, or a tri($C_1$-$C_8$alkyl)silyl group,
$R^{14}$ is a $C_1$-$C_{25}$alkyl group, which is optionally interrupted by one or more oxygen atoms,
$R^{15}$ and $R^{15'}$ are independently of each other H, or a $C_1$-$C_{25}$alkyl group, which is optionally interrupted by one or more oxygen atoms,
$R^{18}$ and $R^{18'}$ independently of each other hydrogen, halogen, $C_1$-$C_{25}$alkyl, which is optionally interrupted by one or more oxygen or sulphur atoms, $C_7$-$C_{25}$aralkyl, or $C_1$-$C_{25}$alkoxy,
$R^{19}$ is hydrogen, $C_7$-$C_{25}$aralkyl, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which is optionally interrupted by one or more oxygen or sulphur atoms; and
$R^{20}$ and $R^{20'}$ are independently of each other hydrogen, $C_7$-$C_{25}$aralkyl, $C_1$-$C_{25}$alkyl, which is optionally interrupted by one, or more, oxygen, or sulphur atoms,
$R^{116}$ is hydrogen, $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl which is interrupted by —O—, or —S—; or —$COOR^{119}$,
$R^{101}$ and $R^{101'}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by O, $C_1$-$C_{18}$perfluoroalkyl, $C_6$-$C_{24}$aryl, which is optionally substituted one to three times with $C_1$-$C_8$alkyl and/or $C_1$-$C_8$alkoxy45, $C_2$-$C_{20}$heteroaryl, which is optionally substituted one to three times with $C_1$-$C_8$alkyl and/or $C_1$-$C_8$alkoxy,
$R^{102}$ and $R^{102'}$ are independently of each other H, halogen, $C_1$-$C_{25}$alkyl, which is optionally interrupted by one or more oxygen or sulphur atoms; $C_7$-$C_{25}$arylalkyl, or $C_1$-$C_{25}$alkoxy,
$R^{119}$ is $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, or $C_7$-$C_{25}$aralkyl,
D' is —CO—, —COO—, —S—, —O—, or —$NR^{112}$—, E' is $C_1$-$C_8$thioalkoxy, $C_1$-$C_8$alkoxy, CN, —$NR^{112}R^{113}$, —$CONR^{112}R^{113}$, or halogen,
$R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—,
$X^7$ is —$C(R^{120})(R^{120'})$—,

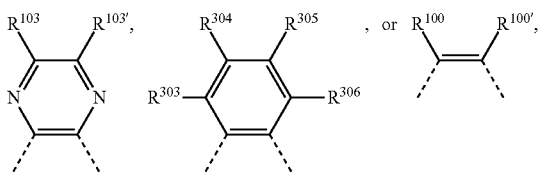

$R^{120}$ and $R^{120'}$ are independently of each other hydrogen, $C_1$-$C_{35}$alkyl, which is optionally interrupted by one, or more oxygen, or sulphur atoms; or $C_7$-$C_{25}$arylalkyl,
$R^{103}$ and $R^{103'}$ are independently of each other hydrogen, halogen, $C_1$-$C_{25}$alkyl, which is optionally interrupted by one or more oxygen or sulphur atoms; $C_6$-$C_{24}$aryl, which is optionally substituted one to three times with $C_1$-$C_8$alkyl and/or $C_1$-$C_8$alkoxy; $C_7$-$C_{25}$arylalkyl, CN, or $C_1$-$C_{25}$alkoxy, or
$R^{103}$ and $R^{103'}$ together form a ring,
$R^{303}$, $R^{304}$, $R^{305}$ and $R^{306}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by 0, $C_1$-$C_{18}$perfluoroalkyl, $C_6$-$C_{24}$aryl, which is optionally substituted one to three times with $C_1$-$C_8$alkyl and/or $C_1$-$C_8$alkoxy, $C_2$-$C_{20}$heteroaryl, which is optionally substituted one to three times with $C_1$-$C_8$alkyl and/or $C_1$-$C_8$alkoxy, and
$R^{100}$ and $R^{100'}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy which is interrupted by O, $C_1$-$C_{18}$perfluoroalkyl, $C_6$-$C_{24}$aryl, which is optionally substituted one to three times with $C_1$-$C_8$alkyl and/or $C_1$-$C_8$alkoxy, $C_2$-$C_{20}$heteroaryl, which is optionally substituted one to three times with $C_1$-$C_8$alkyl and/or $C_1$-$C_8$alkoxy; or
a polymer comprising repeating units of formula (II) shown below:

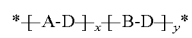 (II), wherein x=0.995 to 0.005, y=0.005 to 0.995, and wherein x+y=1;
A is a group of formula IVa, IVc, IVe, IVg, IVh, IVi, IVj, or IVk as defined hereinabove,
B is a group of formula

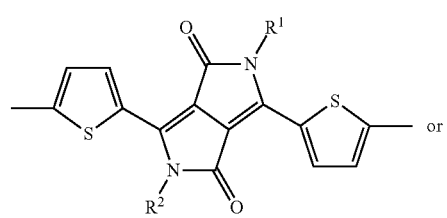

-continued

[structure: bis-thiazole substituted diketopyrrolopyrrole with N-R¹, N-R²]

R¹ and R² are a $C_1$-$C_{35}$alkyl group, and
D is

[structure: dithienyl fused bicyclic]

3. A process for preparation of an organic semiconductor device, which process comprises:
applying a solution and/or dispersion of a polymer in an organic solvent to a suitable substrate and removing the solvent,
wherein the polymer comprises one or more (repeating) unit(s) of the formula *─[A-D]─* (I), or a polymer of formula *─[A-D]$_x$─[B-D]$_y$─* (II), or *─[A-D]$_r$─[B-D]$_s$─[A-E]$_t$─[B-E]$_u$─ (III), wherein
x=0.995 to 0.005, y=0.005 to 0.995, and
wherein x+y=1.
r=0.985 to 0.005, s=0.005 to 0.985, t=0.985 to 0.005, u=0.005 to 0.985, and
wherein r+s+t+u=1.
A is a group of formula (IV)

*─[Ar³]$_e$─[Ar²]$_c$─[Ar¹]$_{a'}$─[DPP core with N-R¹, N-R²]─[Ar¹']$_b$─[Ar²']$_d$─[Ar³']$_f$─*, wherein
a' is an integer of 1, or 2,
b is an integer of 1, or 2,
c is 0, or an integer of 1, or 2,
d is 0, or an integer of 1, or 2,
e is 0, or an integer of 1, or 2,
f is 0, or an integer of 1, or 2,
R¹ and R² are the same or different and are selected from hydrogen, a $C_1$-$C_{100}$alkyl group, —COOR²⁰³, a $C_1$-$C_{100}$alkyl group which is substituted by one or more halogen atoms, hydroxyl groups, nitro groups, —CN, or $C_6$-$C_{18}$aryl groups and/or interrupted by —O—, —COO—, —OCO—, or —S—; a $C_7$-$C_{100}$arylalkyl group, a carbamoyl group, a $C_5$-$C_{12}$cycloalkyl group, which is substituted one to three times with $C_1$-$C_8$alkyl and/or $C_1$-$C_8$alkoxy, a $C_6$-$C_{24}$aryl group, which is substituted one to three times with $C_1$-$C_8$alkyl, $C_1$-$C_8$thioalkoxy, and/or $C_1$-$C_8$alkoxy, or pentafluorophenyl, R²⁰³ is $C_1$-$C_{50}$alkyl;
Ar¹ and Ar¹' are independently of each other

[structures: substituted thiophene with $R^{104}$, $R^{104'}$; furan with $R^{104}$, $R^{104'}$; pyrrole with $R^{104}$, $R^{104'}$ and N-$R^{116}$; or thiazole-type with $X^3$—$X^4$]

Ar², Ar²', Ar³ are independently of each other

[structures: substituted phenylene with $R^{105}$, $R^{105'}$; naphthalene with $R^{105}$, $R^{105'}$; another naphthalene with $R^{105}$, $R^{105'}$; carbazole with $R^{106}$, $R^{106'}$ and N-$R^{107}$; fluorene with $R^{106}$, $R^{106'}$ and $R^{108}$, $R^{109}$; benzothiadiazole; or EDOT-type]

or have the meaning of Ar¹, wherein one of $X^3$ and $X^4$ is N and the other $CR^{99}$,
$R^{99}$, $R^{104}$ and $R^{104'}$ are independently of each other hydrogen, halogen, or a $C_1$-$C_{25}$alkyl group, which is optionally interrupted by one or more oxygen or sulphur atoms, $C_7$-$C_{25}$arylalkyl, or a $C_1$-$C_{25}$alkoxy group,
$R^{105}$, $R^{105'}$, $R^{106}$ and $R^{106'}$ are independently of each other hydrogen, halogen, $C_1$-$C_{25}$alkyl, which is optionally interrupted by one or more oxygen or sulphur atoms; $C_7$-$C_{25}$arylalkyl, or $C_1$-$C_{18}$alkoxy,
$R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl which is interrupted by —O—, or —S—; or —COOR¹¹⁹;
$R^{116}$ is hydrogen, $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{25}$alkyl; $C_1$-$C_{25}$alkyl which is interrupted by —O—, or —S—; or —COOR¹¹⁹;

$R^{119}$ is $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, or $C_7$-$C_{25}$aralkyl, $R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, or $R^{108}$ and $R^{109}$ together form a group of formula $=CR^{110}R^{111}$, wherein $R^{110}$ and $R^{111}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G, or $R^{108}$ and $R^{109}$ together form a five or six membered ring, which optionally is substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, D' is —CO—, —COO—, —S—, —O—, or —$NR^{112}$—, E' is $C_1$-$C_8$thioalkoxy, $C_1$-$C_8$alkoxy, CN, —$NR^{112}R^{113}$, —$CONR^{112}R^{113}$, or halogen, G is E', or $C_1$-$C_{18}$alkyl, and $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O—, B, D and E are independently of each other a group of the formulas shown below, with the proviso that at least one of (i) D in [A-D], (ii) D in [B-D], (iii) B in [B-D], (iv) E in [A-E], (v) B in [B-E], and (vi) E in [B-E] has the structure

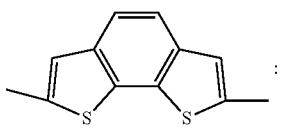

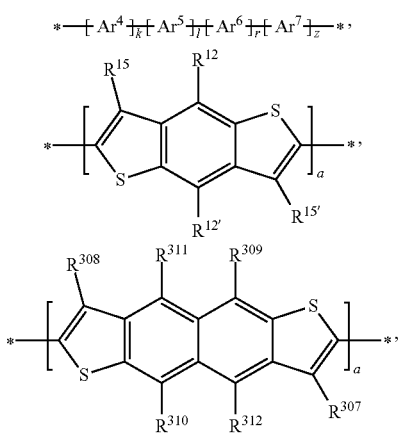

-continued

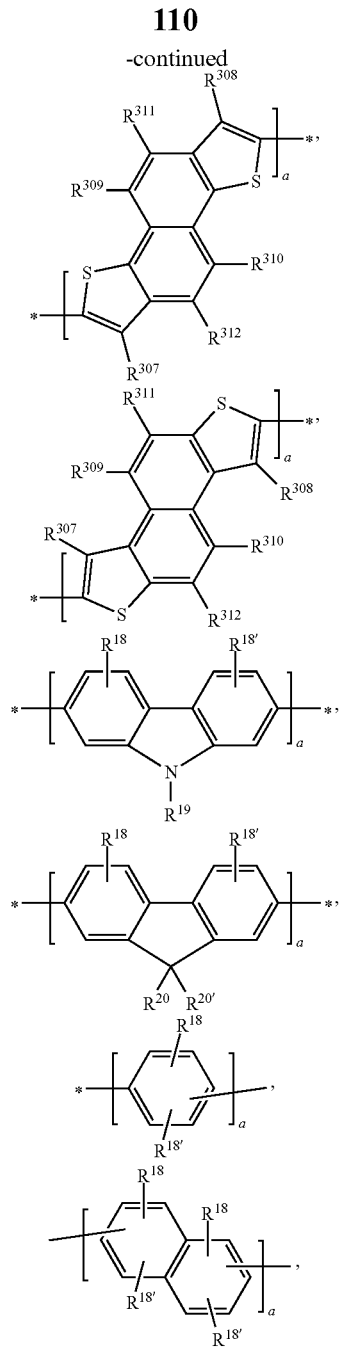

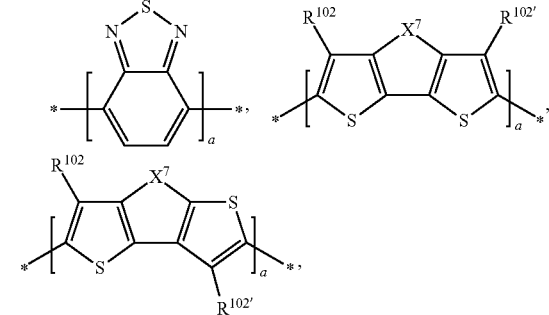

-continued

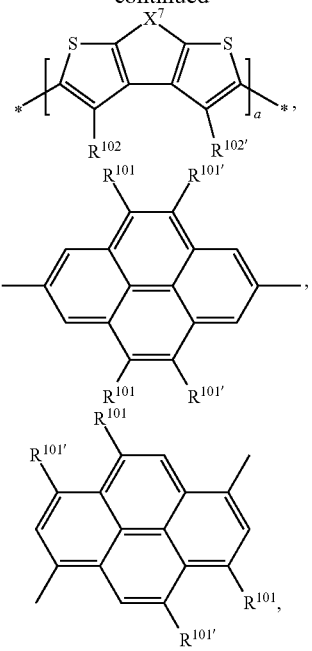

(VI)

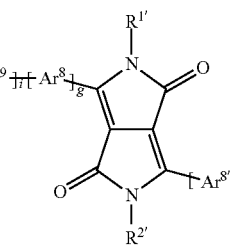

or formula IV, with the proviso that in case B, D and E are a group of formula IV, they are different from A, wherein
k is 1,
l is 0, or 1,
r is 0, or 1,
z is 0, or 1,
a is an integer of 1, or 5,
g is an integer of 1, or 2,
h is an integer of 1, or 2,
i is 0, or an integer of 1, or 2,
j is 0, or an integer of 1, or 2,
k is 0, or an integer of 1, or 2,
l is 0, or an integer of 1, or 2,
$R^{1'}$ and $R^{2'}$ have independently of each other the meaning of $R^1$,
$Ar^8$, $Ar^{8'}$, $Ar^9$, $Ar^{9'}$, $Ar^{10}$ and $Ar^{10'}$ have independently of each other the meaning of $Ar^2$,
$Ar^4$, $Ar^5$, $Ar^6$ and $Ar^7$ are independently of each other a group of formula

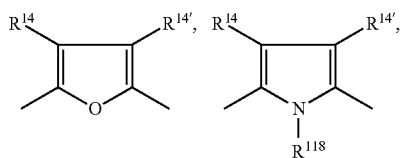

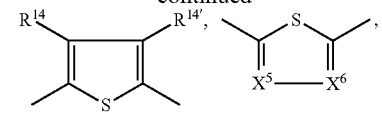

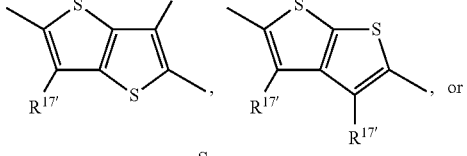

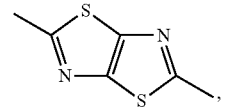

wherein one of $X^5$ and $X^6$ is N and the other is $CR^{14}$,
$Ar^{20}$ is an arylene group, or a heteroarylene group, each of which is optionally substituted,
$R^{118}$ has the meaning of $R^{116}$,
$R^{12}$ and $R^{12'}$ are independently of each other hydrogen, halogen, $C_1$-$C_{25}$alkyl, which is optionally interrupted by one, or more oxygen, or sulphur atoms, $C_1$-$C_{25}$alkoxy, $C_7$-$C_{25}$arylalkyl,
or

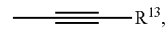

$R^{13}$ is a $C_1$-$C_{10}$alkyl group, or a tri($C_1$-$C_8$alkyl)silyl group,
$R^{14}$, $R^{14'}$, $R^{15}$, $R^{15'}$, $R^{17}$ and $R^{17'}$ are independently of each other H, or a $C_1$-$C_{25}$alkyl group, which is optionally interrupted by one or more oxygen atoms;
$R^{18}$ and $R^{18'}$ independently of each other hydrogen, halogen, $C_1$-$C_{25}$alkyl, which is optionally interrupted by one or more oxygen or sulphur atoms, $C_7$-$C_{25}$aralkyl, or $C_1$-$C_{25}$alkoxy,
$R^{19}$ is hydrogen, $C_7$-$C_{25}$aralkyl, $C_6$-$C_{18}$aryl; $C_6$-$C_{18}$aryl which is substituted by $C_1$-$C_{18}$alkyl, or $C_1$-$C_{18}$alkoxy; or $C_1$-$C_{25}$alkyl, which is optionally interrupted by one or more oxygen or sulphur atoms; and
$R^{20}$ and $R^{20'}$ are independently of each other hydrogen, $C_7$-$C_{25}$aralkyl, $C_1$-$C_{25}$alkyl, which is optionally interrupted by one, or more oxygen, or sulphur atoms,
$X^7$ is —O—, —S—, —$NR^{115}$—, —Si($R^{117}$)($R^{117'}$)—, —C($R^{120}$)($R^{120'}$)—, —C(=O)—,

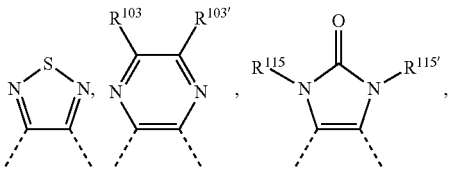

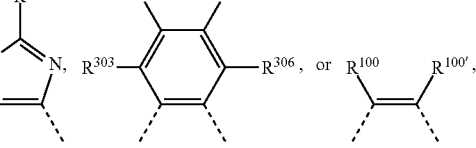

$X^8$ is —O—, or —NR$^{115}$—;

$R^{100}$ and $R^{100'}$ are independently of each other H, F, $C_1$-$C_{18}$alkyl, $C_1$-$C_{18}$alkyl which is interrupted by O, $C_1$-$C_{18}$alkoxy, C1-C18alkoxy which is interrupted by O, $C_1$-$C_{18}$perfluoroalkyl, $C_6$-$C_{24}$aryl, which is optionally substituted one to three times with $C_1$-$C_8$alkyl and/or $C_1$-$C_8$alkoxy, $C_2$-$C_{20}$heteroaryl, which is optionally substituted one to three times with $C_1$-$C_8$alkyl and/or $C_1$-$C_8$alkoxy;

$R^{303}$ and $R^{304}$, $R^{305}$, and $R^{306}$ are independently of each other H, F, $C_1$-$C_{18}$alkyl, $C_1$-$C_{18}$alkyl which is interrupted by O, $C_1$-$C_{18}$alkoxy, $C_1$-$C_{18}$alkoxy, which is interrupted by O, $C_1$-$C_{18}$perfluoroalkyl, $C_6$-$C_{24}$aryl, which is optionally substituted one to three times with $C_1$-$C_8$alkyl and/or $C_1$-$C_8$alkoxy, $C_2$-$C_{20}$heteroaryl, which is optionally substituted one to three times with $C_1$-$C_8$alkyl and/or $C_1$-$C_8$alkoxy;

$R^{307}$, $R^{308}$ are independently of each other H, or a $C_1$-$C_{25}$alkyl, which is optionally interrupted by one or more oxygen or sulphur atoms;

$R^{309}$, $R^{310}$, $R^{311}$, $R^{312}$ are independently of each other H, or a $C_1$-$C_{25}$alkoxy, or $C_1$-$C_{25}$alkyl, which is optionally interrupted by one or more oxygen or sulphur atoms;

$R^{101}$ and $R^{101'}$ are independently of each other H, F, $C_1$-$C_{18}$alkyl which is interrupted by O, $C_1$-$C_{18}$alkoxy, $C_1$-$C_{18}$alkoxy, which is interrupted by O, $C_1$-$C_{18}$perfluoroalkyl, $C_6$-$C_{24}$aryl, which is optionally substituted one to three times with $C_1$-$C_8$alkyl and/or $C_1$-$C_8$alkoxy, $C_2$-$C_{20}$heteroaryl, which is optionally substituted one to three times with $C_1$-$C_8$alkyl and/or $C_1$-$C_8$alkoxy;

$R^{102}$ and $R^{102'}$ are independently of each other H, halogen, $C_1$-$C_{25}$alkyl, which is optionally interrupted by one or more oxygen or sulphur atoms; $C_7$-$C_{25}$arylalkyl, or $C_1$-$C_{25}$alkoxy;

$R^{103}$ and $R^{103'}$ are independently of each other hydrogen, halogen, $C_1$-$C_{25}$alkyl, which is optionally interrupted by one or more oxygen or sulphur atoms; $C_6$-$C_{24}$aryl, which is optionally substituted one to three times with $C_1$-$C_8$alkyl and/or $C_1$-$C_8$alkoxy; $C_7$-$C_{25}$arylalkyl, CN, or $C_1$-$C_{25}$alkoxy; or $R^{103}$, $R^{103'}$ together form a ring, $R^{115}$ and $R^{115'}$ are independently of each other hydrogen, $C_6$-$C_{18}$aryl; $C_6$-$C_{18}$aryl which is substituted by $C_1$-$C_{18}$alkyl, or $C_1$-$C_{18}$alkoxy; $C_1$-$C_{25}$alkyl; which is optionally interrupted by one or more oxygen or sulphur atoms; or $C_{-7}$-$C_{25}$arylalky, $R^{117}$ and $R^{117'}$ are independently of each other $C_1$-$C_{35}$alkyl group, $C_7$-$C_{25}$arylalkyl, or phenyl group, which optionally is substituted one to three times with $C_1$-$C_8$alkyl and/or $C_1$-$C_8$alkoxy, $R^{121}$ and $R^{120'}$ are independently of each other hydrogen, $C_1$-$C_{35}$alkyl, which is optionally interrupted by one, or more oxygen, or sulphur atoms; or $C_7$-$C_{25}$arylalkyl, $R^{121}$ is H, $C_1$-$C_{18}$alkyl, which is optionally interrupted by one or more oxygen or sulphur atoms, $C_1$-$C_{18}$perfluoroalkyl, $C_6$-$C_{24}$aryl, which is optionally substituted one to three times with $C_1$-$C_8$alkyl and/or $C_1$-$C_8$alkoxy; $C_2$-$C_{20}$heteroaryl, which is optionally substituted one to three times with $C_1$-$C_8$alkyl and/or $C_1$-$C_8$alkoxy; or CN, with the proviso that at least one of the groups $Ar^1$, $Ar^{1'}$, $Ar^2$, $Ar^{2'}$, $Ar^3$ and $Ar^{3'}$ is a group

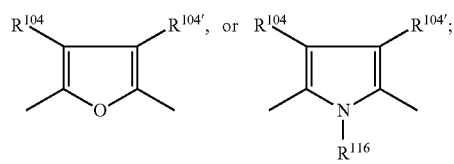

and/or at least one of the groups B, D and E contain a group

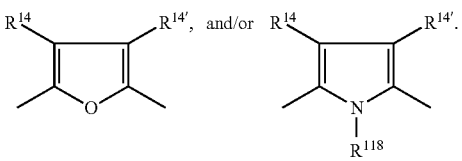

4. The polymer according to claim 2, wherein B and D are independently of each other

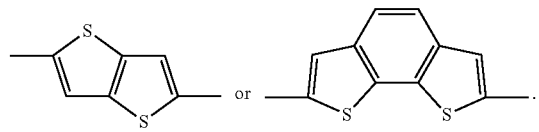

5. The polymer according to claim 1, comprising repeating units of formula (Ia) shown below:

$$*\!-\!\!\left[\!-\!A\!-\!D\!-\!\right]_n\!\!-\!* \qquad (Ia)$$

wherein A and D are as defined in claim 1, and n is 4 to 1000.

6. The polymer according to claim 5, which is a polymer of the formula

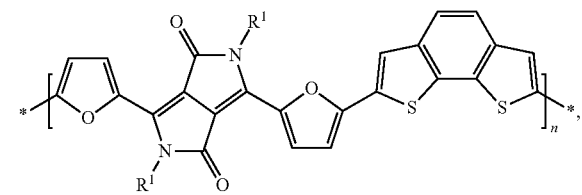

wherein n is 10 to 1000 and
$R^1$ is a $C_1$-$C_{35}$alkyl group.

7. A polymer comprising repeating units of formula (I) shown below:
wherein
A is a group of formula IVc, IVe, IVg, IVh, IVi, IVj, or IVk shown below

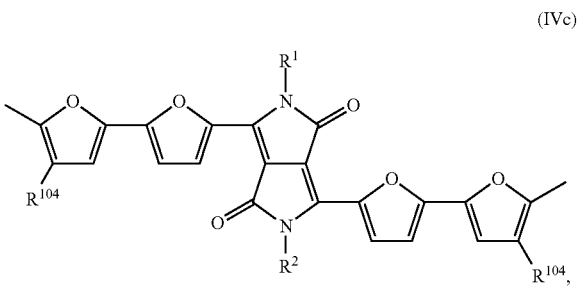

(IVc)

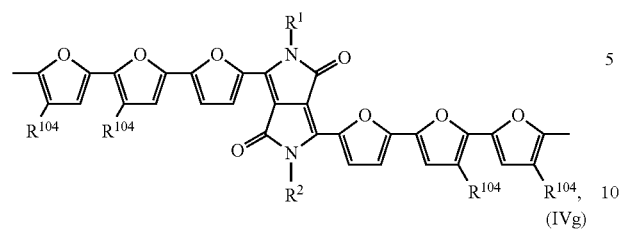
(IVe)
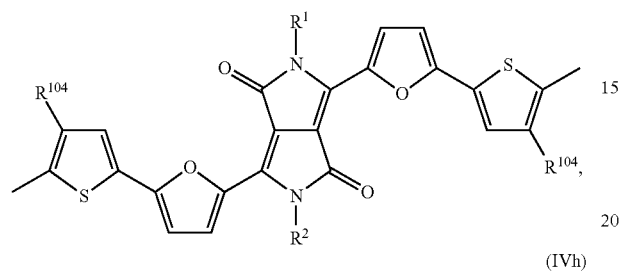
(IVg)
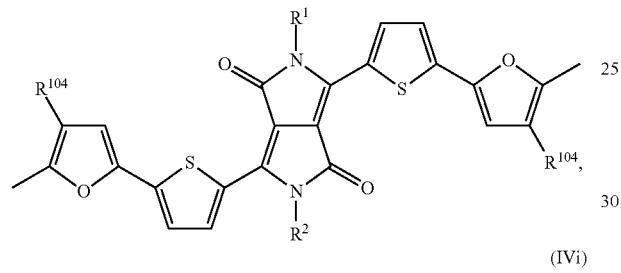
(IVh)
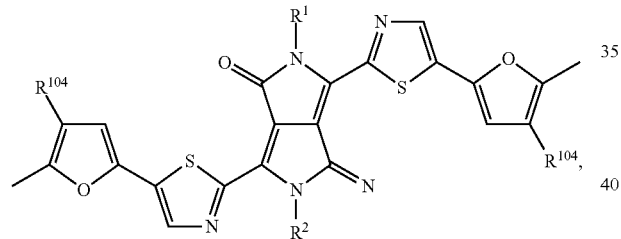
(IVi)
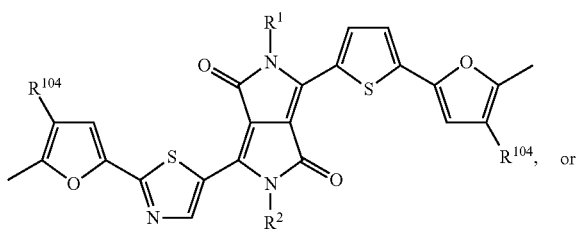
(IVj), or
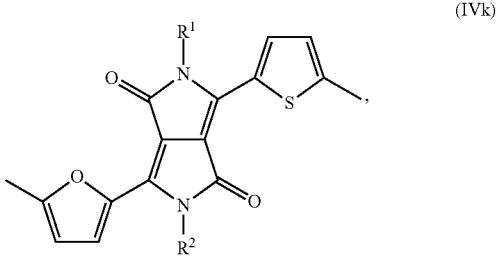
(IVk),
wherein R¹ and R² are independently of each other a C₁-C₃₆alkyl group,
R¹⁰⁴ is a C₁-C₂₅alkyl group, which is optionally interrupted by one or more oxygen or sulphur atoms; and
D is
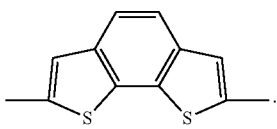
* * * * *